US011895382B2

(12) United States Patent
Park et al.

(10) Patent No.: US 11,895,382 B2
(45) Date of Patent: Feb. 6, 2024

(54) LENS DRIVING DEVICE, AND CAMERA MODULE AND OPTICAL DEVICE INCLUDING SAME

(71) Applicant: LG INNOTEK CO., LTD., Seoul (KR)

(72) Inventors: Sang Ok Park, Seoul (KR); Yong Nam Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 352 days.

(21) Appl. No.: 17/426,628

(22) PCT Filed: Mar. 20, 2020

(86) PCT No.: PCT/KR2020/003839
§ 371 (c)(1),
(2) Date: Jul. 28, 2021

(87) PCT Pub. No.: WO2020/190078
PCT Pub. Date: Sep. 24, 2020

(65) Prior Publication Data
US 2022/0053110 A1  Feb. 17, 2022

(30) Foreign Application Priority Data
Mar. 21, 2019  (KR) .................. 10-2019-0032500
Apr. 10, 2019  (KR) .................. 10-2019-0041819

(51) Int. Cl.
H04N 23/54        (2023.01)
H05K 1/18         (2006.01)
(Continued)

(52) U.S. Cl.
CPC ............ H04N 23/54 (2023.01); H04N 23/57 (2023.01); H04N 23/67 (2023.01);
(Continued)

(58) Field of Classification Search
None
See application file for complete search history.

(56) References Cited

U.S. PATENT DOCUMENTS

2018/0198249 A1  7/2018 Olson et al.
2018/0252893 A1  9/2018 Park et al.
(Continued)

FOREIGN PATENT DOCUMENTS

EP  3 070 514 A1  9/2016
EP  3 663 829 A1  6/2020
(Continued)

OTHER PUBLICATIONS

Office Action dated Apr. 15, 2023 in Chinese Application No. 202080010992.X.
(Continued)

Primary Examiner — Paul M Berardesca
(74) Attorney, Agent, or Firm — Saliwanchik, Lloyd & Eisenschenk

(57) ABSTRACT

An embodiment includes: a base; a circuit board which is disposed on the base and which includes first and second terminals; a housing disposed on the circuit board; a bobbin disposed in the housing; a first coil disposed on the bobbin; a sensing magnet disposed on the bobbin; a magnet disposed in the housing; a first position sensor which is disposed in the housing and which corresponds to the sensing magnet; a second coil disposed between the base and the magnet; and a second position sensor which is disposed on the circuit board and which includes a first sensor and a second sensor, wherein each of the first sensor and the second sensor is a driver integrated circuit including a hall sensor and a driver, a clock signal is provided to the first terminal of the circuit board, a data signal is provided to the second terminal of the circuit board, and the driver of each of the first position sensor, the first sensor, and the second sensor transmits/

(Continued)

receives the clock signal through the first terminal of the circuit board, and transmits/receives the data signal in a time-division manner through the second terminal of the circuit board.

19 Claims, 33 Drawing Sheets

(51) Int. Cl.
*H04N 23/67* (2023.01)
*H04N 23/68* (2023.01)
*H04N 23/57* (2023.01)
*H02K 41/035* (2006.01)
*H04N 23/55* (2023.01)

(52) U.S. Cl.
CPC .......... *H04N 23/687* (2023.01); *H05K 1/181* (2013.01); *H02K 41/0354* (2013.01); *H04N 23/55* (2023.01); *H05K 2201/10151* (2013.01)

(56) References Cited

U.S. PATENT DOCUMENTS

| | | | |
|---|---|---|---|
| 2018/0309923 A1 | 10/2018 | Kaihatsu et al. | |
| 2019/0020822 A1 | 1/2019 | Sharma et al. | |
| 2020/0177815 A1* | 6/2020 | Kim | H04N 23/6812 |
| 2020/0195849 A1* | 6/2020 | Byun | H04N 23/687 |
| 2021/0231906 A1* | 7/2021 | Saito | H04N 23/54 |
| 2021/0294067 A1* | 9/2021 | Park | G03B 5/00 |
| 2022/0019127 A1* | 1/2022 | Saito | G02B 7/08 |
| 2022/0285064 A1* | 9/2022 | Lee | G03B 5/04 |

FOREIGN PATENT DOCUMENTS

| | | | |
|---|---|---|---|
| JP | 5794020 B2 | | 10/2015 |
| JP | 2016-509684 A | | 3/2016 |
| KR | 10-2017-0051928 A | | 5/2017 |
| KR | 10-2017-0104772 A | | 9/2017 |
| KR | 20180036273 A | * | 4/2018 |
| KR | 20180036274 A | * | 4/2018 |
| KR | 10-2018-0067123 A | | 6/2018 |
| KR | 10-2018-0076165 A | | 7/2018 |
| KR | 10-2018-0082831 A | | 7/2018 |
| KR | 10-2019-0021628 A | | 3/2019 |
| WO | 2019/027199 A1 | | 2/2019 |

OTHER PUBLICATIONS

Supplementary European Search Report dated Jul. 6, 2022 in European Application No. 20773307.2.
Anonymous: "I2C-Bus", Mar. 20, 2019 (Mar. 20, 2019), pp. 1-15, XP055933770, Retrieved from the Internet: URL:https://en.wikipedia.org/w/index.php?title=I2C&oldid=888650297 [retrieved on Jun. 21, 2022] p. 1-p. 3.
International Search Report dated PCT/KR2020/003839 in International Application No. dated Jul. 2, 2020.

* cited by examiner ic # LENS DRIVING DEVICE, AND CAMERA MODULE AND OPTICAL DEVICE INCLUDING SAME

CROSS-REFERENCE TO RELATED APPLICATIONS

This application is the U.S. national stage application of International Patent Application No. PCT/KR2020/003839, filed Mar. 20, 2020, which claims the benefit under 35 U.S.C. § 119 of Korean Application Nos. 10-2019-0032500, filed Mar. 21, 2019; and 10-2019-0041819, filed Apr. 10, 2019, the disclosures of each of which are incorporated herein by reference in their entirety.

TECHNICAL FIELD

Embodiments relate to a lens moving apparatus and a camera module and an optical device each including the same.

BACKGROUND ART

It is difficult to apply technology of a voice coil motor (VCM) used in existing general camera modules to a subminiature, low-power camera module, and therefore research related thereto has been actively conducted.

Demand for and production of electronic products, such as smartphones and mobile phones equipped with cameras have increased. Cameras for mobile phones are trending toward increased resolution and miniaturization. As a result, an actuator has also been miniaturized, increased in diameter, and been made multifunctional. In order to realize a high-resolution camera for mobile phones, improvement in performance of the camera for mobile phones and additional functions thereof, such as autofocusing, handshake correction, and zooming, are required.

DISCLOSURE

Technical Problem

Embodiments provide a lens moving apparatus and a camera module and an optical device each including the same, which are capable of increasing the length of a support member without increasing the height thereof and thus of improving reliability and reducing power consumption.

Furthermore, the embodiments provide a camera device and an optical device, which are capable of blocking light, which is incident through a side surface of a filter, and thus of inhibiting the occurrence of a flaring phenomenon.

Technical Solution

A lens moving apparatus according to an embodiment includes a base, a circuit board, which is disposed on the base and includes first and second terminals, a housing disposed on the circuit board, a bobbin disposed in the housing, a first coil disposed on the bobbin, a sensing magnet disposed on the bobbin, a magnet disposed on the housing, a first position sensor disposed on the housing so as to correspond to the sensing magnet, a second coil disposed between the base and the magnet, and a second position sensor including first and second sensors, which are conductively connected to the circuit board, wherein each of the first and second sensors is a driver IC (Integrated Circuit) including a Hall sensor and a driver, wherein the first terminal of the circuit board is provided with a clock signal and the second terminal of the circuit board is provided with a data signal, wherein the driver of each of the first position sensor, the first sensor and the second sensor transmits and receives the clock signal through the first terminal of the circuit board and transmits and receives the data signal through the second terminal of the circuit board, wherein the data signal includes a first data signal for the first position sensor, a second data signal for the first sensor and a third data signal for the second sensor, and wherein the first data signal, the second data signal and the third data signal are transmitted and received through the second terminal in a time-division manner.

The circuit board may further include third and fourth terminals, and the driver of each of the first position sensor, the first sensor and the second sensor may be provided with a power signal through the third and fourth terminals.

The power signal may include a first voltage, which is supplied to the third terminal, and a second voltage, which is supplied to the fourth terminal and is higher than the first voltage.

The driver of each of the first position sensor, the first sensor and the second sensor may use data communication using a protocol wherein, in the data communication, the drivers of the first position sensor, the first sensor and the second sensor may be identified by different addresses, and the data signal may be transmitted and received to and from one of the first position sensor, the first sensor and the second sensor based on the different addresses.

The magnet may include a first magnet and a second magnet, and the second coil may include a first coil unit corresponding to the first magnet and a second coil unit corresponding to the second magnet.

The driver of the first sensor may provide the first coil unit with a first drive signal, and the driver of the second sensor may provide the second coil unit with a second drive signal.

The driver of the first sensor may provide the first coil unit with the first drive signal through the circuit board, and the driver of the second sensor may provide the second coil unit with the second drive signal through the circuit board.

The driver of the first position sensor may provide the first coil with a drive signal.

The lens moving apparatus may further include first and second elastic members coupled both to the bobbin and to the housing, wherein the first coil may be coupled to the first and second elastic members, and the drive signal may be supplied to the first coil through the first and second elastic members.

A lens moving apparatus according to another embodiment includes a base, a circuit board, which is disposed on the base and includes first and second terminals, a housing disposed on the circuit board, a bobbin disposed in the housing, a first coil disposed on the bobbin, a magnet disposed on the housing, a second coil disposed between the base and the magnet, and first and second sensors conductively connected to the circuit board, wherein each of the first and second sensors is a driver IC (Integrated Circuit) including a Hall sensor and a driver, wherein the first terminal of the circuit board is provided with a clock signal and the second terminal of the circuit board is provided with a data signal, and wherein the driver of each of the first sensor and the second sensor transmits and receives the clock signal through the first terminal of the circuit board and transmits and receives the data signal through the second terminal of the circuit board in a time-division manner.

A camera module according to an embodiment includes the lens moving apparatus and a controller, wherein the controller performs an AF operation of controlling movement of the lens moving apparatus in a direction of an optical axis using the first data signal, and performs an OIS operation of controlling movement of the lens moving apparatus in a direction perpendicular to the optical axis using the second and third data (signals).

Advantageous Effects

Embodiments are able to increase the length of the support member without increasing the height thereof and thus to improve reliability and reduce power consumption.

Furthermore, embodiments are able to reduce a phenomenon in which contaminants outside a filter enters the filter by applying epoxy to the filter and a sensor base. Consequently, it is possible to minimize the incidence of spots on an image, which is caused by entry of the contaminants into the filter.

BEST MODE

Figure 1:
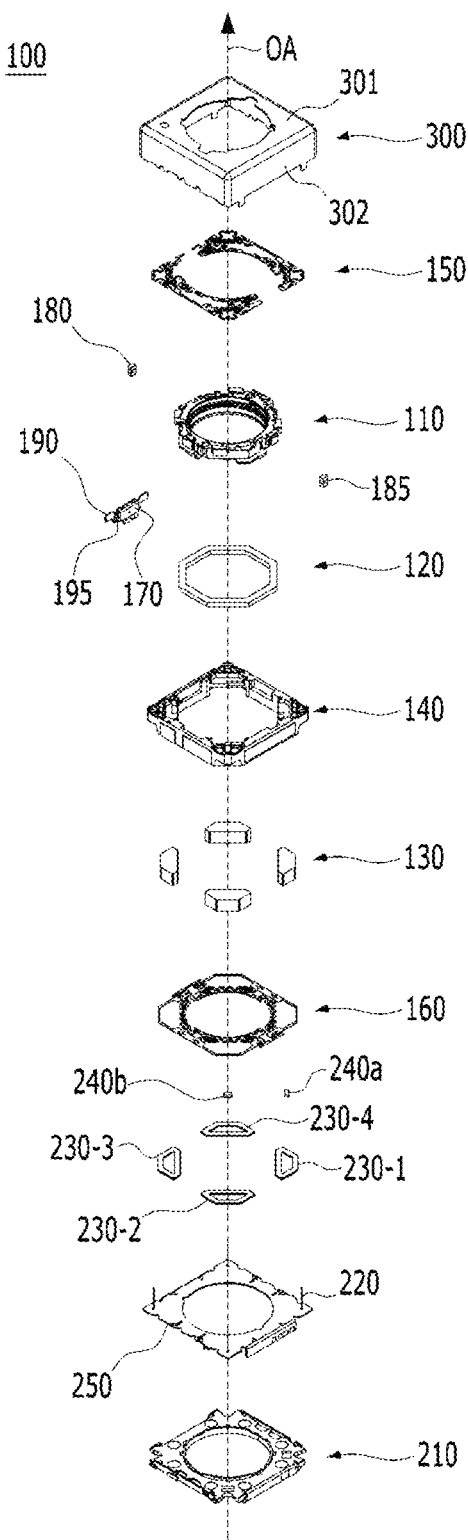
FIG. 1 is an exploded perspective view of a lens moving apparatus according to an embodiment.

Hereinafter, embodiments of the present invention will be described in detail with reference to the accompanying drawings.

The technical idea of the present invention may be embodied in many different forms, and should not be construed as being limited to the following embodiments set forth herein. One or more of components of the embodiments may be selectively combined with each other or replaced without departing from the technical spirit and scope of the present invention.

Unless otherwise particularly defined, terms (including technical and scientific terms) used in the embodiments of the present invention have the same meanings as those commonly understood by one of ordinary skill in the art to which this invention belongs. It will be further understood that commonly used terms, such as those defined in dictionaries, should be interpreted as having meanings consistent with their meanings in the context of the relevant art.

The terminology used in the embodiments of the present invention is for the purpose of describing particular embodiments only, and is not intended to limit the present invention. As used in the disclosure and the appended claims, the singular forms are intended to include the plural forms as well, unless the context clearly indicates otherwise. The phrase "at least one (or one or more) of A, B and C" may be interpreted as including one or more of all combinations of A, B and C.

Furthermore, when describing the components of the present invention, terms such as "first", "second", "A", "B", "(a)" or "(b)" may be used. Since these terms are provided merely for the purpose of distinguishing the components from each other, they do not limit the nature, sequence or order of the components.

It should be understood that, when an element is referred to as being "linked", "coupled" or "connected" to another element, the element may be directly "linked", "coupled" or "connected" to the another element, or may be "linked", "coupled" or "connected" to the another element via a further element interposed therebetween. Furthermore, it will be understood that, when an element is referred to as being formed "on" or "under" another element, it can be directly "on" or "under" the other element, or can be indirectly disposed with regard thereto, with one or more intervening elements therebetween. In addition, it will also be understood that "on" or "under" the element may mean an upward direction or a downward direction based on the element.

Hereinafter, the lens moving apparatus may be alternatively referred to as a "lens moving unit", a "VCM (Voice Coil Motor)", an "actuator" or a "lens moving device". Hereinafter, the term "coil" may be interchangeably used with "coil unit", and the term "elastic member" may be interchangeably used with "elastic unit" or "spring".

In the follow description, the "terminal" may be alternatively referred to as a "pad", "electrode", "conductive layer" or "bonding portion".

For the convenience of description, although the lens moving apparatus according to an embodiment is described using a rectangular coordinate system (x, y, z), the lens moving apparatus may be described using some other coordinate systems, and the embodiments are not limited thereto. In the respective drawings, the X-axis direction and the Y-axis direction mean directions perpendicular to an optical axis, i.e. the Z-axis. The Z-axis direction, which is the direction of the optical axis OA, may be referred to as a "first direction", the X-axis direction may be referred to as a "second direction", and the Y-axis direction may be referred to as a "third direction".

The lens moving apparatus according to an embodiment of the present invention is capable of performing an "auto-focusing function". Here, the "auto-focusing function" serves to automatically focus an image of a subject on an image sensor surface.

In addition, the lens moving apparatus according to the embodiment may perform a function of "handshake correction". Here, the function of "handshake correction" may serve to inhibit the contour line of a captured image from being blurred due to vibration caused by shaking of the user's hand when capturing a still image.

Figure 2:
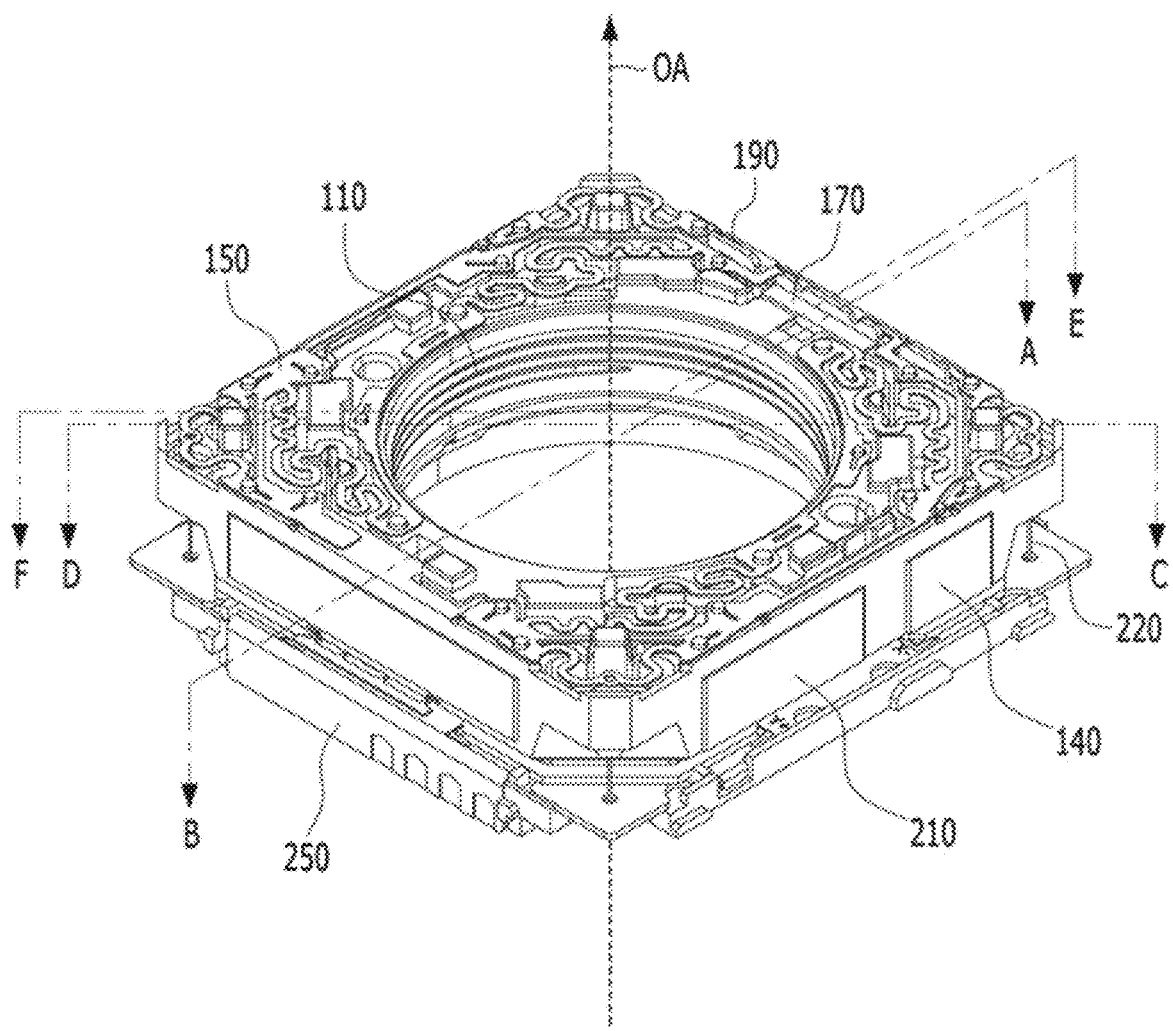
FIG. 2 is an assembled perspective view of the lens moving apparatus shown in FIG. 1, from which a cover member is removed.

FIG. 1 is an exploded perspective of the lens moving apparatus 100 according to an embodiment of the present invention. FIG. 2 is an assembled perspective view of the lens moving apparatus 100, from which a cover member 300 in FIG. 1 is removed.

Referring to FIGS. 1 and 2, the lens moving apparatus 100 includes a bobbin 110, a first coil 120, a first magnet 130, a housing 140, an upper elastic member 150, a lower elastic member 160, a first position sensor 170, an circuit board 190 and a second magnet 180.

In order to perform handshake correction, the lens moving apparatus 100 may include a support member 220, a second coil 230 and a second position sensor 240.

The lens moving apparatus 100 may further include a third magnet 185, a base 210, a circuit board 250 and a cover member 300.

The lens moving apparatus 100 may further include a capacitor 195 mounted on the circuit board 190.

First, the bobbin 110 will be described.

The bobbin 110 may be disposed in the housing 140 so as to be movable in the optical-axis direction OA or the first direction (for example, the Z-axis direction) by the electromagnetic interaction between the first coil 120 and the magnet 130.

Figure 3A:
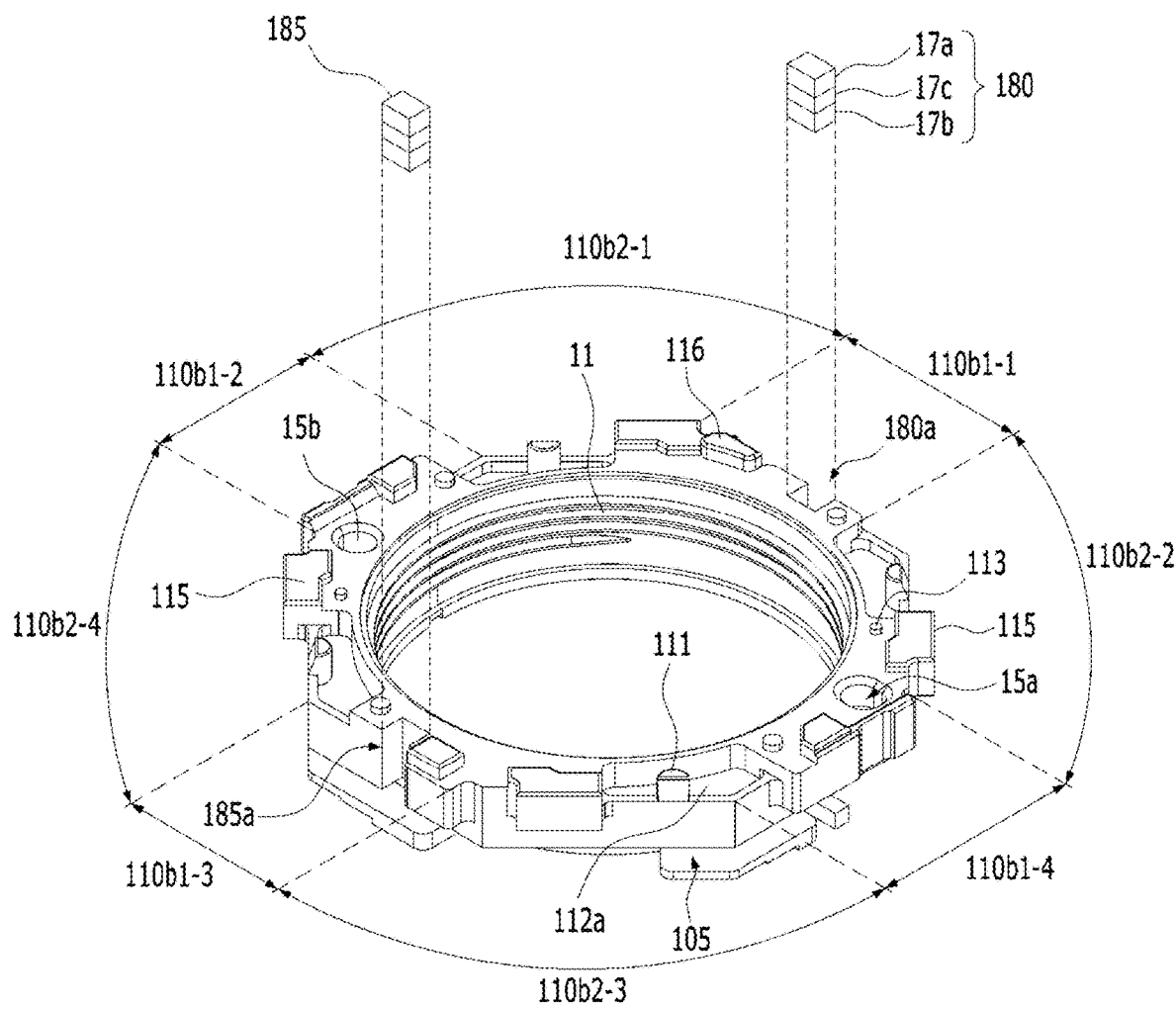
FIG. 3A is a perspective view of the bobbin, the second magnet and the third magnet shown in FIG. 1.
Figure 3B:
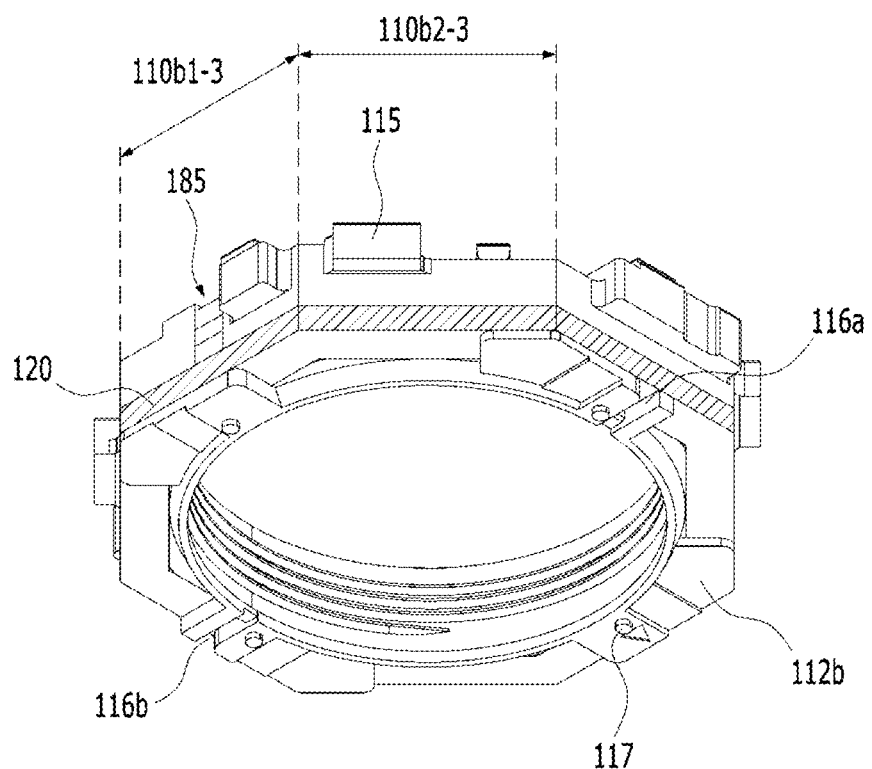
FIG. 3B is a view illustrating the first coil coupled to the bobbin.

FIG. 3A is a perspective view of the bobbin 110, the second magnet 180 and the third magnet 185, which are shown in FIG. 1. FIG. 3B illustrates the first coil coupled to the bobbin 110.

Referring to FIGS. 3A and 3B, the bobbin 110 may have a bore in which a lens or a lens barrel is mounted. For example, the bore in the bobbin 110 may be a through hole formed through the bobbin 110 in the optical-axis direction, and may have a circular shape, an elliptical shape or a polygonal shape, without being limited thereto.

Although the bore in the bobbin 110 may be directly provided therein with a lens, the disclosure is not limited thereto. In another embodiment, a lens barrel, to which at least one lens is mounted or coupled, may be coupled or mounted in the bore in the bobbin 110. The lens or the lens barrel may be coupled to the inner circumferential surface 110a of the bobbin 110 in any of various ways.

The bobbin 110 may include first side portions 110b-1, which are spaced apart from each other, and second side portions 110b-2. Each of the second side portions 110b-2 may connect two adjacent first side portions to each other. For example, the horizontal or crosswise length of each of the first side portions 110b-1 of the bobbin 110 may be different from the horizontal or crosswise length of each of the second side portions 110b-2 of the bobbin 110.

The bobbin 110 may include a projection 115a provided on the outer surface thereof. For example, although the projection 115 may be disposed on the outer surface of the second side portions 110b-2 of the bobbin 110, the disclosure is not limited thereto. The projection 115 may project in a direction that extends through the center of the bore in the bobbin and is parallel to a line perpendicular to the optical axis, but the disclosure is not limited thereto.

The projection 115 of the bobbin 110 may correspond to a groove 25a in the housing 140, and may be disposed in the groove 25a in the housing 140 so as to minimize or inhibit rotation of the bobbin 110 about the optical axis beyond a predetermined range.

Furthermore, the projection 115 may serve as a stopper for minimizing or inhibiting direct collision of the lower surface of the bobbin 110 with the base 210, the second coil 230 or the circuit board 250 even when the bobbin 110 is moved beyond a predetermined range in the optical-axis direction (for example, in a direction toward the lower elastic member 160 from the upper elastic member 150) due to external impact or the like.

The bobbin 110 may have formed in the upper surface thereof a first escape groove 112a for avoiding spatial interference with a first frame connector 153 of the upper elastic member 150. Although the first escape groove 112a may be formed, for example, in the second side portions 110b-2 of the bobbin 110, the disclosure is not limited thereto.

The upper surface of the bobbin 110 may be provided with a guide portion 111 for guiding the mounting position of the upper elastic member 150. As illustrated in FIG. 3A, for example, the guide portion 111 of the bobbin 110 may be disposed in the first escape groove 112a in order to guide the path along which the first frame connector 153 of the upper elastic member 150 extends. For example, the guide portion 111 may project from the bottom surface of the first escape groove 112a in the optical-axis direction.

The bobbin 110 may include a stopper 116 projecting from the upper surface of the bobbin 110.

The stopper 116 of the bobbin 110 may serve to inhibit the upper surface of the bobbin 110 from directly colliding with the inner side of the upper plate of the cover member 300 even when the bobbin 110 is moved beyond a specified range due to an external impact or the like while the bobbin 110 is being moved in the first direction to perform an auto-focusing function.

The bobbin 110 may include first couplers 113, which are intended to be coupled and secured to the upper elastic member 150. Although each of the first couplers 113 of the bobbin 110 shown in FIG. 3A is configured to have a protrusion shape, the disclosure is not limited thereto. In another embodiment, each of the first couplers 113 of the bobbin 110 may be configured to have the shape of a groove or a flat surface.

The bobbin 110 may include second couplers 117, which are intended to be coupled and secured to the lower elastic member 160. Although each of the second couplers 117 of the bobbin 110 shown in FIG. 3B is configured to have a protrusion shape, the disclosure is not limited thereto. In another embodiment, each of the second couplers of the bobbin 110 may be configured to have a groove or flat surface shape.

The outer surface of the bobbin 110 may be provided with a seating groove 105 into which the first coil 120 is seated, fitted or disposed. The seating groove 105 may be configured to have the form of a groove depressed from the first and second side portions 110b-1 and 110b-2 of the bobbin 110, and may have a closed curve shape (for example, a ring shape), which coincides with the shape of the first coil 120.

In order to suppress separation of the coil 120 and to guide the two ends of the coil 120 when the coil units are connected to the lower elastic members 160-1 and 160-2, the lower surfaces of two first side portions 110b-1 or two second side portions 110b-2, which are positioned opposite the bobbin 110, may have guide grooves 116a and 116b formed therein.

The outer surface of the bobbin 110 may be provided therein with a seating groove 180a in which the second magnet 180 is seated, fitted, fixed or disposed.

The seating groove 180a in the bobbin 110 may be depressed from the outer surface of the bobbin 110, and may have an opening formed in at least one of the upper surface and the lower surface of the bobbin 110, without being limited thereto.

Furthermore, the outer surface of the bobbin 110 may be provided therein with a seating groove 185a in which the third magnet 185 is seated, fitted, fixed or disposed.

The seating groove 185a in the bobbin 110 may be depressed from the outer surface of the bobbin 110, and may have an opening, which is formed in at least one of the upper surface and the lower surface of the bobbin 110, without being limited thereto.

Each of the seating grooves 180a and 185a in the bobbin 110 may be positioned above the seating groove 105 in which the first coil 120 is disposed, and may be connected to or abut the seating groove 105, without being limited thereto. In another embodiment, the two grooves may be spaced apart from each other.

The seating groove 180a in the bobbin 110 may be formed in one of the first side portions 110b-1 of the bobbin 110, and the seating groove 185a in the bobbin 110 may be formed in another of the first side portions 110b-1 of the bobbin 110.

For example, the seating grooves 180a and 185a may be formed in two first side portions of the bobbin 110 that face each other or are positioned opposite each other.

Since the second magnet 180 and the third magnet 185 are disposed in the seating grooves 180a and 185a formed in two first side portions of the bobbin 110 that are positioned opposite each other, it is possible to achieve weight equilibrium between the second magnet 180 and the third magnet 185, and it is possible to cause the influence on AF driving force due to the magnetic field interference between the first magnet 130 and the second magnet 180 to cancel out the influence on AF driving force due to the magnetic field interference between the first magnet 130 and the third magnet 185, thereby improving accuracy of AF operation.

The bobbin 110 may be provided on the inner circumferential surface thereof with a thread 11 for coupling to a lens or a lens barrel. The thread 11 may be formed in the inner circumferential surface of the bobbin 110 in the state in which the bobbin 110 is held by a jig or the like. The upper surface of the bobbin 110 may have jig-clamping grooves 15a and 15b formed therein. For example, although the jig-clamping grooves 15a and 15b may be formed in the upper surfaces of two first side portions 110b-1 or two second side portions 110b-2 of the bobbin 110 positioned opposite the bobbin 110, the disclosure is not limited thereto. The jig-clamping grooves 15a and 15b may serve as a contaminant collector for collecting contaminants.

Next, the first coil 120 will be described.

The first coil 120 may be disposed on the outer surface of the bobbin 110.

Although the first coil 120 may be disposed under the second and third magnets 180 and 185, the disclosure is not limited thereto. For example, although the first coil 120 may be disposed under the projection 115 of the bobbin 110, the disclosure is not limited thereto.

For example, although the first coil 120 may not overlap the second and third magnets 180 and 185 in a direction perpendicular to the optical-axis direction, the disclosure is not limited thereto.

For example, the first coil 130 may be disposed in the seating groove 105 in the bobbin 110, the second magnet 180 may be fitted or disposed in the seating groove 180a in the bobbin 110, and the third magnet 185 may be fitted or disposed in the seating groove 185a in the bobbin 110.

Although each of the second magnet 180 and the third magnet 185 disposed at the bobbin 110 may be spaced apart from the first coil 120 in the optical-axis direction, the disclosure is not limited thereto. In another embodiment, each of the second magnet 180 and the third magnet 185, which are disposed at the bobbin 110, may be in contact with the first coil 120, or may overlap the first coil 120 in a direction perpendicular to the optical axis.

The first coil 120 may surround the outer surface of the bobbin 110 about the optical axis OA in a winding direction.

Although the first coil 120 may be directly wound around the outer surface of the bobbin 110, the disclosure is not limited thereto. In another embodiment, the first coil 120 may be embodied as a coil ring, which is wound around the bobbin 110, or as a coil block having an angled shape.

A power or drive signal may be supplied to the coil 120.

The power or drive signal supplied to the first coil 120 may be a DC signal, an AC signal or a signal containing both DC and AC components, and may be of a voltage type or a current type.

When a drive signal (for example, drive current) is supplied to the first coil 120, it is possible to create electromagnetic force resulting from the electromagnetic interaction with the first magnet, thereby moving the bobbin 110 in the direction of the optical axis OA by virtue of the created electromagnetic force.

At the initial position of the AF operation unit, the bobbin 110 may be moved upwards or downwards, which is referred to as bidirectional driving of the AF operation unit. Alternatively, at the initial position of the AF operation unit, the bobbin 110 may be moved upwards, which is referred to as unidirectional driving.

At the initial position of the AF operation unit, the first coil 120 may be disposed so as to correspond to the first magnet 130 disposed at the housing 140 in a direction parallel to a line which is perpendicular to the optical axis OA and extends through the optical axis.

For example, the AF operation unit may include the bobbin 110 and the components (for example, the first coil 120 and the second and third magnets 180 and 185) coupled to the bobbin 110.

The initial position of the AF operation unit may be the original position of the AF operation unit in the state in which no electric power is applied to the first coil 1120 or the position at which the AF operation unit is located as the result of the upper and lower elastic members 150 and 160 being elastically deformed due only to the weight of the AF operation unit.

In addition, the initial position of the bobbin 110 may be the position at which the AF operation unit is located when gravity acts in the direction from the bobbin 110 to the base 210 or when gravity acts in the direction from the base 210 to the bobbin 110.

Next, the second magnet 180 and the third magnet 185 will be described.

The second magnet 180 may be referred to as a sensing magnet because the second magnet 180 provides a magnetic field, which is detected by the first position sensor 170, and the third magnet 185 may be referred to as a balancing magnet, which cancels out the influence of the magnetic field of the sensing magnet 180 and establishes weight equilibrium with respect to the sensing magnet 180.

The second magnet 180 may be disposed in the seating groove 180a in the bobbin 110 so as to face the first position sensor 170.

Although the second magnet 180, which faces the first position sensor 170, may be exposed at a portion of one surface thereof from the seating groove 180a, the disclosure is not limited thereto. In another embodiment, the second magnet 180, which faces the first position sensor 170, may not be exposed at a portion of one surface thereof from the seating groove 180a.

For example, each of the second and third magnets 180 and 185 disposed at the bobbin 110 may be configured such that the interface between the N pole and the S pole is parallel to a direction perpendicular to the optical axis OA. For example, although each of the surfaces of the second and third magnets 180 and 185 that face the first position sensor 170 may be divided into the N pole and the S pole, the disclosure is not limited thereto.

In another embodiment, for example, the interface between the N pole and the S pole of each of the second and third magnets 180 and 185 disposed at the bobbin 110 may be parallel to the optical axis OA.

Although each of the second and third magnets 180 and 185 may be a monopolar magnetized magnet having one N pole and one S pole, the disclosure is not limited thereto. In another embodiment, each of the second and third magnets 180 and 185 may be a bipolar magnetized magnet, which has two N poles and two S poles, or a tetrapolar magnetized magnet.

Each of the second and third magnets 180 and 185 may include a first magnet part 17a, a second magnet part 17b and a partition wall 17c disposed between the first magnet part 17a and the second magnet part 17b. Here, the partition wall 17c may also be alternatively referred to as "nonmagnetic partition wall".

The first magnet part 17a may include an N pole, an S pole and a first interface portion between the N pole and the S pole. The first interface portion may be a portion that has substantially no magnetism and has a zone having almost no polarity, and may be a portion which is naturally formed in order to form a magnet composed of one N pole and one S pole.

The second magnet part 17b may include an N pole, an S pole and a second interface surface between the N pole and the S pole. The second interface portion may be a portion that has substantially no magnetism and has a zone having almost no polarity, and may be a portion that is naturally formed in order to form a magnet composed of one N pole and one S pole.

The partition wall 17c may separate or isolate the first magnet part 17a and the second magnet part 17b from each other, and may be a portion having substantially no magnetism or polarity. For example, the partition wall may be a nonmagnetic material, air or the like. The nonmagnetic partition wall may be considered a "neutral zone" or a "neutral portion".

The partition wall 17c may be a portion that is artificially formed when the first magnet part 17a and the second magnet part 17b are magnetized, and the width of the partition wall 17c may be larger than the width of the first interface portion (or the width of the second interface portion). Here, the width of the partition wall 17c may be the length of the partition wall 17c in a direction toward the second magnet part 17b from the first magnet part 17a. The width of the first interface portion (or the second interface portion) may be the length of each of the first and second magnet parts 17a and 17b toward the S pole from the N pole.

The second magnet 180 may be moved together with the bobbin 110 in the optical-axis direction, and the first position sensor 170 may detect the intensity or magnetic force of the magnetic field of the second magnet 180, which is moved in the optical-axis direction, and may output an output signal corresponding to the result of the detection.

For example, in accordance with displacement of the bobbin 110 in the optical-axis direction, the intensity or magnetic force of the magnetic field detected by the first position sensor 170 may vary. Consequently, the first position sensor 170 may output an output signal proportional to the detected intensity of the magnetic field, and the displacement of the bobbin 110 in the optical-axis direction may be detected using the output signal from the first position sensor 170.

Next, the housing 140 will be described.

The housing 140 accommodates therein the bobbin 110, and supports the first magnet 130, the first position sensor 170, and the circuit board 190.

Figure 4A:
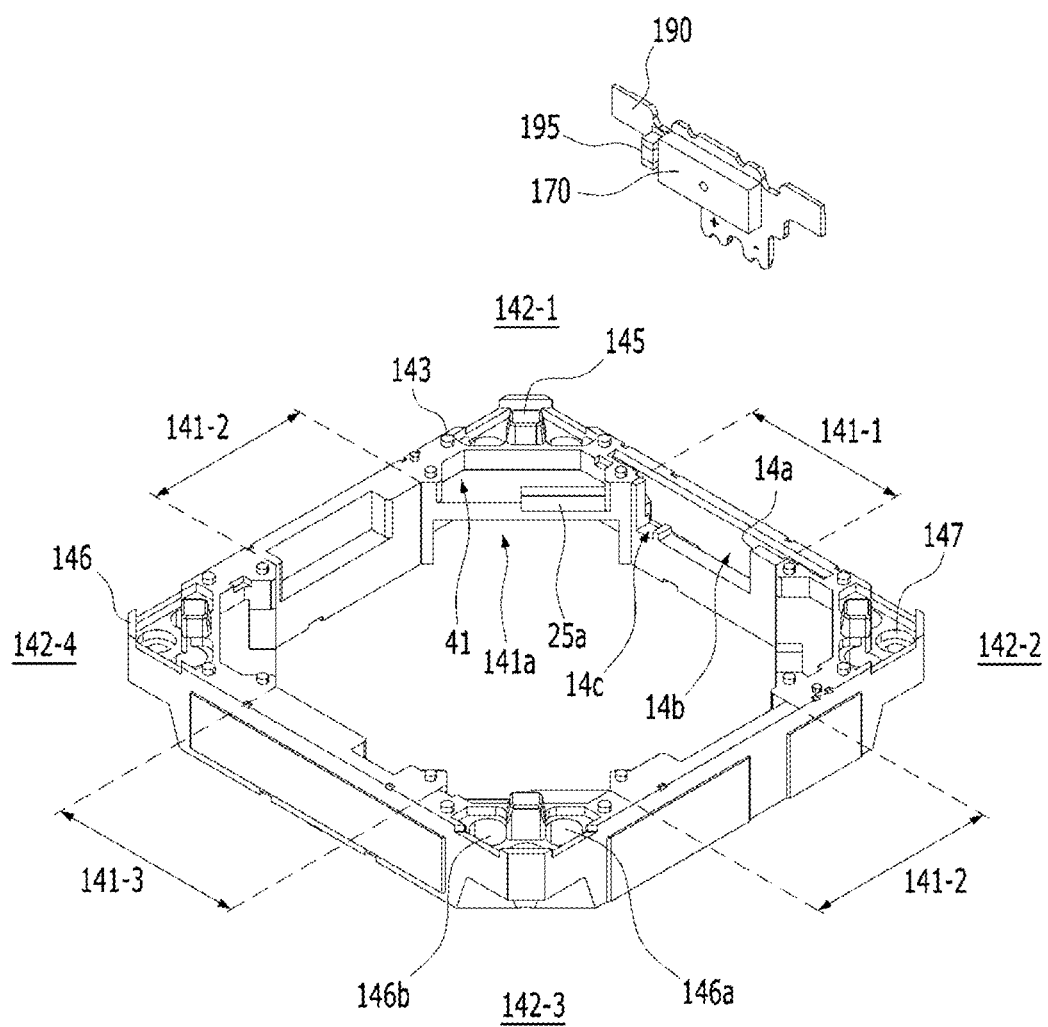
FIG. 4A is a perspective view of the housing, the circuit board, the position sensor, and the capacitor, which are shown in FIG. 1.
Figure 4B:
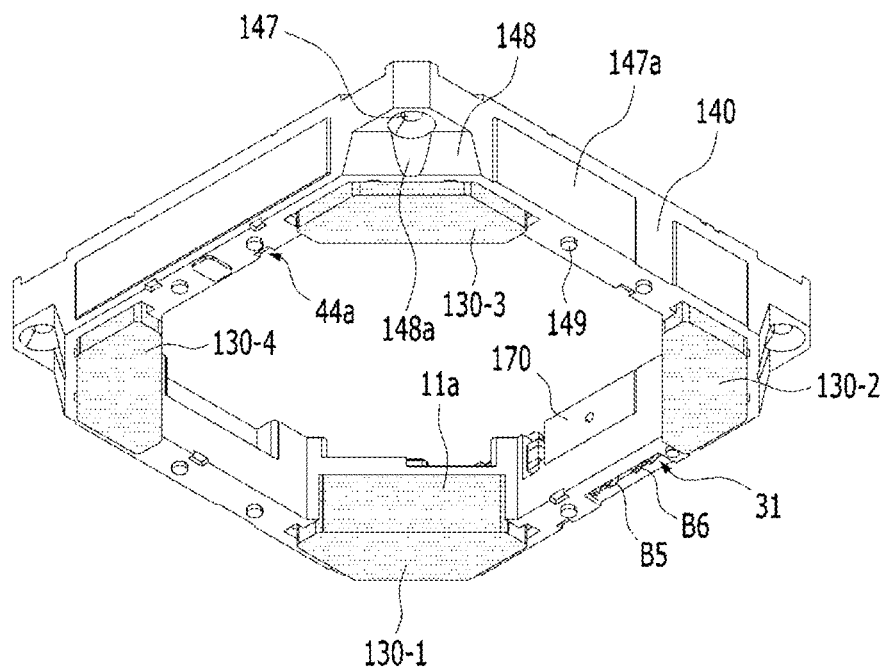
FIG. 4B is an assembled perspective view of the housing, the first magnet, the circuit board, the first position sensor, and the capacitor.

FIG. 4A is a perspective view of the housing 140, the circuit board 190, the position sensor 170, and the capacitor 195, which are shown in FIG. 1. FIG. 4B is an assembled perspective view of the housing 140, the first magnet 130, the circuit board 190, the first position sensor 170, and the capacitor 195.

Referring to FIGS. 4A and 4B, the housing 140 may be configured to have a hollow column overall. For example, the housing 140 may have a polygonal (for example, a rectangular or octagonal) or circular bore, and the bore in the housing 140 may be a through hole, which is formed through the housing 140 in the optical-axis direction.

The housing 140 may include a plurality of side portions 141-1 to 141-4 and a plurality of corner portions 142-1 to 142-4.

For example, the housing may include first to fourth side portions 141-1 to 141-4, which are spaced apart from each other, and first to fourth corner portions 142-1 to 142-4, which are spaced apart from each other.

Each of the corner portions 142-1 to 142-4 of the housing 140 may be disposed or positioned between two adjacent side portions 141-1 and 141-2, 141-2 and 141-3, 141-3 and 141-4, and 141-4 and 141-1 so as to connect the side portions to each other.

For example, the corner portions 142-1 to 142-4 may be positioned at the corners of the housing 140. For example, although the number of side portions of the housing 140 is four and the number of corner portions is four, the disclosure is not limited thereto. The number of side portions or corner portions may be five or more.

Each of the side portions 141-1 to 141-4 of the housing 140 may be disposed parallel to a corresponding one of side plates of the cover member 300.

For example, the side portions 141-1 to 141-4 of the housing 140 may respectively correspond to the first side portions 110b-1 of the bobbin 110, and the corner portions 142-1 to 142-4 of the housing 140 may respectively correspond to or face the second side portions 110b-2 of the bobbin 110.

The first magnet 130 may be disposed or mounted on the corner portions 142-1 to 142-4 of the housing 140.

For example, each of the corners or the corner portions 142-1 to 142-4 of the housing 140 may be provided with a seating portion or a reception portion 141a for receiving the magnet 130 therein.

The seating portion 141a of the housing 140 may be formed in the lower portion or the lower end of at least one of the corner portions 142-1 to 142-4 of the housing 140.

For example, the seating portion 141a in the housing 140 may be formed in an inner portion of the lower portion or the lower end of each of the four corner portions 142-1 to 142-4.

Although each of the seating portion 141a in the housing 140 may have a groove, for example, a recessed groove having a shape corresponding to the first magnet 130, the disclosure is not limited thereto.

For example, a first opening may be formed in a side surface of the seating portion 141a in the housing 140, which faces the first coil 120, and a second opening may be formed in the lower surface of the seating portion 141a in the housing 140, which faces the second coil 230, in order to facilitate mounting of the first magnet 130.

For example, a first surface 11a of the first magnet 130, which is fixed to or disposed in the seating portion 141a in the housing 140, may be exposed through the first opening in the seating portion 141a. Furthermore, a lower surface 11c of the first magnet 130, which is fixed to or disposed in the seating portion 141a in the housing 140, may be exposed through the second opening in the seating portion 141a.

The housing 140 may have an escape groove 41 formed in the upper surface of each of the corner portions in order to avoid spatial interference with the first frame connector 153 of the upper elastic member 150.

For example, the escape groove 41 in the housing 140 may be depressed from the upper surface of the housing 140, and may be positioned closer to the center of the housing 140 than is a stopper 145 or an adhesive injection hole 147. For example, the escape groove 41 may be positioned further inwards than the stopper 145 of the housing 140 in a direction toward the center of the housing 140, and the adhesive injection holes 146a and 146b may be positioned opposite the escape groove 41 with respect to the stopper 145.

Each of the corner portions 142-1 to 142-4 of the housing 140 may have therein the groove 25a, which corresponds to or faces the projection 115 of the bobbin 110. The groove 25a in the housing 140 may be positioned at the seating portion 141a in the housing 140. For example, the groove 25a in the housing 140 may be formed in the bottom surface of the escape groove 41. For example, the bottom surface of the groove 25a may be positioned lower than the bottom surface of the escape groove 41, and the seating groove 141a in the housing 140 may be positioned lower than the bottom surface of the escape groove 41.

Although the first magnet 130 may be fixed to the seating portion 141a by means of an adhesive, the disclosure is not limited thereto.

For example, each of the corner portions 142-1 to 142-4 of the housing 140 may be provided with one or more adhesive injection holes 146a and 146b through which an adhesive is injected. The one or more adhesive injection holes 146a and 146b may be depressed from the upper surface of corresponding corner portions 142-1 to 142-4.

Each of the adhesive injection holes 146a and 146b may have a through hole, which is formed through a corresponding one of the corner portions 142-1 to 142-4, may be connected to or communicate with the seating groove 141a in the housing 140, and may expose at least a portion of the first magnet 130 (for example, at least a portion of the upper surface of the magnet 130). Since each of the adhesive injection holes 146a and 146b exposes at least a portion of the first magnet 140 (for example, at least a portion of the upper surface of the magnet 130), it is possible to efficiently apply an adhesive to the first magnet 130 and thus to increase the coupling force between the first magnet 130 and the housing 140.

The housing 140 may include at least one stopper 147a projecting from the outer surfaces of the side portions 141-1 to 141-4, and the at least one stopper 147a may serve to inhibit the housing 140 from colliding with the side plate of the cover member 300 when the housing 140 moves in a direction perpendicular to the optical axis.

In order to inhibit the lower surface of the housing 140 from colliding with the base 210 and/or the circuit board 250, the housing 140 may include a stopper (not shown) projecting from the lower surface thereof.

The housing 140 have a mounting groove 14a (or a seating groove) configured to receive the circuit board 190, a mounting groove 14b (or a seating groove) configured to receive the position sensor 170, and a mounting groove 14c (or a seating groove) configured to receive the capacitor 195.

The mounting groove 14a in the housing 140 may be formed in the upper portion or the upper end of one of the side portions 141-1 to 141-4 of the housing 140 (for example, 141-1).

In order to facilitate mounting of the circuit board 190, the mounting groove 14a in the housing 140 may have a groove structure, which is open at the upper surface thereof and has a side surface and a bottom surface and an opening formed in the inner surface thereof so as to be exposed to the inside of the housing 140. The mounting groove 14a in the housing 140 may have a shape that corresponds to or coincides with the shape of the circuit board 190.

The mounting groove 14b in the housing 140 may be formed in the inner surface of the first side portion 141-1 of the housing 140, and may be connected to the mounting groove 14a.

A mounting groove 14c in the housing 140 may be formed at a portion of the mounting groove 14b, and a protrusion or a projection may be provided between the mounting groove 14b and the mounting groove 14c so as to separate or isolate the capacitor 195 from the first position sensor 170. The reason for this is to position the capacitor 195 and the position sensor 170 close to each other and to reduce the length of the path for electrical connection between the capacitor 195 and the position sensor 170 in order to reduce noise caused by a long path.

The capacitor 195 may be disposed or mounted on a second surface 19a of the circuit board 190.

The capacitor 195 may be configured to have a chip shape. Here, the chip may include a first terminal, which corresponds to one end of the capacitor 195, and a second terminal, which corresponds to the other end of the capacitor 195. The capacitor 195 may be alternatively referred to as a "capacitive element" or "condenser".

In another embodiment, the capacitor may be embodied as being included in the circuit board 190. For example, the circuit board 190 may include the capacitor including a first conductive layer, a second conductive layer, and an insulation layer (for example, a dielectric layer) disposed between the first and second conductive layers.

The capacitor 195 may be conductively connected in parallel to first and second terminals B1 and B2 of the circuit board 190 through which power (or a drive signal) is supplied to the position sensor 170 from the outside.

Alternatively, the capacitor 195 may be conductively connected in parallel to the terminals of the first position sensor 170, which is conductively connected to the first and second terminals B1 and B2 of the circuit board 190.

For example, one end of the capacitor 195 (or the first terminal of the capacitor chip) may be conductively connected to the first terminal B1 of the circuit board 190, and the other end of the capacitor 195 (or the first terminal of the capacitor chip) may be conductively connected to the second terminal B2 of the circuit board 190.

Since the capacitor 195 is conductively connected in parallel to the first and second terminals B1 and B2 of the circuit board 190, the capacitor 195 is capable of serving as a smoothing circuit for eliminating ripple components included in the power signals GND and VDD, which are supplied to the first position sensor 170 from the outside, and is thus capable of supplying stable and consistent power signals to the first position sensor 170.

Furthermore, since the capacitor 195 is conductively connected in parallel to the first and second terminals B1 and B2 of the circuit board 190, it is possible to protect the first position sensor 170 from high-frequency noise, ESD and the like, which is introduced from the outside.

In addition, the capacitor 195 is capable of inhibiting overcurrent, which is caused by high-frequency noise, ESD or the like introduced from the outside, from being applied to the first position sensor 170, and is capable of inhibiting a calibration value for displacement of the bobbin 110, which is obtained based on the signal output from the first position sensor 170, from being reset due to the overcurrent.

The mounting groove 14b of the housing 140 may be open at the upper portion thereof in order to facilitate mounting of the first position sensor 170, and may have an opening, which is formed in the inner surface of the first side portion 141-1 of the housing 140 in order to improve the sensitivity of the position sensor 170. The mounting groove 14b in the housing 140 may have a shape corresponding to or coinciding with the shape of the position sensor 170.

For example, the circuit board 190 may be secured in the mounting groove 14a in the housing 140 using an adhesive member. Although the adhesive member may be epoxy or double-sided adhesive tape, the disclosure is not limited thereto.

The corner portions 142-1 to 142-4 of the housing 140 may be respectively provided therein with the support members 220-1 to 220-4.

The corner portions 142-1 to 142-4 of the housing 140 may be respectively provided therein with holes 147, which define paths through which the support members 220-1 to 220-4 extend. For example, the housing 140 may include the holes 147, which are respectively formed through the upper portions of the corner portions 142-1 to 142-4 of the housing 140.

In another embodiment, each of the holes formed in the corner portions 142-1 to 142-4 of the housing 140 may be depressed from the outer surface of the corner portion, and at least a portion of the hole may be open at the outer surface of the corner portion. The number of holes 147 in the housing 140 may be the same as the number of support members.

One end of each of the support members 220 may be connected or bonded to the upper elastic member 150 through the hole 147.

For example, although the diameter of the hole 147 may gradually increase in a direction toward the lower surface from the upper surface of the housing 140 in order to allow a damper to be easily applied, the disclosure is not limited thereto. In another embodiment, the diameter of the hole 147 may be constant.

In order not only to define the paths through which the support members 220-1 to 220-4 extend but also to avoid spatial interference between the support members 220-1 to 220-4 and the corner portions 142-1 to 142-4 of the housing 140, escape grooves 148a may be respectively formed in the outer surfaces 148 of the corner portions 142-1 to 142-4. Although each of the escape grooves 148a may be connected to the hole 147 in the housing 140 and may have a semicircular or semi-elliptical section, the disclosure is not limited thereto. The lower portion or the lower end of the escape groove 148a may be connected to the lower surface of the housing 140.

For example, although the diameter of the escape groove 148a may gradually decrease downwards, the disclosure is not limited thereto.

In order to inhibit the housing 140 from directly colliding with the inner surface of the upper plate of the cover member 300, the housing 140 may be provided at the upper portion, the upper end or the upper surface thereof with the stoppers 145.

For example, although the stoppers 145 may respectively be disposed on the upper surfaces of the corner portions 142-1 to 142-4 of the housing 140, the disclosure is not limited thereto.

In order to inhibit the lower surface of the housing 140 from colliding with the base 210 and/or the circuit board 250, the housing 140 may further be provided at the lower portion, the lower end or the lower surface thereof with stoppers (not shown).

Furthermore, the corners of the upper surfaces of the corner portions 142-1 to 142-4 of the housing 140 may be respectively provided with guide projections 144 in order to inhibit the damper from overflowing.

For example, each of the holes 147 in the housing 140 may be positioned between the corner (for example, the guide projection 144) and the stopper 145 on the upper surface of a corresponding one of the corner portions 142-1 to 142-4 of the housing 140.

The upper portion, the upper end or the upper surface of the housing 140 may be provided with at least one coupler 143, which is coupled to the first outer frame 152 of the upper elastic member 150.

The first coupler 143 of the housing 140 may be disposed at at least one of the side portions 141-1 to 141-4 and the corner portions 142-1 to 142-4 of the housing 140.

The lower portion, the lower end or the lower surface of the housing 140 may be provided with a second coupler 149, which is coupled or secured to the second outer frame 162 of the lower elastic member 160.

Although each of the first and second couplers 143 and 149 of the housing 140 may have a protrusion shape, the disclosure is not limited thereto. In another embodiment, the coupler may have a groove or flat surface shape.

For example, the first coupler 143 of the housing 140 may be coupled to the hole 152a in the first outer frame 152 of the upper elastic member 150 using an adhesive member (for example, solder) or heat fusion, and the second coupler 149 of the housing 140 may be coupled to the hole 162a in the second outer frame 162 of the lower elastic member 160 using an adhesive member (for example, solder) or heat fusion.

In order to avoid spatial interference with the portions at which the second outer frames 162-1 to 162-3 of the lower elastic member 160 meet second frame connectors 163, an escape groove 44a may be formed in the lower surface of at least one of the side portions 141-1 of the housing 140.

Next, the first magnet 130 will be described.

The first magnet 130 may be disposed at at least one of the corners (or the corner portions 142-1 to 142-4) of the housing 140. For example, the first magnet 130 may be disposed at the corners of the housing 140.

At the initial position of the AF operation unit, each of the first magnets 130: 130-1 to 130-4 may be disposed at the housing 140 such that at least a portion thereof overlaps the first coil 120 in a direction parallel to a line that is perpendicular to the optical axis OA and extends through the optical axis OA.

For example, each of the first magnets 130: 130-1 to 130-4 may be fitted or disposed in the seating portion 141a in a corresponding one of the corner portions 141-1 to 141-4 of the housing 140.

In another embodiment, the first magnet 130 may be disposed on the outer surfaces of the corner portions 141-1 to 141-4 of the housing 140.

The magnets 130 may have a polyhedral shape, which is easily seated on the corner portions of the housing 140.

For example, the surface area of the first surface of the first magnet 130 may be greater than the surface area of the second surface thereof. The first surface of the first magnet 130 may a surface that faces one surface of the first coil 120 (or the outer surface of the bobbin 110), and the second surface of the first magnet 130 may be a surface opposite the first surface.

For example, the crosswise length of the second surface of the first magnet 130 may be less than the crosswise length of the first surface.

For example, the first magnet 130 may include a portion in which the crosswise length thereof decreases in a direction toward the second surface from the first surface of the first magnet 130. For example, the crosswise direction of the first magnet 130 may be a direction parallel to the first surface of the first magnet 130.

Each of the first magnets 130-1 to 130-4 may be integrally formed, and each of the first magnets 130-1 to 130-4, which face the first coil 120, may be provided on the first surface thereof with an S pole and on the second surface thereof with an N pole. However, the disclosure is not limited thereto, and each of the first magnets 130-1 to 130-4 may be provided on the first surface thereof with an N pole and on the second surface thereof with an S pole in another embodiment.

The first magnets may include at least two magnets, which are disposed or mounted on the corner portions of the housing 140 so as to face each other.

For example, two pairs of first magnets, which are disposed such that the first magnets in each pair face each other, may be disposed at the corner portions 142-1 to 142-4 of the housing 140. Here, the horizontal surface of each of the magnets 130-1 to 130-4 may have a polygonal shape, such as a triangular, pentagonal, hexagonal or rhombus shape.

In another embodiment, one pair of first magnets, which face each other, may be disposed at only two of the corner portions of the housing 140, which face each other.

Although each of the first magnets 130-1 to 130-4 may be a monopolar magnetized magnet, the disclosure is not limited thereto. In another embodiment, each of the first magnets 130-1 to 130-4 may be a bipolar magnetized magnet, which has two N poles and two S poles, or a tetrapolar magnetized magnet.

Figure 5:
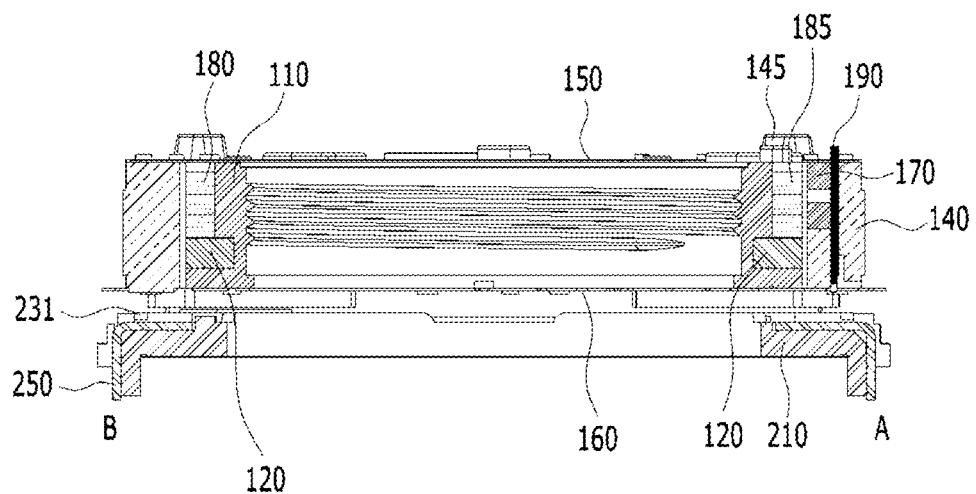
FIG. 5 is a cross-sectional view of the lens moving apparatus, taken along line A-B in FIG. 2.
Figure 6:
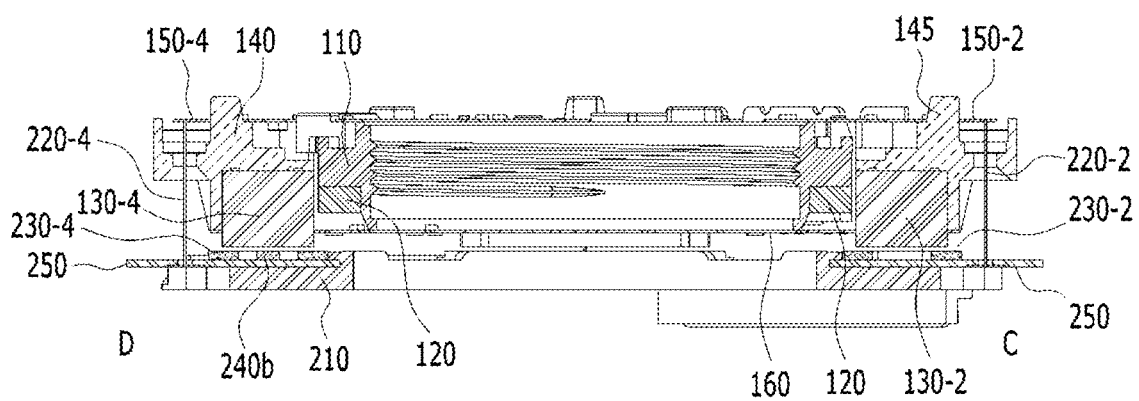
FIG. 6 is a cross-sectional view of the lens moving apparatus, taken along line C-D in FIG. 2.
Figure 7:
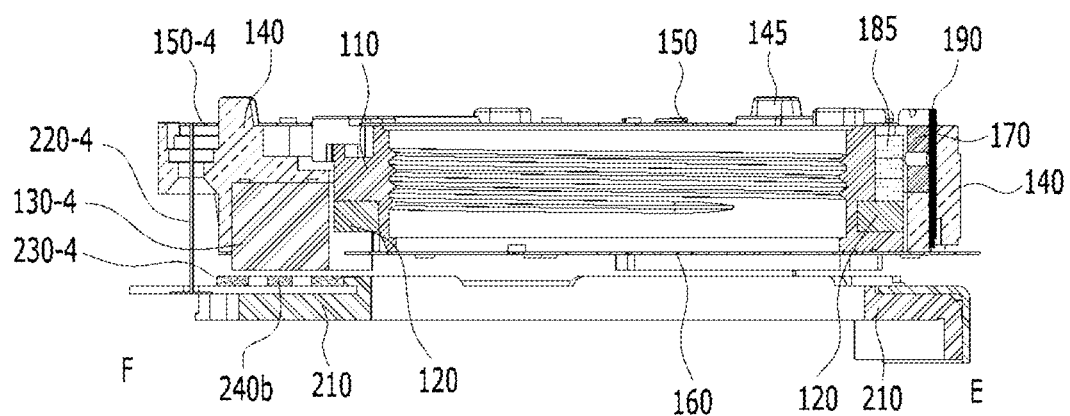
FIG. 7 is a cross-sectional view of the lens moving apparatus, taken along line E-F in FIG. 2.

FIG. 5 is a cross-sectional view of the lens moving apparatus 100 shown in FIG. 2 taken along line A-B. FIG. 6 is a cross-sectional view of the lens moving apparatus 100 shown in FIG. 2 taken along line C-D. FIG. 7 is a cross-sectional view of the lens moving apparatus 100 shown in FIG. 2 taken along line E-F.

Referring to FIGS. 5 to 7, although each of the second and third magnets 180 and 185 may not overlap the first coil 120 in a direction perpendicular to the optical axis OA or in a direction parallel to a line that is perpendicular to the optical axis OA and extends through the optical axis, the disclosure is not limited thereto. In another embodiment, each of the second and third magnets 180 and 185 may overlap the first coil 120.

At the initial position of the AF operation unit, the first magnet 130 may overlap the first coil 120 in a direction perpendicular to the optical axis OA or in a direction parallel to a line that is perpendicular to the optical axis and extends through the optical axis.

At the initial position of the AF operation unit, although the second magnet 180 may overlap or be aligned with the third magnet 185 in a direction perpendicular to the optical axis OA, or in a direction parallel to a line that is perpendicular to the optical axis and extends through the optical axis, the disclosure is not limited thereto.

At the initial position of the AF operation unit, although the first position sensor 170 may overlap at least one of the second magnet 180 and the third magnet 185 in a direction perpendicular to the optical axis OA, or in a direction parallel to a line which is perpendicular to the optical axis and extends through the optical axis.

In another embodiment, the first position sensor 170 may not overlap at least one of the second and third magnets 180 and 185 in a direction perpendicular to the optical axis OA, or in a direction parallel to a line that is perpendicular to the optical axis and extends through the optical axis.

Next, the circuit board 190 and the first position sensor 170 will be described.

The circuit board 190 may be disposed at one side portion 141-1 of the housing 140, and the first position sensor 170 may be disposed or mounted on the circuit board 190. For example, the circuit board 190 may be disposed in the first mounting groove 14a in the housing 140.

For example, the circuit board 190 may be disposed between the first corner portion 142-1 and the second corner portion 142-2 of the housing 140, and first to fourth terminals B1 to B4 of the circuit board 190 may be conductively connected to the first position sensor 170.

For example, the circuit board 190 may not overlap an imaginary line, which connects the corner portion (for example, the first corner portion 142-1) or the corner of the housing 140 to the optical axis OA. The reason for this is to inhibit spatial interference between the support member 220 and the circuit board 190.

Figure 8A:
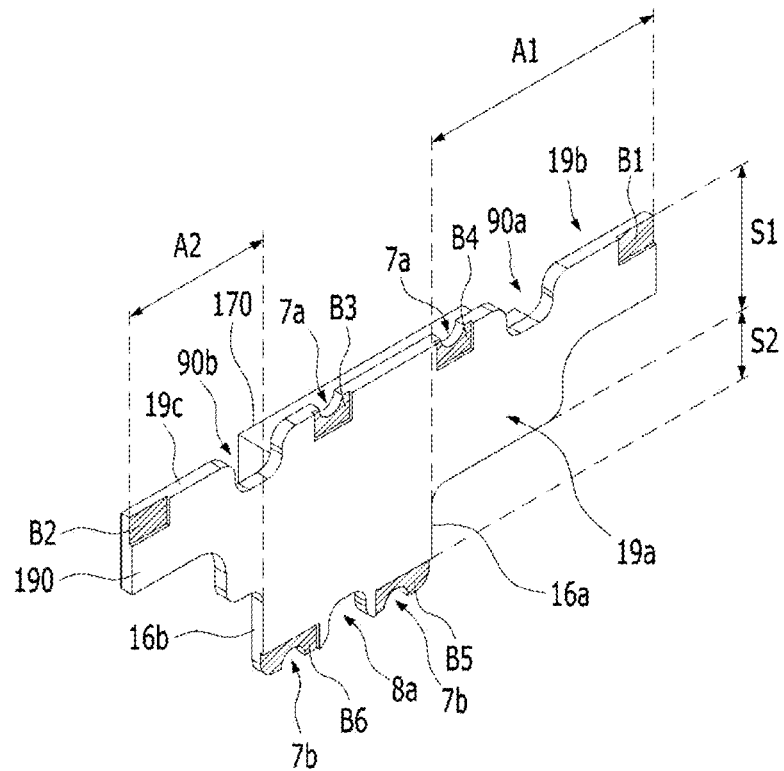
FIG. 8A is an enlarged view of the circuit board and the first position sensor.
Figure 8B:
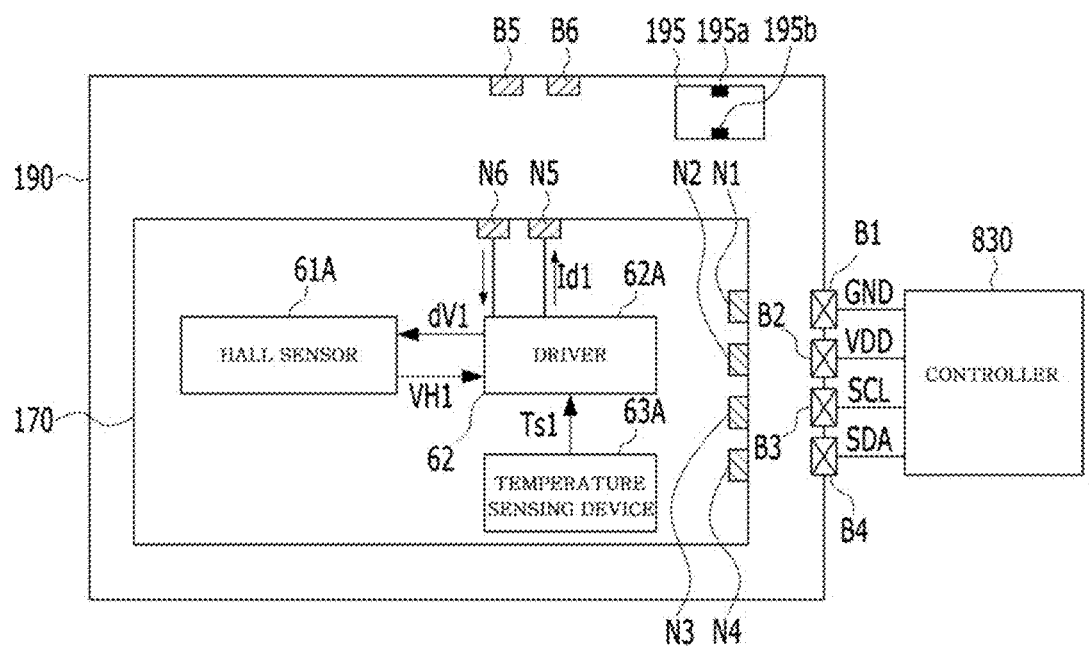
FIG. 8B is a schematic view of an embodiment of the first sensor shown in FIG. 8A.

FIG. 8A is an enlarged view of the circuit board 190 and the first position sensor 170. FIG. 8B is a schematic view of an embodiment of the first sensor 170 shown in FIG. 8A.

Referring to FIGS. 8A and 8B, the circuit board 190 may include terminals B1 to B6, which are to be conductively connected to external terminals or external devices.

The first position sensor 170 may be disposed on the first surface 19b of the circuit board 190, and the terminals B1 to B6 may be disposed on the second surface 19a of the circuit board 190.

Here, the second surface 19a of the circuit board 190 may be the surface opposite the first surface 19b of the circuit board 190. For example, the second surface 19a of the circuit board 190 may be the surface of the circuit board 190 that faces the bobbin 110.

The circuit board 190 may include a body part S1 and an extension part S2, positioned under the body part S1. The body part S1 may be alternatively referred to as an "upper part", and the extension part S2 may be alternatively referred to as a "lower part".

The extension part S2 may extend downwards from the body part S1.

The body part S1 may have a form projecting from side surfaces 16a and 16b of the extension part S2. For example, the side surfaces 16a and 16b of the extension part S2 may be surfaces connecting the first surface 19b to the second surface 19a of the extension part S2.

The body part S1 may include a first extension region A1 extending in a direction toward the first corner portion 142-1 and a second extension region A2 extending in a direction toward the second corner portion 142-2 of the housing 140.

For example, the first extension region A1 may extend or project from the first side surface 16a of the extension part S2, and the second extension region A2 may extend or project from the second side surface 16B of the extension part S2.

For example, although the crosswise length of the first extension region A1 is shown as being greater than the crosswise length of the second extension region A2 in FIG. 8A, the disclosure is not limited thereto. In another embodiment, the crosswise length of the first extension region A1 may be equal to or less than the crosswise length of the second extension region A2.

For example, the crosswise length of the body part S1 of the circuit board 190 may be greater than the crosswise length of the extension part S2.

For example, the first to fourth terminals B1 to B4 of the circuit board 190 may be disposed on the first surface 19b so as to be spaced apart from one another. For example, the four terminals B1 to B4 may be arranged in the crosswise direction of the circuit board 190 in a line.

The first to fourth terminals B1 to B4 may be disposed closer to the upper surface 19c than to the lower surface of the circuit board 190.

For example, the first to fourth terminals B1 to B4 may be formed so as to abut on both the second surface 19a of the circuit board 190 and the upper surface 19c of the body part S1 of the circuit board 190 abutting on the second surface 19a.

For example, at least one of the first to fourth terminals B1 to B4 may include a groove or a via 7a formed in the upper surface 19c of the circuit board 190. By virtue of the groove 7a, the contact area between solder and the terminals B3 and B4 is increased, thereby improving adhesive force and solderability.

The fifth terminal B5 and the sixth terminal B6 of the circuit board 180 may be disposed on the first surface 19b of the extension part S2 of the circuit board 190 so as to be spaced apart from each other.

The circuit board 190 may have a groove or hole 8a formed between the fifth terminal B5 and the sixth terminal B6. The groove 8a may be depressed from the lower surface of the circuit board 190, and may be open both at the first surface 19b and at the second surface 19a of the circuit board 190.

Since solder is not applied to the portion between the fifth terminal B5 and the sixth terminal B6 by virtue of the groove 8a during soldering for conductive connection to external components, it is possible to inhibit an electrical short between the fifth terminal B5 and the sixth terminal B6.

For example, at least one of the fifth and sixth terminals B5 and B6 may include a groove or a via 7b formed in the lower surface of the circuit board 190. By virtue of the groove 7b, the size of the contact area between the solder and the fifth and sixth terminals B5 and B6 is increased, thereby improving adhesive force and solderability.

The circuit board 190 may include a groove 90a formed between the second terminal B2 and the third terminal B3 and a groove 90b formed between the first terminal B1 and the fourth terminal B4. Here, the grooves 90a and 90b may be alternatively referred to as "escape grooves".

Each of the first groove 90a and the second groove 90b may be depressed from the upper surface 19c of the circuit board 190, and may be open both at the first surface 19b and at the second surface 19a of the circuit board 190.

The first groove 90a in the circuit board 190 may be formed in order to avoid spatial interference with a first outer frame 151 of a third upper elastic unit 150-3, and the second groove 90b in the circuit board 190 may be formed in order to avoid spatial interference with a first outer frame 151 of a fourth upper elastic unit 150-4.

For example, the circuit board 190 may be embodied as a printed circuit board or an FPCB.

The circuit board 190 may include a circuit pattern or a wire (not shown) for conductively connecting the first to sixth terminals B1 to B6 to the first position sensor 170.

The first position sensor 170 may detect the magnetic field or the intensity of the magnetic field of the second sensing magnet 180 mounted on the bobbin 110 during movement of the bobbin 110, and may output an output signal corresponding to the result of the detection.

The first position sensor 170 may be mounted on the circuit board 190 disposed at the housing 140, and may be secured to the housing 140. For example, the first position sensor 170 may be disposed in the mounting groove 14b in the housing 190, and may be moved together with the housing 140 during handshake correction.

The first position sensor 170 may be disposed on the second surface 19a of the circuit board 190. In another embodiment, the first position sensor 170 may be disposed on the first surface 19b of the circuit board 190.

The first position sensor 170 may include a Hall sensor 61A and a driver 62A.

For example, the hall sensor 61A may be made of silicone, and the output VH1 of the hall sensor 61A may increase as the ambient temperature increases. For example, the ambient temperature may be the temperature of the lens moving apparatus, for example, a temperature of the circuit board 190, the temperature of the hall sensor 61A or the temperature of the driver 62A.

In another embodiment, the hall sensor 61A may be made of GaAs, and the output VH of the hall sensor 61A may decrease as the ambient temperature increases. In another embodiment, the output of the hall sensor 61A may have a slope of about −0.06%/° C. with respect to an ambient temperature.

The first position sensor 170 may further include a temperature-sensing element 63A capable of detecting an ambient temperature. The temperature-sensing element 63A may output a temperature detection signal Ts1, corresponding to the result of detection of the ambient temperature of the first position sensor 170A, to the driver 62A.

For example, the hall sensor 61 of the first position sensor 190 may generate the output VH corresponding to the result of detection of the intensity of the magnetic force of the second magnet 180. For example, the intensity of the output of the first position sensor 190 may be proportional to the intensity of the detected magnetic force of the second magnet 180.

The driver 62A may output a drive signal dV1 for driving the hall sensor 61A and a drive signal Id1 for driving the first coil 120.

For example, the driver 62A may receive a clock signal SCL, a data signal SDA and power signals VDD and GND from the controller 830 or 780 through data communication using a protocol such as I2C communication.

Here, although the first power signal GND may be a ground voltage or 0V and the second power signal VDD may be a predetermined voltage for driving the driver 62, and may be DC voltage and/or AC voltage, the disclosure is not limited thereto.

Furthermore, the driver 62A may receive the output VH1 of the hall sensor 61A, and may send the clock signal SCL and the data signal SDA pertaining to the output VH1 of the hall sensor 61A to the controller 830 or 780 through data communication using a protocol such as I2C communication.

Furthermore, the driver 62A may receive the temperature detection signal Ts1 as a result of detection by the temperature-sensing element 63A, and may send the temperature detection signal Ts1 to controller 830 or 780 through the data communication using a protocol such as the I2C communication.

For example, the driver 62A may further include an amplifier, which receives the output VH1 of the Hall sensor 61A and amplifies and outputs the received output VH1 of the Hall sensor 61A in response to a control signal. For example, the amplifier may be a variable gain amplifier, in which a gain is variable in response to the control signal.

For example, the driver 62A may further include an analog-digital converter, which performs analog-to-digital conversion for the output of the amplifier and outputs the converted digital signal.

The driver 62A may further include an interface unit capable of performing data communication, for example, I2C communication using an external host and a protocol and capable of transmitting and receiving a clock signal SCL and a data signal SDA.

The driver 62A may further include a memory, for example, an EEPROM in which an initial register setting value of the first position sensor 170 for displacement of the operation unit (for example, the bobbin 110) and a calculated value are stored.

The driver 62A may further include a logical controller, configured to create a control signal to control the gain of the amplifier.

The driver 62A may further include a PID controller (a proportional-integral-derivative controller) configured to perform phase compensation and/or gain compensation for the output of the analog-digital converter. The logical controller may control the phase compensation and/or the gain compensation of the PID controller.

The driver 62A may further include a drive-signal creator for creating a drive signal Id1 based on the output of the PID controller.

The controller 830 or 780 may perform temperature compensation for the output VH1 from the hall sensor 61A based on variation in the ambient temperature detected by the temperature-sensing element 63A of the first position sensor 170.

The first position sensor 170 may include the first to fourth terminals N1 to N4 for the power signals VDD and GND, the clock signal SCL and the data SDA, and the fifth and sixth terminals N5 and N6 for providing drive signals Id1 to the first coil 120.

Each of the first to fourth terminals N1 to N4 of the first position sensor 170 may be conductively connected to a corresponding one of the first to fourth terminals B1 to B4 of the circuit board 190, and each of the fifth and sixth terminals N5 and N6 of the first position sensor 170 may be conductively connected to a corresponding one of the fifth and sixth terminals B5 and B6 of the circuit board 190.

Each of the first to sixth terminals B1 to B6 of the circuit board 190 may be conductively connected to a corresponding one of the terminals 21-1 to 21-n of the circuit board 250 through the upper elastic member 150 (and/or the lower elastic member 160) and the support member 220.

For example, the first to fourth terminals B1 to B4 of the circuit board 190 may be conductively connected to the upper elastic units 150-1 to 150-4 and the support members 220-1 to 220-4, whereby each of the first to fourth terminals B1 to B4 of the first position sensor 170 may be conductively connected to a corresponding one of the terminals 21-1 to 21-n (n=4) of the circuit board 250.

For example, the fifth and sixth terminals B5 and B6 of the circuit board 190 may be conductively connected to the lower elastic units 160-1 and 160-2, and the fifth and sixth terminals B5 and B6 of the first position sensor 170 may be conductively connected to the first coil 120 via the lower elastic units 160-1 and 160-2.

For example, the fifth terminal B5 of the circuit board 190 may be coupled to the first lower elastic unit 160-1, and the sixth terminal B6 of the circuit board 190 may be coupled to the second lower elastic unit 160-2.

Next, the upper elastic member 150, the lower elastic member 160 and the support member 220 will be described.

Figure 9A:
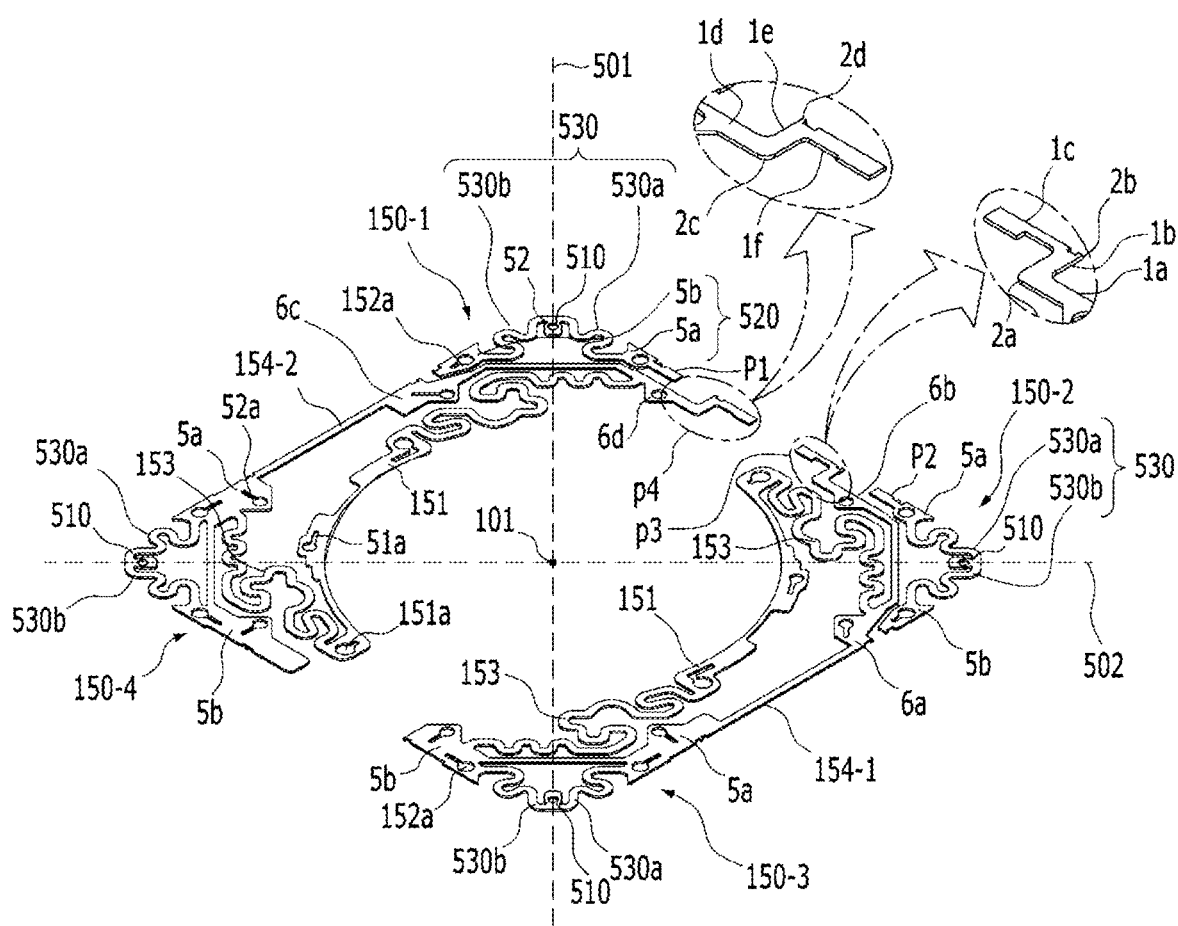
FIG. 9A is a view illustrating the upper elastic member shown in FIG. 1.
Figure 9B:
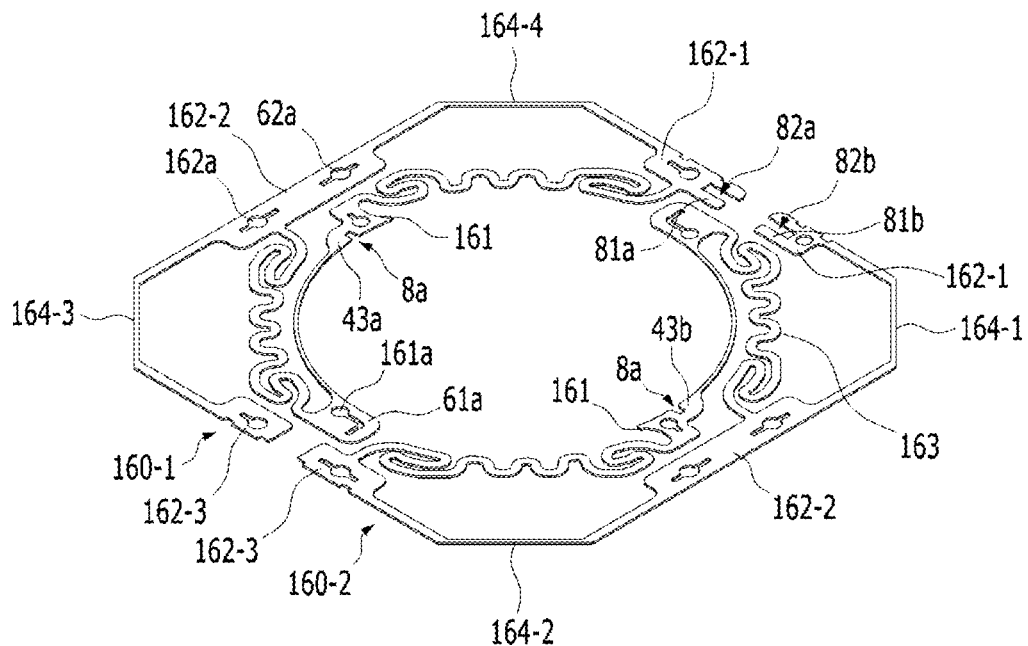
FIG. 9B is a view illustrating the lower elastic member shown in FIG. 1.
Figure 10:
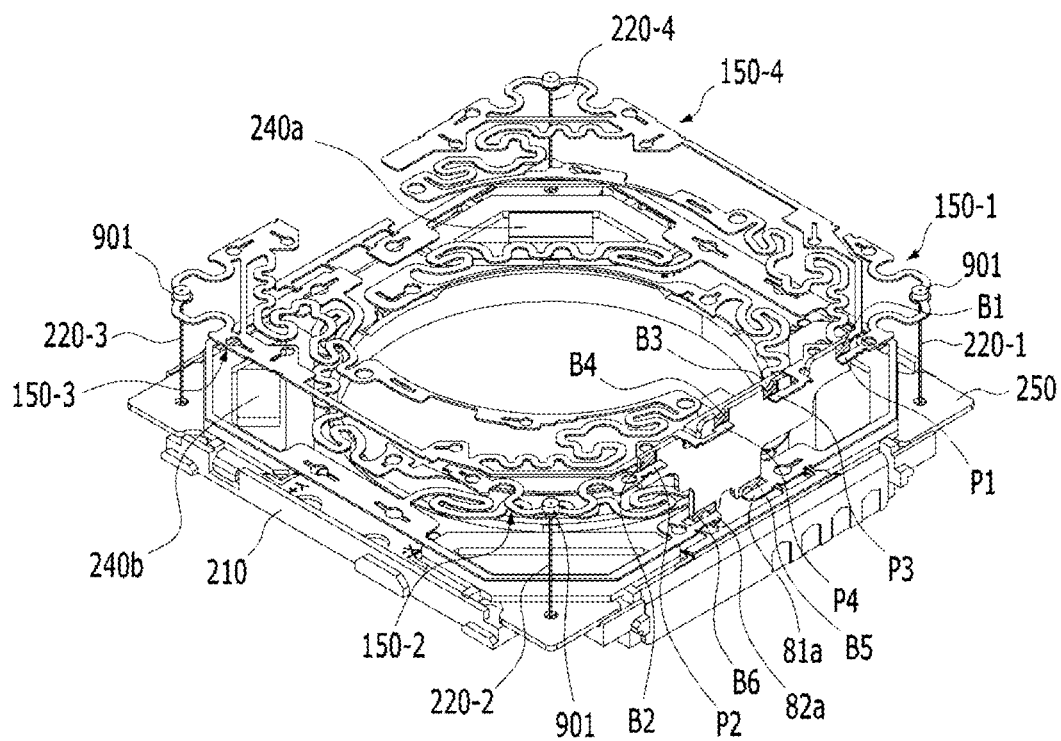
FIG. 10 is an assembled perspective view of the upper elastic member, the lower elastic member, the base, the support member, the second coil, the circuit board and the second position sensor.
Figure 11A:
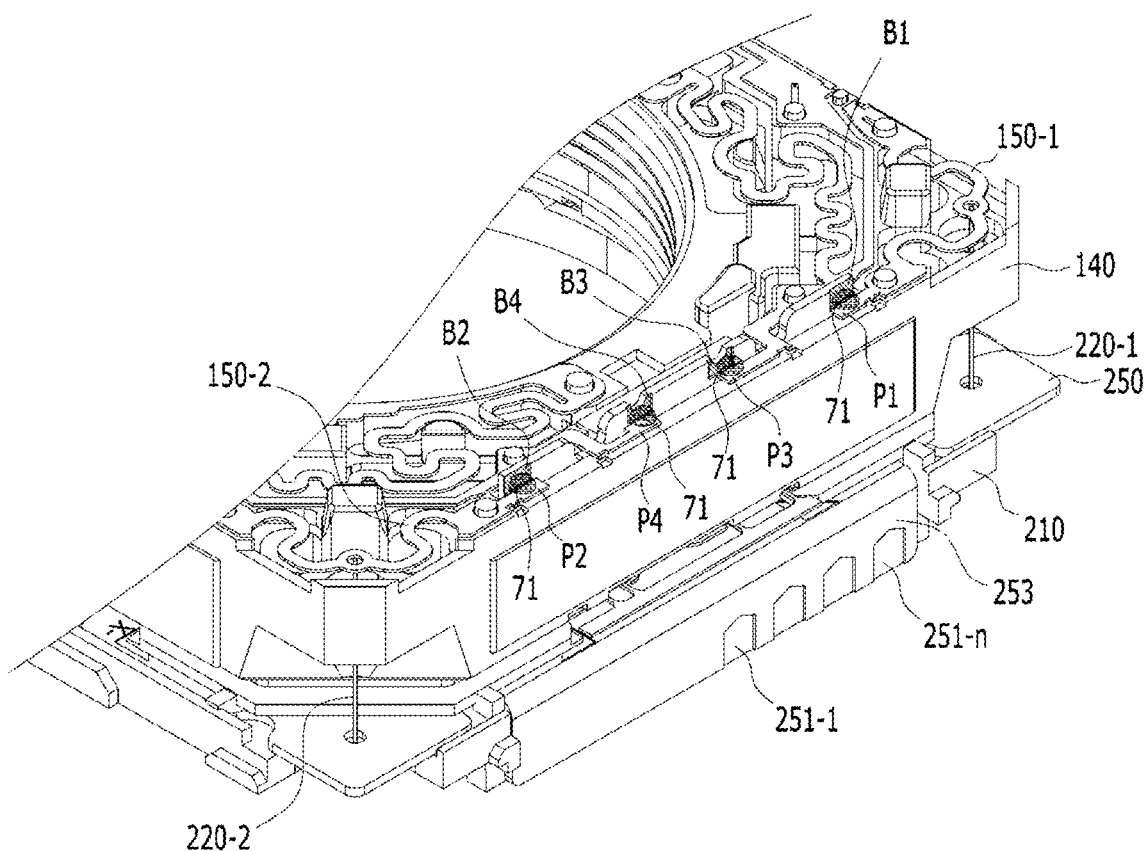
FIG. 11A is a view illustrating the coupling relationship between the first to fourth terminals of the circuit board and the upper elastic units.
Figure 11B:
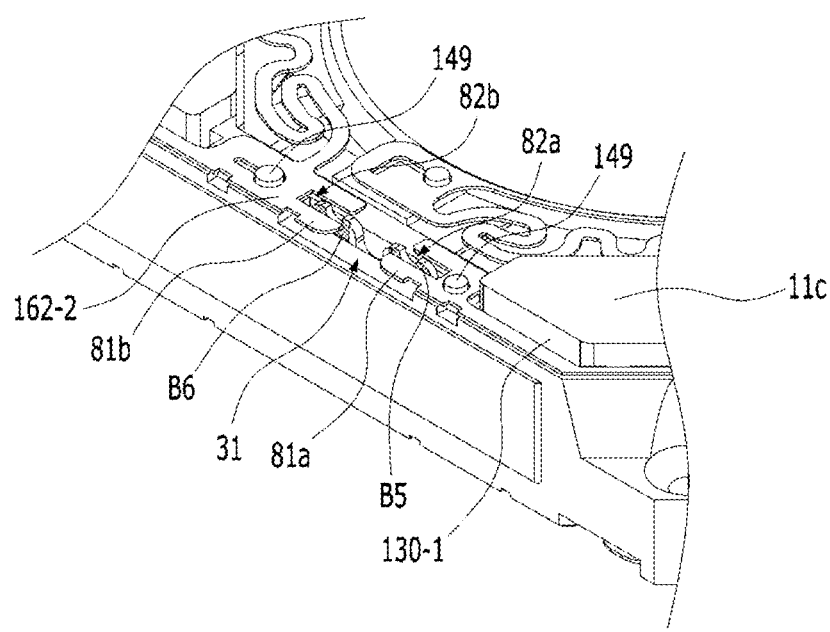
FIG. 11B is a bottom view of the fifth and sixth terminals of the circuit board and the lower elastic units.
Figure 12A:
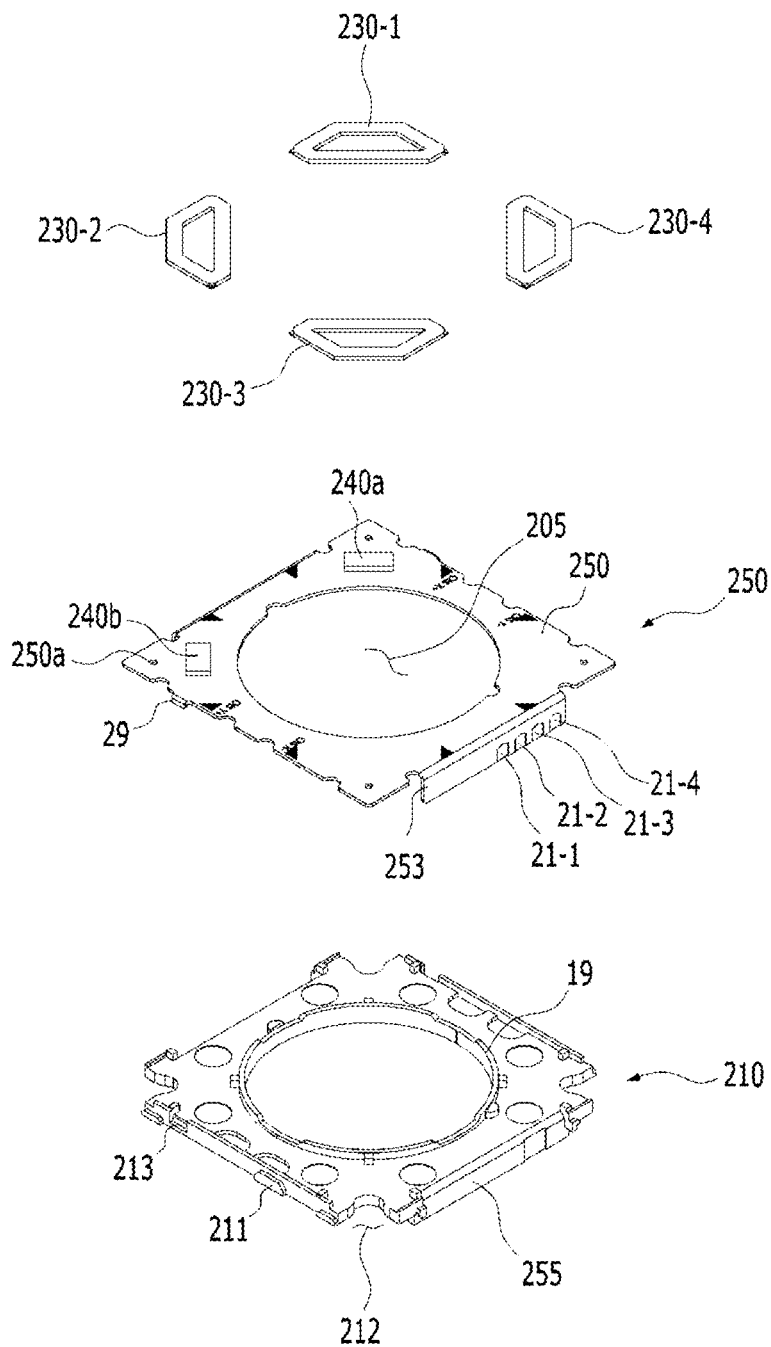
FIG. 12A is an exploded perspective view of the second coil, the circuit board, the base, and the second position sensor.
Figure 12B:
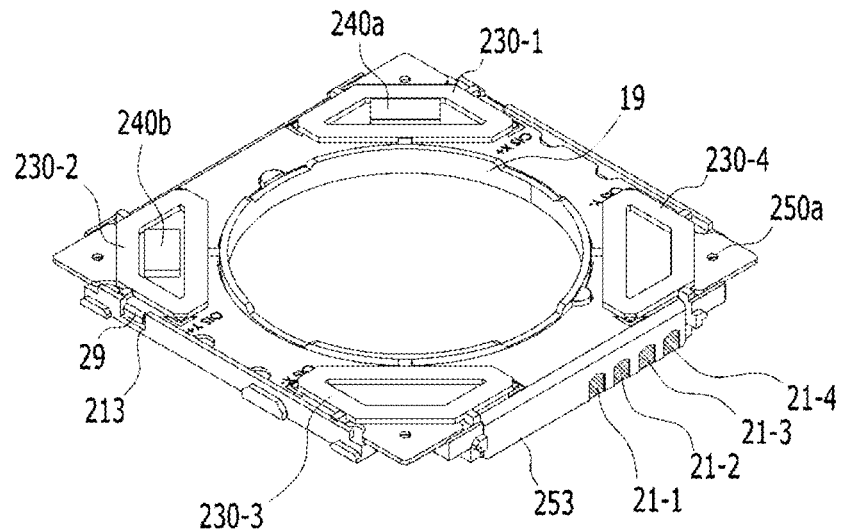
FIG. 12B is an assembled perspective view of the second coil, the circuit board, the base, and the second position sensor.
Figure 13:
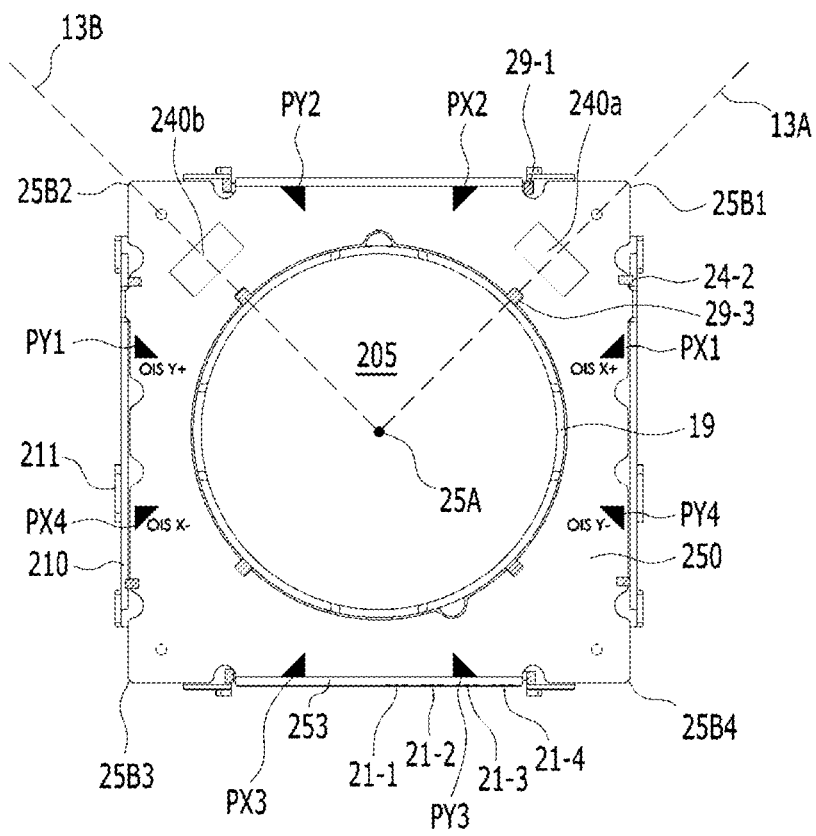
FIG. 13 is a plan view of the base, the circuit board, and the first and second sensors.
Figure 14:
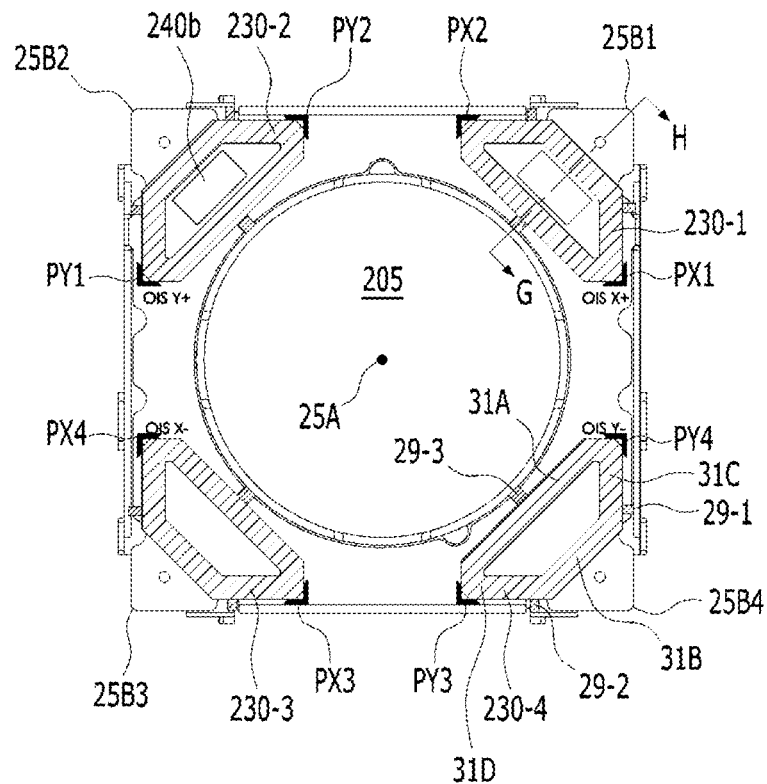
FIG. 14 is a plan view of the base, the circuit board, the first and second sensors, and the second coil 230.
Figure 15:
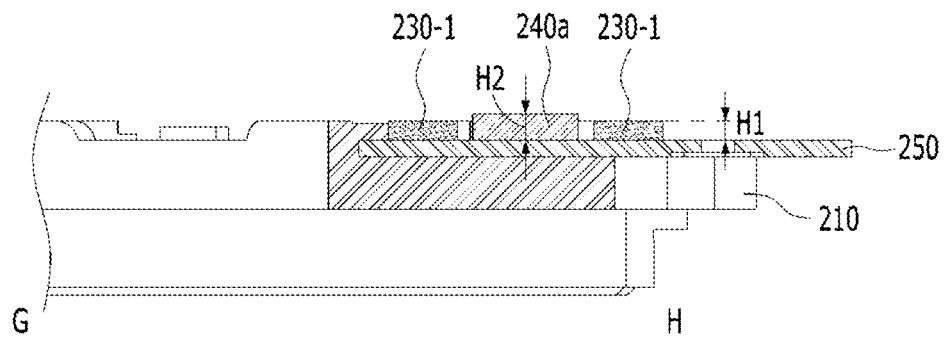
FIG. 15 is a cross-sectional view of the components shown in FIG. 15, taken along line G-H.

FIG. 9A is a view illustrating the upper elastic member 150 shown in FIG. 1. FIG. 9B is a view illustrating the lower elastic member 160 shown in FIG. 1. FIG. 10 is an assembled perspective view of the upper elastic member 150, the lower elastic member 160, the base 210, the support member 220, the second coil 230, the circuit board 250 and the second position sensor 240. FIG. 11A is a view illustrating the coupling relationship between the first to fourth terminals B1 to B4 of the circuit board 190 and the upper elastic units 150-1 to 150-4. FIG. 11B is a bottom view of the fifth and sixth terminals B5 and B6 of the circuit board 190 and the lower elastic units 160-1 and 160-2. FIG. 12A is an exploded perspective view of the second coil 230, the circuit board 250, the base 210, and the second position sensor 240. FIG. 12B is an assembled perspective view of the second coil 230, the circuit board 250, the base 210, and the second position sensor 240. FIG. 13 is a plan view of the base 210, the circuit board 250, and the first and second sensors 240a and 240b. FIG. 14 is a plan view of the base 210, the circuit board 250, the first and second sensors 240a and 240b, and the second coil 230. FIG. 15 is a cross-sectional view of the components shown in FIG. 15, taken along line G-H.

Referring to FIGS. 9A to 15, the upper elastic member 150 and the lower elastic member 160 may be coupled both to the bobbin 110 and to the housing 140 so as to support the bobbin 110.

The upper elastic member 150 may be coupled to the upper portion, the upper end or the upper surface of the bobbin 110, and the lower elastic member 160 may be coupled to the lower portion, the lower end or the lower surface of the bobbin 110.

The upper elastic member 150 and the lower elastic member 160 may elastically support the bobbin 110 with respect to the housing 140.

The support member 220 may support the housing 140 so as to allow the housing 140 to be moved in a direction perpendicular to the optical axis, and may conductively connect at least one of the upper and lower elastic members 150 and 160 to the circuit board 250.

Referring to FIG. 9A, the upper elastic member 150 may include a plurality of upper elastic units 150-1 to 150-4, which are conductively isolated from each other. Although FIG. 9A illustrates four upper elastic units, which are conductively isolated from each other, the number of upper elastic units is not limited thereto, and may be three or more.

The upper elastic member 150 may include the first to fourth upper elastic units 150-1 to 150-4, which are directly bonded and thus conductively connected to the first to fourth terminals B1 to B4 of the circuit board 190.

A portion of each of the plurality of upper elastic units may be disposed at the first side portion 141-1 of the housing 140, at which the circuit board 190 is disposed, and at least one upper elastic unit may be disposed at each of the remaining second to fourth side portions 141-2 to 141-4, other than the first side portion 141-1 of the housing 140.

Each of the first to fourth upper elastic units 150-1 to 150-4 may include the first outer frame 152 coupled to the housing 140.

At least one of the first to fourth upper elastic units 150-1 to 150-4 may further include the first inner frame 151, coupled to the bobbin 110, and the first frame connector 153, connecting the first inner frame 151 to the first outer frame 152.

In the embodiment shown in FIG. 9A, each of the first and second upper elastic units 150-1 and 150-2 may include only the first outer frame, without including the first inner frame and the first frame connector, and each of the first and second upper elastic units 150-1 and 150-2 may be spaced apart from the bobbin 110.

Although each of the third and fourth upper elastic units 150-3 and 150-4 may include the first inner frame 151, the first outer frame, and the first frame connector 153, the disclosure is not limited thereto.

For example, although each of the first inner frames 151 of the third and fourth upper elastic units 150-3 and 150-4 may be provided with a hole 151a coupled to the first coupler 113 of the bobbin 110, the disclosure is not limited thereto. For example, the hole 152a in the first inner frame 151 may have at least one slit 51a, through which an adhesive member enters, between the first coupler 113 and the hole 151a.

Each of the first outer frames 152 of the first to fourth upper elastic members 150-1 to 150-4 may have therein a hole 152a coupled to the first coupler 143 of the housing 140.

The first outer frame 151 of each of the first to fourth upper elastic units 150-1 to 150-4 may include a body portion coupled to the housing 140, and connecting terminals P1 to P4, which are connected to a corresponding one of the first to fourth terminals B1 to B4 of the circuit board 190. Here, the connecting terminals P1 to P4 may be alternatively referred to as "extension portions".

The first outer frame 151 of each of the first to fourth upper elastic units 150-1 to 150-4 may include a first coupler 520 coupled to the housing 140, a second coupler 510 coupled to a corresponding one of the support members 220-1 to 220-4, a connector 530 connecting the first coupler 520 to the second coupler 510, and the extension portions P1 to P4, which are connected to the second coupler 510 and extend to the first side portion 141-1 of the housing 140.

The body portion of each of the first to fourth upper elastic units 150-1 to 150-4 may include the first coupler 520. The body portion of each of the first to fourth upper elastic units 150-1 to 150-4 may further include at least one of the second coupler 510 and the connector 530.

For example, using solder or a conductive adhesive member, one end of the first support member 220-1 may be coupled to the second coupler 510 of the first upper elastic unit 150-1, and one end of the second support member 220-2 may be coupled to the second coupler 510 of the second upper elastic unit 150-1. Furthermore, one end of the third support member 220-3 may be coupled to the second coupler 510 of the third upper elastic unit 150-3, and one end of the fourth support member 220-4 may be coupled to the second coupler 510 of the fourth upper elastic unit 150-4.

The second coupler 510 may have a hole 52 through which a corresponding one of the support members 220-1 to 220-4 extends. The one end of the corresponding one of the support members 220-1 to 220-4, which has passed through the hole 52, may be directly coupled to the second coupler 510 via a conductive adhesive member or solder 910 (see FIG. 10) and the second coupler 510 and the support members 220-1 to 220-4 may be conductively connected to each other.

For example, the second coupler 510, which is a region in which the solder 910 is disposed for coupling to the support members 220-1 to 220-4, may include the hole 52 and a region near the hole 52.

The first coupler 520 may include at least one coupling region (for example, 5a or 5b) coupled to the housing (for example, the corner portions 142-1 to 142-4).

For example, the coupling region (for example, 5a or 5b) of the first coupler 520 may have at least one hole 152a coupled to the first coupler 143 of the housing 140.

For example, each of the coupling regions 5a and 5b may have therein at least one hole, and each of the corner portions 142-1 to 142-4 of the housing 140 may be correspondingly provided with at least one first coupler.

For example, in order to support the housing 140 in an equilibrium state, although the coupling regions 5a and 5b of the first coupler 520 of the first to fourth upper elastic units 150-1 to 150-4 may be symmetrically disposed with respect to reference lines (for example, 501 and 502), the disclosure is not limited thereto.

Furthermore, although the first couplers 143 of the housing 140 may be symmetrically disposed with respect to the reference lines (for example, 501 and 502) and may be provided such that two are located on each side of each of the reference lines, the number thereof is not limited thereto.

Each of the reference lines 501 and 502 may be a line that extends between the central point 101 and one of the corners of the corner portions 142-1 to 142-4 of the housing 140. For example, each of the reference lines 501 and 502 may be a line that extends through the central point 101 and two corners, which face each other in a diagonal direction of the housing 140, among the corners of the corner portions 142-1 to 142-4 of the housing 140.

Here, the central point 102 may be the center of the housing 140, the center of the bobbin 110, or the center of the upper elastic member 150. For example, the corner of each of the corner portions of the housing 140 may be a corner that is aligned with or corresponds to the center of a corresponding one of the corner portions of the housing 140.

In the embodiment shown in FIG. 9A, although each of the coupling regions 5a and 5b of the first couplers 520 is embodied as having the hole 152a therein, the disclosure is not limited thereto. In another embodiment, each of the coupling regions may be embodied as having various shapes, for example, a groove shape, suitable for coupling to the housing 140.

For example, the hole 152a in the first coupler 520 may have at least one slit 52a through which an adhesive member infiltrates between the first coupler 143 of the housing 140 and the hole 152a.

The connector 530 may connect the second coupler 510 to the first coupler 520.

For example, the connector 530 may connect the second coupler 510 to the coupling regions 5a and 5b of the first coupler 520.

For example, the connector 530 may include a first connector 530a, connecting the first coupling region 5a of the first coupler 520 of each of the first to fourth upper elastic units 150-1 to 150-4 to the second coupler 510, and a second connector 530b, connecting the second coupling region 5b of the first coupler 520 to the second coupler 510.

For example, although the first outer frame 151 may include a connecting region directly connecting the first coupling region 5a to the second coupling region 5b, the disclosure is not limited thereto.

Although each of the first and second connectors 530a and 530b may include a bent portion, which is bent at least once, or a curved portion, which is curved at least once, the disclosure is not limited thereto. In another embodiment, each of the first and second connectors 530a and 530b may be linear.

The width of the connector 530 may be less than the width of the first coupler 520. Furthermore, the width of the connector 530 may be less than the width (or the diameter) of the first coupler. In another embodiment, the width of the connector 530 may be equal to the width of the first coupler 520, and may be equal to the width (or the diameter) of the first coupler.

For example, the first couplers 520 may be in contact with the upper surfaces of the corner portions 142-1 to 142-4 of the housing 140, and may be supported thereby. For example, the connector 530 may not be supported by the upper surface of the housing 140, and may be spaced apart from the housing 140. Furthermore, in order to inhibit oscillation caused by vibration, the space between the connector 530 and the housing 140 may be filled with a damper (not shown).

The width of each of the first and second connectors 530a and 530b may be less than the width of the first coupler 520, thereby allowing the connector 530 to be easily moved in the first direction. Consequently, it is possible to distribute the stress applied to the upper elastic units 150-1 to 150-4 and the stress applied to the support members 220-1 to 220-4.

Each of the first and second extension portions P1 and P2 of the first outer frames of the first and second upper elastic units 150-1 and 150-2 may extend toward a corresponding one of the first and second terminals B1 and B2 of the circuit board 190, which are positioned at the first side portion 141-1 of the housing 140, from the first coupler 520 (for example, the first coupling region 5a).

The first coupler 520 of the third upper elastic unit 150-3 may further include at least one coupling region 6a, 6b connected to at least one of the fourth side portion 141-4 and the second corner portion 142-2 of the housing 140.

The first coupler 520 of the fourth upper elastic unit 150-4 may further include at least one coupling region 6c, 6d connected to at least one of the second side portion 141-2 and the first corner portion 142-1 of the housing 140.

Each of the third and fourth extension portions P3 and P4 of the first outer frames of the third and fourth upper elastic units 150-3 and 150-4 may extend toward a corresponding one of the third and fourth terminals B3 and B4 of the circuit board 190, which are positioned at the first side portion 141-1 of the housing 140, from the first coupler 520 (for example, the coupling region 6b, 6d).

One end of each of the first to fourth extension portions P1 to P4 may be coupled to a corresponding one of the first to fourth terminals B1 to B4 of the circuit board 190 via solder or a conductive adhesive member.

Each of the first and second extension portions P1 and P2 may have a linear shape.

In order to facilitate coupling to a corresponding one of the third and fourth terminals B3 and B4 of the circuit board 190, each of the third and fourth extension portions P3 and P4 may include a bent or curved portion.

The first outer frame of the third upper elastic unit 150-3 may further include a first extension frame 154-1, which is connected both to the first coupler 520 and to the extension portion P3 and is positioned at the fourth side portion 141-4 and the fourth corner portion 142-4 of the housing 140.

In order to increase the coupling force between the first extension frame 154-1 and the housing 140 to thus inhibit the third upper elastic unit 150-3 from being lifted, the first extension frame 154-1 may include at least one coupling region 6a, 6b coupled to the housing 140, and each of the coupling regions 6a and 6b may have a hole for coupling to the first coupler 143.

The first outer frame of the fourth upper elastic unit 150-4 may further include a second extension frame 154-2, which is connected both to the first coupler 520 and to the extension portion P4 and is positioned at the second side portion 141-2 and the first corner portion 142-1 of the housing 140.

In order to increase the coupling force between the second extension frame 154-2 and the housing 140 and thus to inhibit the fourth upper elastic unit 150-4 from being lifted, the second extension frame 154-2 may include at least one coupling region 6c, 6d coupled to the housing 140, and each of the coupling regions 6c and 6d may have a hole for coupling to the first coupler 143 of the housing 140.

Although each of the third upper elastic unit 150-3 and the fourth upper elastic unit 150-4 includes two first frame connectors in FIG. 9A, the disclosure is not limited thereto. The number of first frame connectors may be one, or three or more.

As described above, each of the first to fourth upper elastic units may include the extension portions P1 to P4 disposed at the first side portion 141-1 of the housing 140. By virtue of the extension portions P1 to P4, the upper elastic units 150-1 to 150-4 may be easily coupled to the first to fourth terminals B1 to B4 provided at the body part S1 of the circuit board 190.

Because the four terminals B1 to B4 provided at the body part S1 of the circuit board 190 disposed at the first side portion 141-1 of the housing 140 are conductively and directly connected to the first to fourth upper elastic units 150-1 to 150-4, a portion of the first outer frame 151 of each of the first to fourth upper elastic units 150-1 to 150-4 may be disposed at the first side portion 141-1 of the housing 140.

Each of the upper elastic units 150-1 to 150-4 may be disposed at a corresponding one of the corner portions 142-1 to 142-4 of the housing 140, and may include the extension portion P1 to P4 extending to the first side portion 141-1 of the housing 140.

Each of the extension portions P1 to P4 of each of the upper elastic units 150-1 to 150-4 may be directly coupled to a corresponding one of the four terminals B1 to B4 provided at the body part S1 of the circuit board 190 via a conductive adhesive member 71 such as solder.

The first outer frame 151 of the first upper elastic unit 150-1 may be disposed at the first corner portion 142-1 of the housing 140, and the first outer frame 151 of the second upper elastic unit 150-2 may be disposed at the second corner portion 142-2 of the housing 140. The first outer frame 151 of the third upper elastic unit 150-3 may be disposed at the third corner portion 142-3 of the housing 140, and the first outer frame 151 of the fourth upper elastic unit 150-4 may be disposed at the fourth corner portion 142-4 of the housing 140.

A portion of the third upper elastic unit 150-3 may be disposed in the first groove 90a in the first circuit board 190, and the end of the portion of the third upper elastic unit 150-3 may be coupled to the third terminal B3 of the circuit board 190.

A portion of the fourth upper elastic unit 150-4 may be disposed in the second groove 90b in the first circuit board 190, and the end of the portion of the fourth upper elastic unit 150-4 may be coupled to the fourth terminal B4 of the circuit board 190.

The third extension portion P3 of the third upper elastic unit 150-3 may extend toward the third terminal B3 of the circuit board 190 through the first groove 90a in the circuit board 190, and may be bent at least twice.

The fourth extension portion P4 of the fourth upper elastic unit 150-4 may extend toward the fourth terminal B4 of the circuit board 190 through the second groove 90b in the circuit board 190, and may be bent at least twice.

The third extension portion (or "third connecting terminal") P3 of the third upper elastic unit 150-3 may include at least two bent regions 2a and 2b.

For example, the third extension portion P3 of the third upper elastic unit 150-3 may include a first portion 1a extending from the first coupler 520 (for example, the coupling region 6b) of the third upper elastic unit 150-3, the first bent region (or "first bent portion") 2a bent at the first portion 1a, a second portion 1b extending from the first bent region 2a, the second bent region (or "second bent portion") 2b bent at the second portion 1b, and a third portion 1c extending toward the third terminal B3 from the second bent region 2b.

For example, the second portion 1b of the third extension portion (or the third connecting terminal) P3 may be bent at the first portion 1a, and the third portion 1c may be bent at the second portion 1b.

The second portion 1b of the third extension portion P3 may be disposed between the first bent region 2a and the second bent region 2b, and may connect the first and second bent regions 2a and 2b to each other.

For example, each of the first portion 1a and the third portion 1c of the third extension portion P3 may extend toward the first corner portion 141-1 from the second corner portion 142-2 of the housing 140. For example, the second portion 1b of the third extension portion P3 may extend toward the outer surface from the inner surface of the housing 140.

A portion (for example, the second portion 1b) of the third extension portion P3 of the third upper elastic unit 150-3 may be positioned in the first groove 90a in the circuit board 190, or may extend through the first groove 90a.

The fourth extension portion (or "fourth connecting terminal") P4 of the fourth upper elastic unit 150-4 may include at least two bent regions 2c and 2d.

For example, the fourth extension portion P4 of the fourth upper elastic unit 150-4 may include a fourth portion 1d extending from a first coupler 520 (for example, the coupling region 6d) of the fourth upper elastic unit 150-4, the third bent region (or "third bent portion") 2c bent at the fourth portion 1d, a fifth portion 1e extending from the third bent region 2c, the fourth bent region (or "fourth bent portion") 2d bent at the fifth portion 1e, and a sixth portion 1f extending toward the fourth terminal B4 from the fourth bent region 2d.

For example, the fifth portion 1e of the fourth extension portion (or the fourth connecting terminal) P4 may be bent at the fourth portion 1d, and the sixth portion 1f may be bent at the fifth portion 1e.

The fifth portion 1e of the fourth extension portion P4 may be disposed between the third bent region 2c and the fourth bent region 2d so as to connect the third and fourth bent regions 2c and 2d to each other.

For example, each of the fourth portion 1d and the sixth portion 1f of the fourth extension portion P4 may extend toward the second corner portion 141-2 from the first corner portion 142-1 of the housing 140. For example, the fifth portion 1e of the fourth extension portion P4 may extend toward the outer surface from the inner surface of the housing 140.

A portion (for example, the fifth portion 1e) of the fourth extension portion P4 of the fourth elastic unit may be positioned in the second groove 90b in the circuit board 190, or may extend through the second groove 90b.

Referring to FIG. 9B, the lower elastic member 160 may include a plurality of lower elastic units 160-1 and 160-2.

For example, each of the first and second lower elastic units 160-1 and 160-2 may include the second inner frame 161 coupled or fixed to the lower portion, the lower surface or the lower end of the bobbin 110, the second outer frames 162-1 to 162-3 coupled or fixed to the lower portion, the lower surface or the lower end of the housing 140, and the second frame connector 163 connecting the second inner frame 161 to the second outer frames 162-1 to 162-3.

The second inner frame 161 may have therein a hole 161a for coupling to the second coupler 117 of the bobbin 110, and the second outer frames 162-1 to 162-3 may have therein holes 162a for coupling to the second coupler 149 of the housing 140.

For example, although each of the first and second lower elastic units 160-1 and 160-2 may include three second outer frames 162-1 to 162-3 and two second frame connectors 163, which are coupled to the housing 140, the disclosure is not limited thereto. In another embodiment, each of the first and second lower elastic units may include at least one second outer frame and at least one second frame connector.

Each of the first and second lower elastic units 160-1 and 160-2 may include connecting frames 164-1 and 164-2, which connect the second outer frames 162-1 and 162-3 to each other.

Although the width of each of the connecting frames 164-1 and 164-2 may be less than the widths of the second outer frames 162-1 to 162-3, the disclosure is not limited thereto.

In order to avoid spatial interference with the second coil 230 and the first magnet 130, the connecting frames 164-1 and 164-2 may be positioned outside the coil units 230-1 to 230-4 and the first magnets 130-1 to 130-4. Here, the outside of the coil units 230-1 to 230-4 and the first magnets 130-1 to 130-4 may be the side opposite the center of the bobbin 110 or the housing 140 with respect to the coil units 230-1 to 230-4 and the first magnets 130-1 to 130-4.

For example, although the connecting frames 164-1 and 164-2 may be positioned so as not to overlap the coil units 230-1 to 230-4 and/or the first magnets 130-1 to 130-4 in the optical-axis direction, the disclosure is not limited thereto. In another embodiment, at least portions of the connecting frames 164-1 and 164-2 may be aligned with or overlap the coil units 230-1 to 230-4 and/or the first magnets 130-1 to 130-4 in the optical-axis direction.

Each of the upper elastic units 150-1 to 150-4 and the upper elastic units 160-1 and 160-2 may be embodied as a leaf spring. However, the upper elastic unit is not limited thereto, and may be embodied as a coil spring or the like. The above-mentioned elastic unit (for example, 150 or 160) may be alternatively referred to as a "spring", and the outer frame (for example, 152 or 162) may be alternatively referred to as an "outer portion". Furthermore, the inner frame (for example, 151 or 161) may be alternatively referred to as an inner portion, and the support member (for example, 220) may be alternatively referred to as a wire.

Next, the support members 220-1 to 220-4 will be described.

The support members 220-1 to 220-4 may be disposed at the corner portions 142-1 to 142-4 of the housing 140 so as to connect the upper elastic units 150-1 to 150-4 to the circuit board 250.

Each of the support members 220-1 to 220-4 may be coupled to a corresponding one of first to fourth upper elastic units 150-1 to 150-4, and may conductively connect a corresponding one of the first to fourth upper elastic units 150-1 to 150-4 to a corresponding one of the terminals 21-1 to 21-$n$ (n=4) of the circuit board 250.

The support members 220-1 to 220-4 may be spaced apart from the housing 140, rather than being fixed to the housing 140. One end of each of the support members 220-1 to 220-4 may be directly connected or coupled to the second coupler 510, and the other end of each of the support members 220-1 to 220-4 may be directly connected or coupled to the circuit board 250.

For example, although the support members 220-1 to 220-4 may extend through the holes 147 formed in the corner portions 142-1 to 142-4 of the housing 140, the disclosure is not limited thereto. In another embodiment, the support members may be disposed adjacent to the boundary line between the side portions 141-1 to 141-4 and the corner portions 142-1 to 142-4 of the housing 140, and may not extend through the corner portions 142-1 to 142-4 of the housing 140.

The first coil 120 may be directly connected or coupled to a corresponding one of the second inner frames of the first and second lower elastic units 160-1 and 160-2. For example, the second inner frame 161 of the first lower elastic unit 160-1 may include a first bonding portion 43a coupled to one end of the first coil 120, and the second inner frame 161 of the second lower elastic unit 160-2 may include a second bonding portion 43b coupled to the other end of the first coil 120. Each of the first and second bonding portions 43a and 43b may have a groove 8a for guiding the coil 120.

The first terminal B1 of the circuit board 190 may be conductively connected to the first support member 220-1 through the first upper elastic unit 150-1, and the second terminal B2 of the circuit board 190 may be conductively connected to the second support member 220-2 through the second upper elastic unit 150-2. The third terminal B3 of the circuit board 190 may be conductively connected to the third support member 220-3 through the fourth upper elastic unit 150-4, and the fourth terminal B4 of the circuit board 190 may be conductively connected to the fourth support member 220-4 through the third upper elastic unit 150-3.

Each of the first to fourth upper elastic units 150-1 to 150-4 may be coupled to a corresponding one of the first to fourth support members 220-1 to 220-4, and each of the first to fourth support members 220-1 to 220-4 may be conductively connected to a corresponding one of the first to fourth terminals 21-1 to 21-$n$ (n=4) of the circuit board 250.

Each of the first and second lower elastic units 160-1 and 160-2 may be conductively connected to the first coil 120, and a corresponding one of the fifth and sixth terminals B5 and B6 of the circuit board 190 may be connected or coupled to the second outer frame 162-1.

For example, the power signals VDD and GND may be supplied to the first and second support members 220-1 and 220-2 through the first and second terminals 21-1 and 21-2 of the circuit board 250.

The power signals VDD and GND may be supplied to the first and second terminals B1 and B2 of the circuit board 190 through the first and second upper elastic units 150-1 and 150-2. The first position sensor 170 may receive the power signals VDD and GND through the first and second terminals B1 and B2 of the circuit board 190.

For example, the first terminal B1 of the circuit board 190 may be one of a VDD terminal and a GND terminal, and the second terminal B2 of the circuit board 190 may be the other of the VDD terminal and the GND terminal.

Furthermore, the clock signal SCL and the data signal SDA may be supplied to the third and fourth support members 220-3 and 220-4 through the third and fourth terminals 21-3 and 21-4 of the circuit board 250, and the clock signal SCL and the data signal SDA may be supplied to the third and fourth terminals B3 and B4 through the third and fourth support members 220-3 and 220-4 and the third and fourth upper elastic units 150-3 and 150-4. The first position sensor 170 may receive the clock signal SCL and the data signal SDA through the third and fourth terminals B3 and B4 of the circuit board 190.

For example, the power signal VDD may be supplied to the first position sensor 170 through the first terminal 21-1 of the circuit board 250, the first support member 220-1, the first upper elastic unit 150-1, and the first terminal B1 of the circuit board 190. The power signal GND may be supplied to the first position sensor 170 through the second terminal 21-2 of the circuit board 250, the second support member 220-2, the second upper elastic unit 150-2, and the second terminal B2 of the circuit board 190.

For example, the clock signal SCL may be supplied to the first position sensor 170 through the third terminal 21-3 of the circuit board 250, the third support member 220-3, the third upper elastic unit 150-3, and the third terminal B3 of the circuit board 190. The data signal SDA may be supplied to the first position sensor 170 through the fourth terminal 21-4 of the circuit board 250, the fourth support member 220-4, the fourth upper elastic unit 150-4, and the fourth terminal B4 of the circuit board 190.

Each of the fifth and sixth terminals B5 and B6 of the circuit board 190 may be connected or coupled to the second outer frame 162-1 of a corresponding one of the first and second lower elastic units 160-1 and 160-2.

The second outer frame 162-1 of the first lower elastic unit 160-1 may include a first bonding portion 81a, to which the fifth terminal B5 of the circuit board 190 is coupled via solder or a conductive adhesive member. The second outer frame 162-1 of the second lower elastic unit 160-2 may include a second bonding portion 81b, to which the sixth terminal B6 is coupled via solder or a conductive adhesive member.

For example, the second outer frame 162-1 of the first lower elastic unit 160-1 may include a first hole (or a first groove) 82a, in which the fifth terminal B5 of the circuit board 190 is inserted or disposed, and the second outer frame 162-1 of the second lower elastic unit 160-2 may include a second hole (or a second groove) 82b, in which the sixth terminal B6 of the circuit board 190 is inserted or disposed.

For example, although each of the first and second holes 82a and 82b may be formed through the second outer frame 162-1 and may have an opening, which is open at one side of the second outer frame 162-1, the disclosure is not limited thereto. In another embodiment, each of the first and second holes 82a and 82 may not have the opening in one side of the second outer frame 162-1.

Since the fifth terminal B5 (or the sixth terminal B6) is coupled to the first bonding portion 81a (or the sixth bonding portion 81b), in which the first groove 82a (or the second groove 82b) is formed, in the state in which the fifth terminal B5 (or the sixth terminal B6) of the circuit board 190 is inserted into the first groove 82a (or the second groove 82b) in the second outer frame 162-1 of the first lower elastic unit 160-1, it is possible to increase the coupling area and thus to increase the coupling force and improve solderability between the terminal and the bonding portion.

Referring to FIG. 11B, one end (for example, the lower end or the lower surface) of each of the fifth and sixth terminals B5 and B6 may be positioned lowered than the lower end or the lower surface of the second outer frame 162-1 of the first and second lower elastic units 160-1 and 160-2. Because FIG. 11B is a bottom view, the lower surface of each of the fifth and sixth terminals B5 and B6 may be shown as being positioned lower than the lower end or the lower surface of the second outer frame 162-1. The reason for this is to improve solderability between one end of each of the fifth and sixth terminals B5 and B6 and the first and second bonding portions 81a and 81b of the first and second lower elastic units 160-1 and 160-2.

Referring to FIG. 11B, the housing 140 may have a groove 31, which is depressed from the lower surface of the first side portion 141-1. For example, the bottom surface of the groove 31 in the housing 140 may have a height difference with respect to the lower surface of the housing 140 in the optical-axis direction. For example, the bottom surface of the groove 31 in the housing 140 may be positioned higher than the lower surface of the housing 140.

The groove 31 in the housing 140 may overlap the first and second bonding portions 81a and 81b of the first and second lower elastic units 160-1 and 160-2 in the optical-axis direction.

Furthermore, the groove 31 in the housing 140 may overlap the holes 82a and 82b in the second outer frames 162-1 of the first and second lower elastic units 160-1 and 160-2 in the optical-axis direction.

By virtue of the groove 31 in the housing 140, it is possible to increase the surface area of the fifth and sixth terminals B5 and B6 that is exposed through the housing, and it is possible to ensure a space in which to seat solder or a conductive adhesive member. Consequently, it is possible to improve solderability and to reduce the distance that the solder projects downwards from the lower surface of the second outer frame 162-1, whereby it is possible to suppress or inhibit spatial interference with the second coil 230, the circuit board 250 or the base 210 disposed under the lower elastic unit.

Although the lower surface 11c of the first magnet 130 disposed in the seating portion 141a in the housing 140 may be positioned lower than the lower surface of the housing 140 and the lower surfaces of the second outer frames 162-1 to 162-3 of the first and second lower elastic units 160-1 and 160-2, the disclosure is not limited thereto. In another embodiment, the lower surface 11c of the first magnet 130 may be positioned higher than the lower surface of the housing 140 in order to reduce spatial interference with the second position sensor 240. In a further embodiment, the lower surface 11c of the first magnet 130 may have a height that is higher than or equal to the height of the lower surface of the housing 140.

In order to space the first magnet 130 apart from the second coil 230 and the circuit board 250, the other end of the support member 220 may be coupled to the circuit board 250 (or the circuit member 231) at a level lower than the lower surface 11c of the first magnet 130.

Each of the support members 220 may be embodied as a member that is conductive and offers elastic support, for example, a suspension wire, a leaf spring, or a coil spring. In another embodiment, the support members 220 may be integrally formed with the upper elastic member 150.

Next, the base 210, the circuit board 250, and the second coil 230 will be described.

Referring to FIG. 12A, the base 210 may have a bore corresponding to the bore in the bobbin 110 and/or the bore or hollow 205 in the housing 140, and may have a shape corresponding to or coinciding with that of the cover member 300, for example, a square shape. For example, the bore in the base 210 may be a through hole, which is formed through the base 210 in the optical-axis direction.

The base 210 may include a step 211, to which an adhesive is applied when the cover member 300 is secured to the base 210 via adhesion. For example, the step 211 may be formed on the outer surface of the base 210. Here, the step 211 may guide the side plate of the cover member 300, which is coupled to the upper side of the base, and the lower end of the side plate of the cover member 300 may be in contact with the step 211. The step 211 of the base 210 may be bonded or fixed to the lower end of the side plate of the cover member 300 via an adhesive or the like.

The region of the base 210 that faces the terminal member 253 at which terminals 21-1 to 21-n of the circuit board 250 are provided, may be provided with a support 255. The support 255 may support the terminal member 253 of the circuit board 250 at which the terminals 21-1 to 21-n of the circuit board 250 are formed.

The base 210 may have recesses 212 in corner regions thereof corresponding to the corners of the cover member 300. When the corners of the cover member 300 have projections, the projections of the cover member 300 may be coupled to the recesses 212 in the base 210.

The lower surface of the base 210 may be provided with a seating portion (not shown) to which the filter 610 of the camera module 200 is mounted.

The upper surface of the base 210 around the bore may be provided with a projection 19, which is coupled to the bore in the circuit board 250 and the bore in the circuit member 231.

The base 210 may include guide portions 29-1 to 29-3, which are configured to guide disposition of the coil units 230-1 to 230-4 when the coil units 230-1 to 230-4 are disposed on the upper surface of the circuit board 250.

For example, the base 210 may include the guide portions 29-1 and 29-2, which project from a region of the upper surface of the base 210 adjacent to the corner or the recess 212 of the base 210.

For example, the first guide portion 29-1 may be formed adjacent to one side of the base 210, which is adjacent to the corner or the recess 212 in the base 210, and the second guide portion 29-2 may be formed adjacent to the other side of the base 210, which is adjacent to the corner or the recess 212 in the base 210. Each of the first guide portion 29-1 and the second guide portion 29-2 may project in the optical-axis direction or upwards from the upper surface of the base 210.

The base 210 may include the third guide portion 29-3 formed at the projection 19 of the base 210.

The third guide portion 29-3 may project in the optical-axis direction or upwards from the upper surface of the base 210, and may project toward the corner or the recess 212 in the base 210 from the outer circumferential surface or the outer surface of the projection 19.

For example, although lines that connect the first to third guide portions 29-1 to 29-3 to one another, may define a triangular shape, the disclosure is not limited thereto.

Referring to FIG. 14, each of the coil units 230-1 to 230-4 may include a first linear portion 31A and a second linear portion 31b, which face each other, a first connecting portion 31c connecting a first end of the first linear portion 31A to a first end of the second linear portion 31b, and a second connecting portion 31D connecting the second end of the first linear portion 31A to the second end of the second linear portion 31B.

The first linear portion 31A may be positioned closer to the bore 205 in the circuit board 250 or the projection 19 of the base 210 than is the second linear portion 31B, and the crosswise length of the first linear portion 31A may be greater than the crosswise length of the second linear portion 31B. Here, the crosswise direction may be the longitudinal direction of the first and second linear portions 31A and 31B, which is perpendicular to the optical axis.

Each of the first connecting portion 31C and the second connecting portion 31D may include at least one bent portion.

The first guide portion 29-1 may be in contact with the first connecting portion 31C so as to guide the first connecting portion 31C, the second guide portion 29-2 may be in contact with the second connecting portion 31D so as to guide the second connecting portion 31D, and the third guide portion 29-3 may be in contact with the first linear portion 31A so as to guide the first linear portion 31A.

For example, the first guide portion 29-1 may be in contact with the outer circumferential surface or the outer surface of the first connecting portion 31C, the second guide portion 29-2 may be in contact with the outer circumferential surface or the outer surface of the second connecting portion 31D, and the third guide portion 29-3 may be in contact with the outer circumferential surface or the outer surface of the first linear portion 31A.

The second coil 230 and the first and second sensors 240a and 240b may be disposed at the upper portion of the circuit board 250. For example, the second coil 230 and the first and second sensors 240a and 240b may be disposed, mounted or coupled to the upper surface of the circuit board 250.

The second coil 230 may include the first sensor 240a and the second sensor 240b.

The first and second sensors 240a and 240b may detect displacement of the OIS operation unit, for example, shift or tilt of the OIS operation unit in a direction perpendicular to the optical axis. Here, the OIS operation unit may include the AF operation unit and the components mounted on the housing 140.

The first position sensor 170 may be alternatively referred to as an "AF position sensor", and the second position sensor 240 may be alternatively referred to as an "OIS position sensor".

For example, the OIS operation unit may include the AF operation unit and the housing 140. In some embodiments, the OIS operation unit may further include the first magnet 130. For example, the AF operation unit may include the bobbin 110 and components that are mounted on the bobbin 110 and are moved therewith. For example, the AF operation unit may include the bobbin 110, as well as the lens (not shown), the first coil 120, the second magnet 180, and the third magnet 185, which are mounted on the bobbin 110.

The circuit board 250 may be disposed on the upper surface of the base 210, and may have therein the bore corresponding to the bore in the bobbin 110, the bore in the housing 140 and/or the bore in the base 210. The bore in the circuit board 250 may be a through hole.

The circuit board 250 may have a shape coinciding with or corresponding to the upper surface of the base 210, for example, a quadrilateral shape.

The circuit board 250 may include at least one terminal member 253, which is bent from the upper surface of the circuit board and which is provided with a plurality of terminals 21-1 to 21-$n$ (n being a natural number) or pins to which electrical signals are supplied from the outside.

The second coil 230 may be disposed under the housing 140 and the bobbin 110.

The second coil 230 may be disposed at the upper portion of the circuit board 250 so as to correspond to, face or overlap the first magnets 130-1 to 130-4 disposed at the housing 140, in the optical-axis direction.

For example, the second coil 230 may include a plurality of coil units 230-1 to 230-4.

Each of the plurality of coil units 230-1 to 230-4 of the second coil 230 may face or overlap a corresponding one of the first magnets 130-1 to 130-4 disposed at the corner portions 142-1 to 142-4 of the housing 140 in the optical-axis direction.

Although each of the coil units may have the form of a coil block composed of an FP (fine pattern) coil, the disclosure is not limited thereto.

In another embodiment, the second coil may include the circuit member and a plurality of coil units formed at the circuit member. Here, the circuit member 231 may also be referred to as a "board", "circuit board", or "coil board". Here, the first and second sensors 240a and 240b may be disposed or mounted on the upper surface of the circuit member, and the circuit member may be conductively connected to the circuit board 250. In other words, the first and second sensors may be conductively connected to the terminals of the circuit board 250 via the circuit member.

In a further embodiment, the first and second sensors 240a and 240b may be disposed between the circuit board 250 and the base 210. For example, the first and second sensors 240a and 240b may be disposed or mounted on the lower surface of the circuit board 250.

In yet a further embodiment, the coil units may be directly formed in the circuit board 250.

The four coil units 230-1 to 230-4 may be disposed or formed at the corners or the corner regions of the polygonal (for example, rectangular) circuit board 250.

For example, although the second coil 230 may include two coil units 230-1 and 230-3 for movement in the second direction (for example, the x-axis direction) and two coil units 230-2 and 230-4 for movement in the third direction (for example, the y-axis direction), the disclosure is not limited thereto.

For example, the coil units 230-1 and 230-3 for movement in the second direction may be disposed at two corner regions of the circuit board 250, which face each other in the first diagonal direction of the circuit board 250, and the coil units 230-2 and 230-4 for movement in the third direction may be disposed at the other two corner regions of the circuit board 250, which face each other in the second diagonal direction of the circuit board 250. The first diagonal direction may be a direction perpendicular to the second diagonal direction.

In another embodiment, the second coil 230 may include only one coil unit for movement in the second direction and only one coil unit for movement in the third direction, or may include four or more coil units.

The electromagnetic force resulting from the interaction between the coil units 230-1 and 230-3 for movement in the second direction and the first magnets 130-1 and 130-3, which correspond to the coil units 230-1 and 230-3 in the optical-axis direction, may be exerted in the same direction. Furthermore, the electromagnetic force resulting from the interaction between the coil units 230-2 and 230-4 for movement in the third direction and the first magnets 130-2 and 130-4, which correspond to the coil units 230-1 and 230-3 in the optical-axis direction, may be exerted in the same direction.

The second coil 230 may be conductively connected to the circuit board 250, and may be provided with power or drive signals from the circuit board 250. The power or drive signals supplied to the second coil 230 may be DC or AC signals, or may include both DC and AC components, and may be of a current type or a voltage type.

By virtue of the interaction between the first magnets 130-1 to 130-4 and the second coil units 230-1 to 230-4 to which the drive signals are supplied, the housing 140 may be moved in the second direction and/or in the third direction, for example, in an x-axis direction and/or in a y-axis direction, thereby performing handshake correction.

Referring to FIG. 13, the circuit board 250 may include pads PX1 to PX4 and PY1 to PY4, which are conductively connected to the coil units 230-1 to 230-4. Here, the pads PX1 to PX4 and PY1 to PY4 may be alternatively referred to as "terminals" or "bonding portions".

For example, one end of the first coil unit 230-1 may be connected to the first pad PX1, and the other end of the first coil unit 230-1 may be connected to the second pad PX2. One end of the third coil unit 230-3 may be connected to the third pad PX3, and the other end of the third coil unit 230-3 may be connected to the fourth pad PX4. The second pad PX2 and the third pad PX3 may be connected to each other via the first circuit pattern (or the first wire) formed in the circuit board 250. Consequently, the two coil units 230-1 and 230-3 for movement in the second direction may be connected to each other in series via the first to fourth pads PX1 to PX3.

Furthermore, one end of the second coil unit 230-2 may be connected to the fifth pad PY1, and the other end of the second coil unit 230-2 may be connected to the sixth pad PY2. One end of the fourth coil unit 230-4 may be connected to the seventh pad PY3, and the other end of the fourth coil unit 230-4 may be connected to the eighth pad PY4. The sixth pad PY2 and the seventh pad PY3 may be connected to each other via the second circuit pattern (or the second wire) formed in the circuit board 250. Consequently, the two coil units 230-2 and 230-4 for movement in the third direction may be connected to each other in series via the fifth to eighth pads PY1 to PY4.

A second drive signal for the two coil units 230-1 and 230-3 for movement in the second direction may be supplied to the first pad PX1 and the fourth pad PX4 of the circuit board 250, and a third drive signal for the two coil units 230-2 and 230-4 for movement in the second direction may be supplied to the fifth pad PY1 and the eighth pad PY4 of the circuit board 250.

As described later, when each of the first and second sensors 240a and 240b is composed of a driver integrated circuit including a Hall sensor, the first sensor 240a may be conductively connected to the first pad PX1 and the fourth pad PX4 of the circuit board 250, and may provide the first pad PX1 and the fourth pad PX4 of the circuit board 250 with the second drive signal.

Furthermore, the second sensor 240b may be conductively connected to the fifth pad PY1 and the eighth pad PY4 of the circuit board 250, and may provide the fifth pad PY1 and the eighth pad PY4 of the circuit board 250 with the third drive signal.

In another embodiment, in which each of the first and second sensors 240a and 240b is embodied as only one Hall sensor, via two terminals formed on the terminal member of the circuit board 250, the second drive signal may be supplied to the first pad PX1 and the fourth pad PX4 of the circuit board 250 from the outside, and the third drive signal may be supplied to the fifth pad PY1 and the eighth pad PY4 from the outside. Here, the outside may be a controller of a camera module or a controller of an optical device.

In FIGS. 13 and 14, although each of the coil units 230-1 to 230-4 is embodied as a ring-shaped coil block, for example, a coil ring, which is prepared separately from the circuit board 250, the disclosure is not limited thereto.

In another embodiment, the coil unit may be prepared separately from the circuit board 250, and may be embodied as a circuit pattern formed at a polygonal (for example, a rectangular) circuit member.

In another embodiment, the coil units 230-1 to 230-4 may be embodied so as to have a circuit pattern directly formed at the circuit board 250, for example, an FP coil form.

Each of the first and second sensors 240a and 240b may be of a driver type including a Hall sensor. In another embodiment, each of the first and second sensors 240a and 240b may be a Hall sensor.

The terminal member 253 of the circuit board 250 may be provided with the terminals 21-1 to 21-n (n being a natural number greater than 1, n>1).

Via the plurality of terminals 21-1 to 21-n provided at the terminal member 253 of the circuit board 250, the signals SCL, SDA, VDD and GND for data communication with the first position sensor 170 may be transmitted and received.

When each of the first and second sensors 240a and 240b is of a drive IC type, signals for data communication with each of the first and second sensors 240a and 240b may be transmitted and received through the plurality of terminals 21-1 to 21-n provided on the terminal member 253 of the circuit board 250. A description thereof will be given later.

When each of the first and second sensors 240a and 240b is embodied as only one Hall sensor, the second and third drive signals may be supplied through the plurality of terminals 21-1 to 21-n provided on the terminal member 253 of the circuit board 250, and the signals output from the OIS position sensors 240a and 240b may be output to the outside.

In the embodiment, although the circuit board 250 may be an FPCB, the disclosure is not limited thereto, and the pads PX1 to PX4 and PY1 to PY4 of the circuit board 250 may be directly formed on the surface of the base 210 through surface electrode technology or the like in another embodiment.

The circuit board 250 may have holes 250a through which the support members 220-1 to 220-4 extend. The positions and number of holes 250a may correspond to or coincide with the positions and number of the support members 220-1 to 220-4.

Although the support members 220-1 to 220-4 may be conductively connected to pads (or a circuit pattern) formed on the lower surface of the circuit board 250 through the holes 250a in the circuit board 250 via solder or a conductive adhesive member, the disclosure is not limited thereto.

In another embodiment, the circuit board 250 may not have holes formed therein, and the support members 220-1 to 220-4 may be conductively connected to a circuit pattern or to pads formed on the upper surface of the circuit board 250 via solder, a conductive adhesive member or the like.

In a further embodiment, the support members 220-1 to 220-4 may connect the upper elastic units 150-1 to 150-4 to the circuit member at which the coil units are formed, and the circuit member may be conductively connected to the circuit board 250.

Since the embodiment is constructed such that drive signals are directly supplied to the first coil 120 from the first position sensor 170, it is possible to reduce the number of support members and to simplify the conductive connecting structure, compared to the case in which drive signals are directly supplied to the first coil 120 via the circuit board 250.

As described later, since the drive signals are directly supplied to the coil units 230-1 to 230-4 from the first and second sensors 240a and 240b, it is possible to reduce the number of terminals of the circuit board 250.

Furthermore, since each of the first position sensor 170 and the first and second sensors 240a and 240b is capable of being embodied as a drive IC capable of detecting temperature, it is possible to improve the accuracy of AF operation, regardless of temperature variation, by compensating the output of the hall sensor so as to minimize a change thereof in response to variation in temperature or by compensating the output of the Hall sensor so as to change linearly with changes in temperature.

The cover member 300 may accommodate the bobbin 110, the first coil 120, the magnet 130, the housing 140, the upper elastic member 150, the lower elastic member 160, the first position sensor 170, the second magnet 180, the circuit board 190, the support member 220, the second coil 230, the second position sensor 240 and the circuit board 150 in the space defined between the cover member 300 and the base 210.

The cover member 300 may be configured to have a box shape, which is open at the lower face thereof and includes the upper plate 301 and the side plates 302. The lower portion of the cover member 300 may be coupled to the upper portion of the base 210. The upper plate 301 of the cover member 300 may have a polygonal shape, for example, a square shape, an octagonal shape, or the like.

The cover member 300 may have a bore, which exposes a lens (not shown) coupled to the bobbin 110 to external light. Although the cover member 300 may be made of made of a nonmagnetic material such as stainless steel so as to inhibit a phenomenon in which the cover member 300 is attracted to the first magnet 130, the disclosure is not limited thereto. The cover member 300 may also be made of a magnetic material so as to serve as a yoke for increasing the electromagnetic force between the first coil 120 and the first magnet 130.

Referring to FIGS. 12A to 15, one coil unit 230-1 for movement in the second direction may be disposed in a first region on the upper surface of the circuit board 250, which is positioned between the first corner 25B1 of the circuit board 250 and the bore (or the hollow) 205 in the circuit board 250.

Another coil unit 230-3 for movement in the second direction may be disposed in a second region on the upper surface of the circuit board 250, which is positioned between the third corner 25B3 of the circuit board 250 and the bore (or the hollow) 205 in the circuit board 250.

Another coil unit 230-2 for movement in the third direction may be disposed in a third region on the upper surface of the circuit board 250, which is positioned between the second corner 25B2 of the circuit board 250 and the bore (or the hollow) 205 in the circuit board 250.

The remaining coil unit 230-4 for movement in the third direction may be disposed in a fourth region on the upper surface of the circuit board 250, which is positioned between the fourth corner 26B4 of the circuit board 250 and the bore (or the hollow) 205 in the circuit board 250.

The first sensor 240a may be disposed on the upper surface of the circuit board 250 inside the coil unit 230-1 for movement in the second direction.

The second sensor 240b may be disposed on the upper surface of the circuit board 250 inside the coil unit 230-2 for movement in the third direction.

Although the first sensor 240a may not overlap the first coil unit 230-1 in the optical-axis direction and the second sensor 240b may not overlap the second coil unit 230-2 in the optical-axis direction, the disclosure is not limited thereto. In another embodiment, the sensor and the coil unit may at least partially overlap each other in the optical-axis direction.

Although the first sensor 240a may overlap the magnet 130-1 in the optical-axis direction and the second sensor 240b may overlap the magnet 130-2 in the optical-axis direction, the disclosure is not limited thereto. In another embodiment, the first and second sensors 240a and 240b may not overlap the magnets 130-1 to 130-4 in the optical-axis direction.

The first sensor 240a may be disposed between the first pad PX1 and the second pad PX2 of the circuit board 250, and the second sensor 240b may be disposed between the fifth pad PY1 and the sixth pad PY2 of the circuit board 250.

For example, the first sensor 240a may overlap a first line 13A, which connects the first corner 25B1 of the circuit board 250 to the center 25A of the bore 205 in the circuit board 250. The second sensor 240b may overlap a second line 13B, which connects the second corner 25B2 of the circuit board 250 to the center 25A of the bore 205 in the circuit board 250.

For example, the center of the first sensor 240a may be aligned with or overlap the first line 13A, and the center of the second sensor 240b may be aligned with or overlap the second line 13B. The first line 13A and the second line 13B may be perpendicular to each other.

Referring to FIG. 15, a first height H1 of the upper surface of the coil unit 230-1 from the upper surface of the circuit board 250 may be less than or equal to the second height H2 of the upper surface of the first sensor 240a from the upper surface of the circuit board 250 (H1 H2). Furthermore, the height of the upper surface of the coil unit 230-2 from the upper surface of the circuit board 250 may be less than or equal to the height of the second sensor 240b from the upper surface of the circuit board 250. In another embodiment, the first height may be greater than the second height.

There is a close relationship between the height of a camera module and the height of a cellular phone. Although there is great demand for reduction in the height of a camera module, it is not easy to reduce the height of the camera module due to the consequent low reliability of the camera module and technological limits.

A conventional process of coupling and mounting an OIS sensor, a circuit board and a base of a lens moving apparatus is as follows.

First, SMT (Surface-Mounting Technology) for mounting the OIS sensor on the lower surface of the circuit board is performed.

Subsequently, the OIS coil is attached to the upper surface of the circuit board using an adhesive, and the adhesive is hardened.

Subsequently, an SMT process of connecting the OIS coil to the pad on the upper surface of the circuit board for the purpose of conductive connection is performed.

Subsequently, the lower surface of the circuit board is attached to the upper surface of the base using an adhesive, and the adhesive is hardened.

In contrast, the process according to the embodiment of coupling and mounting the second sensor 240, the circuit board 250 and the base 210 of the lens moving apparatus is as follows.

First, an SMT process of mounting the first and second sensors 240a and 240b of the second position sensor 240 and the coil units 230-1 to 230-4 of the second coil 230 on the upper surface of the circuit board 250 is performed. If necessary, the second coil 230 may be attached to the upper surface of the circuit board 250 using an adhesive.

Subsequently, the lower surface of the circuit board 250 is attached to the upper surface of the base 210 using an adhesive, and the adhesive is hardened. In another embodiment, an insert technology for forming a circuit at the base 210 may be applied in place of the circuit board 250.

Since the embodiment is able to perform the SMT process of mounting both the second sensor 240 and the second coil 230 on the upper surface of the circuit board 250, it is possible to reduce the number of operations of the process and thus to reduce manufacturing costs.

Furthermore, since the second position sensor 240 is disposed on the upper surface of the circuit board 250 according to the embodiment, there is no need to form a seating groove by which the second position sensor 240 is seated or disposed in the base 210, thereby making it possible to reduce the height of the base 210. Accordingly, the embodiment is able to increase the length of the support member 220 without increasing the height of the lens moving apparatus or a camera module. As a result, it is possible to improve the reliability of the lens moving apparatus and the camera module and to reduce power consumption.

In comparison with an FP coil in which four coils for second and third directions are integrally formed, since the embodiment is able to manufacture each of the coil units 230-1 to 230-4 so as to have the form of a coil block, it is possible to increase the number of manufactured OIS coils per unit area and thus to improve the production yield.

Furthermore, since an SMT process of concurrently mounting the second position sensor 240 and the second coil 230 on the upper surface of the circuit board 250 is possible, it is possible to realize production automation.

Figure 16A:
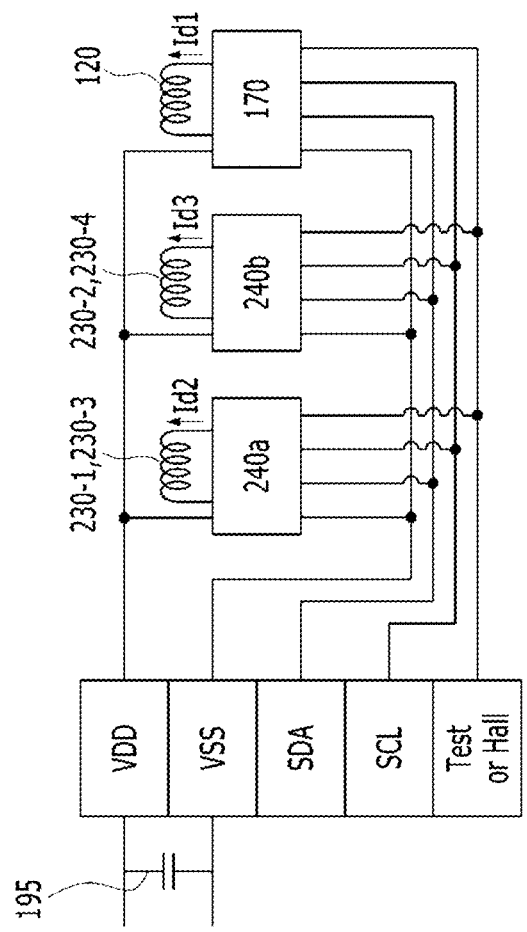
FIG. 16A is a block diagram illustrating the supply of power signals, a data signal and a clock signal to the first position sensor, the first sensor and the second sensor according to an embodiment.
Figure 16B:
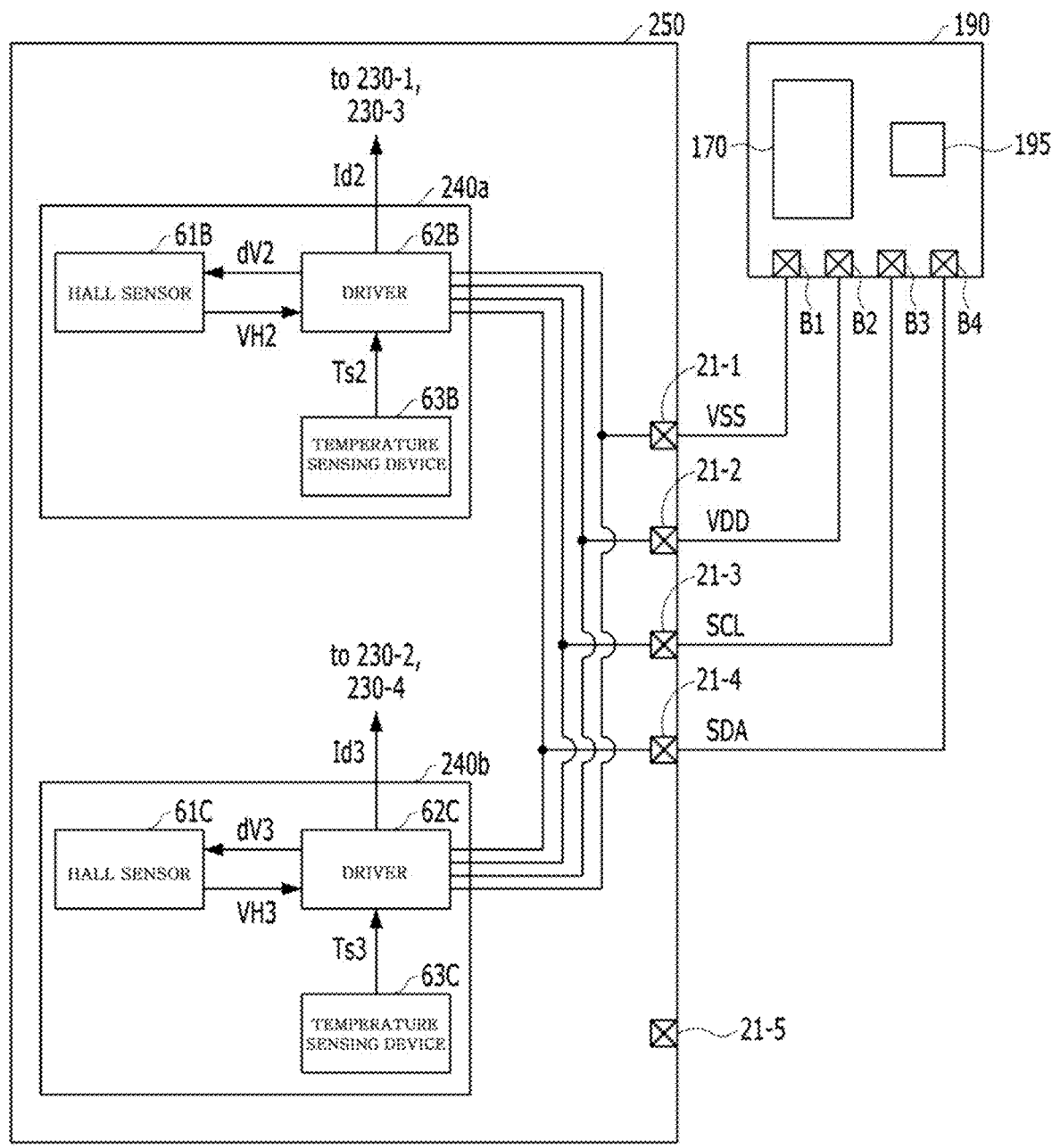
FIG. 16B is a circuit diagram of the first position sensor, the first sensor and the second sensor shown in FIG. 16A.

FIG. 16A is a block diagram illustrating the supply of power signals VDD and VSS, a data signal SDA, and a clock signal SCL to the first position sensor 170, the first sensor 240a and the second sensor 240b according to an embodiment. FIG. 16B is a circuit diagram of the first position sensor 170, the first sensor 240a and the second sensor 240b shown in FIG. 16A.

Referring to FIGS. 16A and 16B, each of the first position sensor 170, the first sensor 240a, and the second sensor 240b may be of a driver IC type.

The first sensor 240a may include a Hall sensor 61B and a driver 62B. Furthermore, the first sensor 340a may further include a temperature-sensing element or a temperature sensor 63B, configured to provide the driver 62B with a temperature-sensing signal Ts2.

The driver 62B of the first sensor 240a may output a second drive signal Id2 to drive the Hall sensor 61B and a second drive signal Id2 to drive the coil units 230-1 and 230-3 for movement in the second direction. The driver 62B of the first sensor 240a may receive the output of the Hall sensor 61B.

The second sensor 240b may include a Hall sensor 61C and a driver 62C. The second sensor 240b may further include a temperature-sensing element or a temperature sensor 63C, configured to provide the driver 62C with a temperature-sensing signal Ts3.

The driver 62C of the second sensor 240b may output a drive signal dV3 to drive the Hall sensor 61C and a third drive signal Id3 to drive the coil units 230-2 and 230-4 for movement in the third direction. The driver 62C of the second sensor 240b may receive the output VH3 of the Hall sensor 61B.

The description of the first position sensor 170 shown in FIG. 8B may also be applied to the first sensor 240a and the second sensor 240b shown in FIG. 16B, with or without modification.

For example, each of the first position sensor 170, the first sensor 240a and the second sensor 240b may transmit and receive a clock signal and a data signal to and from the controller 830 or 780 through data communication using a protocol such as, for example, I2C communication.

The power signals VDD and VSS may be supplied to each of the first position sensor 170, the first sensor 240a, and the second sensor 240b through two terminals (for example, 21-2 and 21-2) of the circuit board 250.

For example, the drivers 62A, 62B and 62C of the first position sensor 170, the first sensor 240a and the second sensor 240b may be conductively connected to two terminals 21-1 and 21-2 of the circuit board 250, and may receive the VDD signal and the VSS signal through the two terminals 21-1 and 21-2. For example, the voltage of the VDD signal may be higher than the voltage of the VSS signal. For example, the VSS signal may be a ground signal GND, and the voltage of the VSS signal may be a ground voltage.

The clock signal SCL may be supplied to each of the first position sensor 170, the first sensor 240a, and the second sensor 240b through another terminal (for example, 21-3) of the circuit board 250.

For example, the drivers 62A, 62B and 62C of the first position sensor 170, the first sensor 240a, and the second sensor 240b may be conductively connected to another terminal (for example, 21-3) of the circuit board 250, and may transmit and receive the clock signal SCL through the terminal 21-3.

The data signal SDA may be supplied to each of the first position sensor 170, the first sensor 240a, and the second sensor 240b through another terminal (for example, 21-4) of the circuit board 250.

For example, the drivers 62A, 62B and 62C of the first position sensor 170, the first sensor 240a, and the second sensor 240b may be conductively connected to another terminal (for example, 21-4) of the circuit board 250, and may transmit and receive the data signal SDA through the terminal 21-4.

For example, the first position sensor 170, the first sensor 240a and the second sensor 240b may have different addresses or identification codes, and the controller 830 or 780 may discriminate or identify the first position sensor 170, the first sensor 240a and the second sensor 240b based on the different addresses and may transmit and receive the data signal SDA to and from the first position sensor 170, the first sensor 240a and the second sensor 240b depending on the result of the identification.

Each of the first position sensor 170, the first sensor 240a, and the second sensor 240b may further include at least one test terminal for testing, and the circuit board 250 may further include a terminal (for example, 21-5), which is conductively connected to the test terminal.

In FIGS. 16A and 16B, since the first position sensor 170, the first sensor 240a, and the second sensor 240b receive the power signals VDD and VSS through the two terminals 21-1 and 21-2 of the circuit board and transmit and receive the clock signal SCL and the data signal SDA to and from the outside through two other terminals 21-3 and 21-4 of the circuit board 250, it is possible to reduce the number of terminals of the circuit board 250 required for operation of the first position sensor 170, the first sensor 240a, and the second sensor 240b.

Figure 17A:
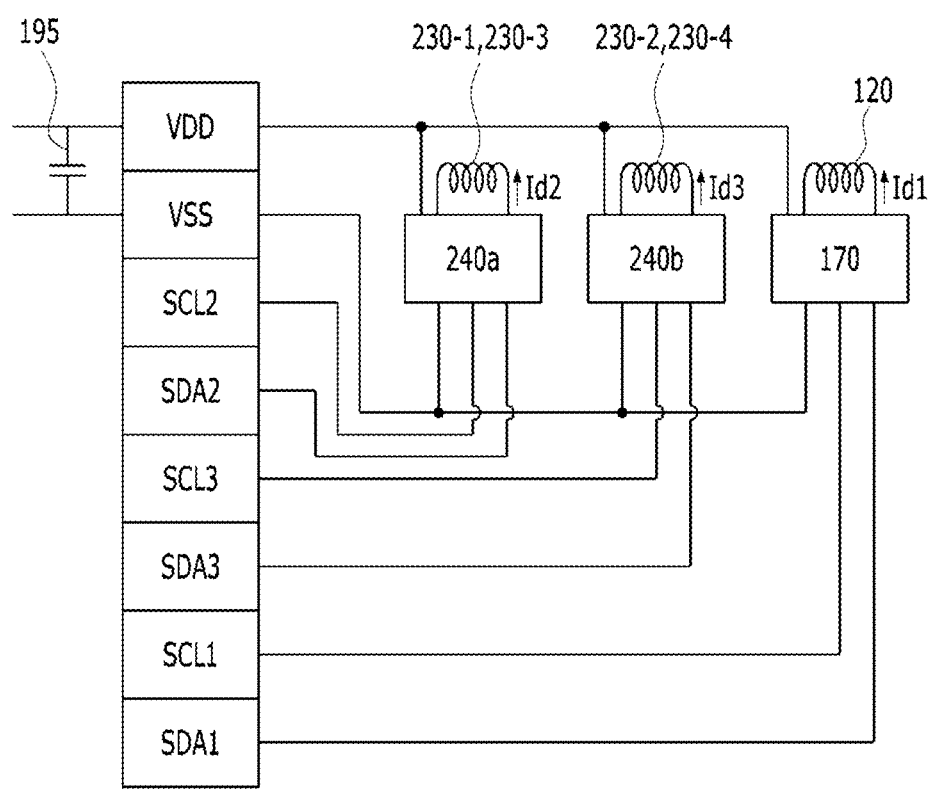
FIG. 17A is a block diagram illustrating the supply of the power signals, the data signal and the clock signal to the first position sensor, the first sensor and the second sensor according to another embodiment.
Figure 17B:
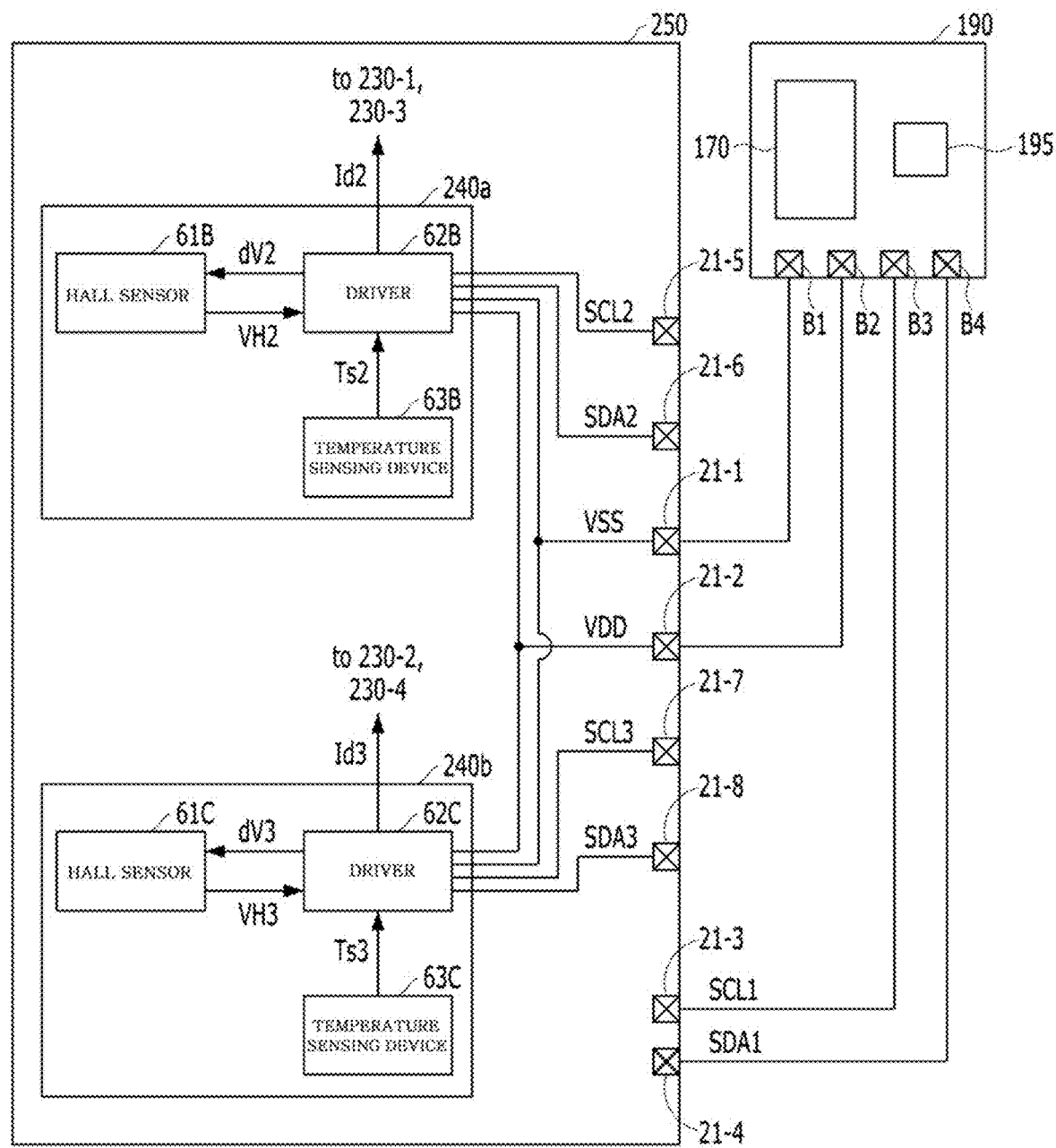
FIG. 17B is a circuit diagram of the first position sensor, the first sensor and the second sensor shown in FIG. 17A.

FIG. 17A is a block diagram illustrating the supply of the power signals VDD and VSS, the data signal SDA and the clock signal SCL to the first position sensor 170, the first sensor 240a, and the second sensor 240b according to another embodiment. FIG. 17B is a circuit diagram of the first position sensor 170, the first sensor 240a, and the second sensor 240b shown in FIG. 17A.

Referring to FIGS. 17A and 17B, each of the first position sensor 170, the first sensor 240a and the second sensor 240b may be of a driver IC type.

The power signals VDD and VSS may be supplied to each of the first position sensor 170, the first sensor 240a and the second sensor 240b through two terminals (for example, 21-2 and 21-2) of the circuit board 250.

For example, the power signals VDD and VSS may be supplied to each of the first position sensor 170, the first sensor 240a, and the second sensor 240b through the first and second terminals 21-2 and 21-2 of the circuit board 250.

Different clock and data signals may be supplied to each of the first position sensor 170, the first sensor 240a, and the second sensor 240b.

For example, the drivers 62A, 62B and 62C of the first position sensor 170, the first sensor 240a, and the second sensor 240b may be conductively connected to the first and second terminals 21-1 and 21-2 of the circuit board 250, and the power signals VDD and VSS may be supplied through the first and second terminals 21-1 and 21-2.

For example, the driver 62A of the first position sensor 170 may be conductively connected to the third and fourth terminals 21-3 and 21-4 of the circuit board 250, and a first clock signal SCL1 and a first data signal SDA1 may be supplied through the third and fourth terminals 21-3 and 21-4 of the circuit board 250.

For example, the driver 62B of the first sensor 240a may be conductively connected to the fifth and sixth terminals 21-5 and 21-6 of the circuit board 250, and a second clock signal SCL2 and a second data signal SDA2 may be supplied through the fifth and sixth terminals 21-5 and 21-6 of the circuit board 250.

For example, the driver 62C of the second sensor 240b may be conductively connected to the seventh and eighth terminals 21-7 and 21-8 of the circuit board 250, and a third clock signal SCL3 and a third data signal SDA3 may be supplied through the seventh and eighth terminals 21-7 and 21-8 of the circuit board 250.

In FIGS. 17A and 17B, since the first position sensor 170, the first sensor 240a, and the second sensor 240b receive the power signals VDD and VSS through the two terminals 21-1 and 21-2, it is possible to reduce the number of circuit boards 250 required to drive the first sensor 170, the first sensor 240a, and the second sensor 240b.

Figure 18:
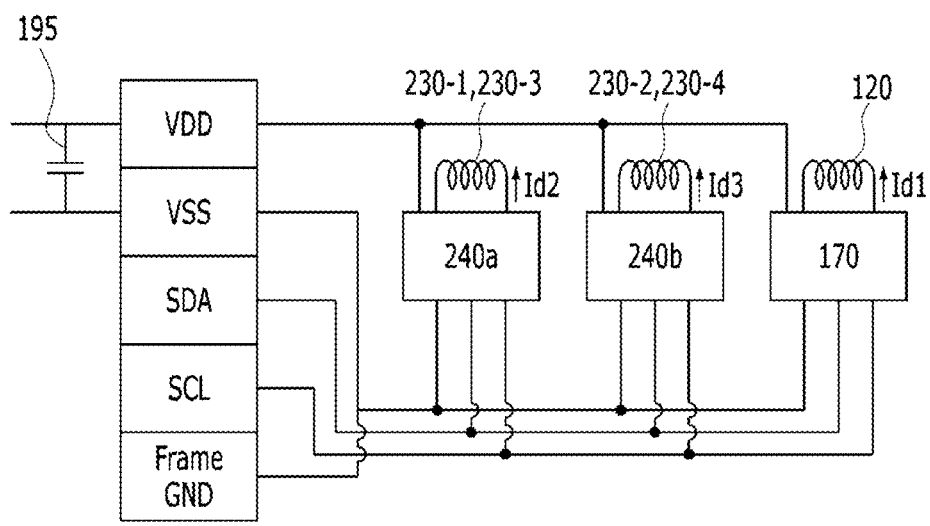
FIG. 18 is a block diagram illustrating the supply of the power signals, the data signal and the clock signal of the first position sensor, the first sensor and the second sensor according to another embodiment.

FIG. 18 is a block diagram illustrating the supply of the power signals VDD and VSS, the data signal SDA and the clock signal SCL of the first position sensor 170, the first sensor 240a and the second sensor 240b according to another embodiment.

Referring to FIG. 18, the circuit board 250 may further include a terminal providing a frame ground (GND). The frame ground of the circuit board 250 may be conductively connected to the cover member 300. For example, the terminal of the circuit board 250, which supplies the VSS signal, may be conductively connected to the frame ground.

The description disclosed in connection with FIGS. 16A and 16B may also be applied to the embodiment shown in FIG. 18, with or without modification, except for the description of the test terminal in FIGS. 16A and 16B.

Figure 19:
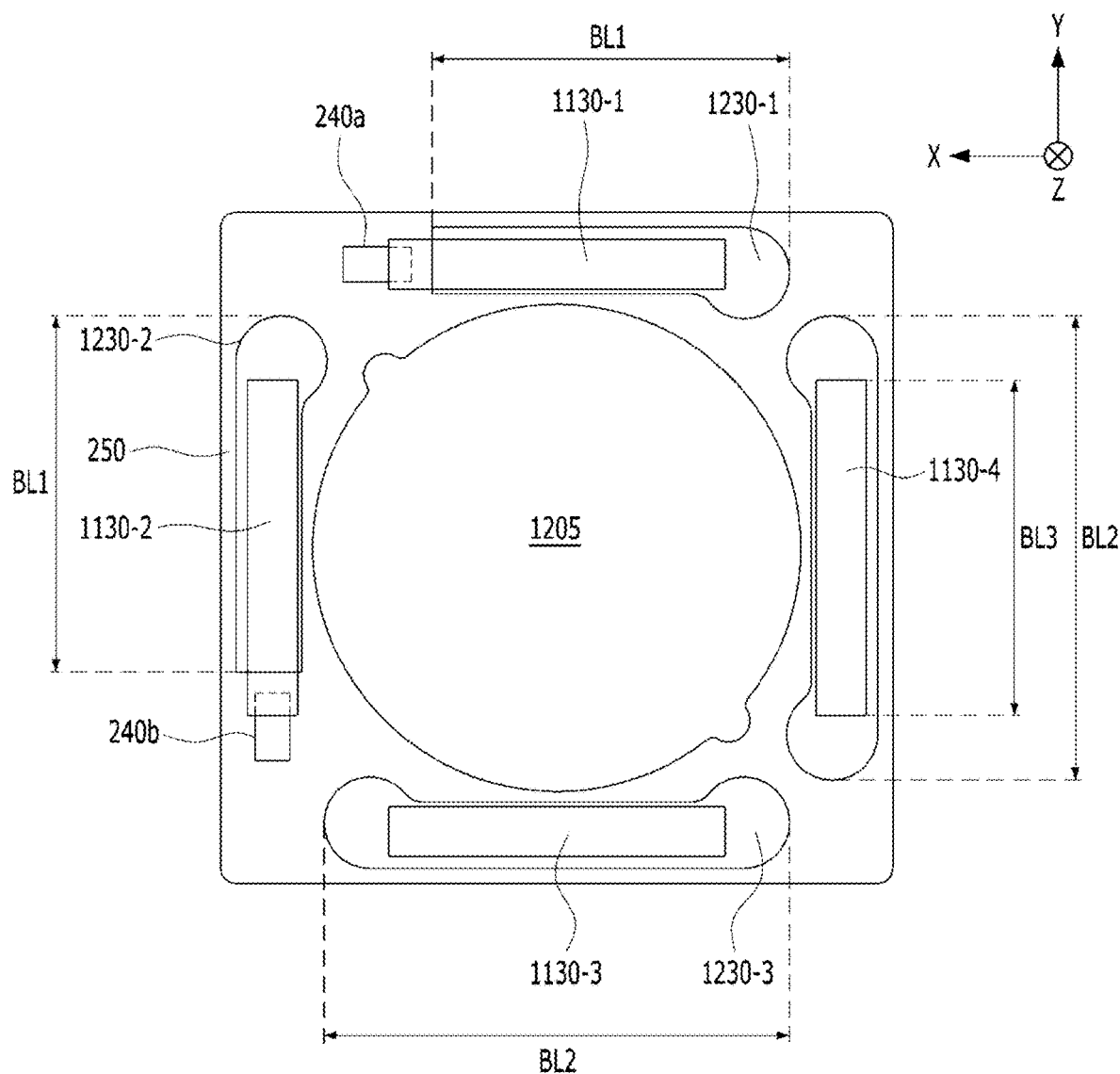
FIG. 19 illustrates magnets, second coils, the first sensor, and the second sensor according to another embodiment.

FIG. 19 illustrates magnets 1130-1 to 1130-4, second coils 1230-1 to 1230-4, the first sensor 240a, and the second sensor 240b according to another embodiment.

In the embodiment shown in FIGS. 1 to 15, the magnets 130-1 to 130-4 may be disposed at the corner portions of the housing 140, the coil units 230-1 to 230-4 of the second coil 230 may be disposed so as to face the magnets 130-1 to 130-4, and the first and second sensors 240a and 240b may be disposed inside the coil units 230-1 and 230-2.

Meanwhile, referring to FIG. 19, the magnets 1130-1 to 1130-4 may be disposed at the side portions of the housing 140. The coil units 1230-1 to 1230-4 may be disposed in the region between the sides of the upper surface of the circuit board 1250 and the bore 1205 in the circuit board 1250 so as to face the magnets 1130-1 to 1130-4 in the optical-axis direction.

Each of the coil units 1230-1 to 1230-4 may be disposed adjacent to a corresponding one of the sides of the upper surface of the circuit board 250, and the longitudinal direction of each of the coil units 1230-1 to 1230-4 may be parallel to a corresponding one of the sides of the circuit board 250.

The first coil unit 1230-1 and the third coil unit 1230-3 may be disposed adjacent to two sides of the circuit board 250, which face each other, and the second coil unit 1230-2 and the fourth coil unit 1230-4 may be disposed adjacent to the two other sides of the circuit board 250, which face each other.

For example, the first sensor 240a may be disposed adjacent to a first end of the first coil unit 1230-1. For example, the second sensor 240b may be disposed adjacent to a second end of the second coil unit 1230-2, which is positioned opposite a first end of the second coil unit 1230-2, adjacent to the first end of the first coil unit 1230-1.

For example, the first sensor 240a may not overlap the first coil unit 1230-1 in the optical-axis direction, and the second sensor 240b may not overlap the second coil unit 1230-2 in the optical-axis direction. The reason for this is because the first and second sensors 240a and 240b may not precisely detect variation of magnetic force generated from the magnet due to noise caused by the magnetic force generated from the coil units 1230-1 and 1230-2 when the first and second sensors 240a and 240b overlap the coil units 1230-1 and 1230-2 in the optical-axis direction. However, the sensors and the coil units may overlap each other in the optical-axis direction in another embodiment.

For example, the crosswise length BL1 of the first coil unit 1230-1 may be less than the crosswise length BL2 of the third coil unit 1230-3, and the crosswise length BL1 of the second coil unit 1230-2 may be less than the crosswise length BL2 of the fourth coil unit 1230-4.

Each of the magnets 1130-1 and 1130-2 may include a portion that does not overlap a corresponding one of the coil units 1230-1 and 1230-2.

For example, one end of the first magnet 1130-1 may not overlap the first coil unit 1130-1 in the optical-axis direction. The one end of the first magnet 1130-1, which does not overlap the first coil unit 1130-1, may overlap the first sensor 240a in the optical-axis direction.

For example, a second end of the second magnet 1130-2, which is positioned opposite a first end of the second magnet 1130-2, adjacent to a first end of the first magnet 1130-1, may not overlap the second coil unit 1130-2. The second end of the second magnet 1130-2, which does not overlap the second coil unit 1130-2, may overlap the second sensor 240b in the optical-axis direction.

For example, when viewed from above, the third magnet 1130-3 may be disposed in the third coil unit 1230-3, and the fourth magnet 1130-4 may be disposed in the fourth coil unit 1230-4.

For example, the crosswise length of the third magnet 1130-3 may be less than the crosswise length BL2 of the third coil unit 1230-3, and the crosswise length BL3 of the fourth magnet 1130-4 may be less than the crosswise length BL2 of the fourth coil unit 1230-4.

For example, although the crosswise lengths of the first to fourth magnets 1130-1 to 1130-4 may be the same, the disclosure is not limited thereto.

For example, in another embodiment, the crosswise length of the first magnet 1130-1 may be less than the crosswise length of the third magnet 1130-3, and the crosswise length of the second magnet 1130-2 may be less than the crosswise length of the fourth magnet 1130-4. Furthermore, the crosswise length of the first magnet 1130-1 and the crosswise length of the second magnet 1130-2 may be the same, and the crosswise length of the third magnet 1130-2 and the crosswise length of the fourth magnet 1130-4 may be the same.

Although not illustrated in FIG. 19, the circuit board 1250 may include eight pads, which correspond to the first to eighth pads PX1 to PX4 and PY1 to PY4 described in connection with FIGS. 12A, 12B, 13 and 14, and the first to fourth coil units 1230-1 to 1230-4 may be conductively connected to the eight pads of the circuit board 1250. Here, the first coil unit 1230-1 and the second coil unit 1230-2 may be connected to each other in series via the eight pads of the circuit board 1250, and the second coil unit 1230-2 and the fourth coil unit 1230-4 may be connected to each other in series.

The description disclosed in connection with FIGS. 16A to 18 may also be applied to the embodiment shown in FIG. 19, with or without modification.

Although the power signals VDD and VSS may be supplied to each of the first position sensor 170, the first sensor 240a and the second sensor 240b through the two terminals 21-1 and 21-2 of the circuit board 250 in the embodiment shown in FIGS. 16A to 18, the disclosure is not limited thereto. In another embodiment, the circuit board 250 may include two terminals for supplying a first power signal to the first position sensor 170, two other terminals for supplying a second power signal to the first sensor 240a, and two other terminals for supplying a third power signal to the second sensor 240b. Here, although each of the first to third power signals may include the power signal VSS and the power signal VDD, the disclosure is not limited thereto. In another embodiment, at least one of the first to third power signals may include a different power signal.

Figure 20:
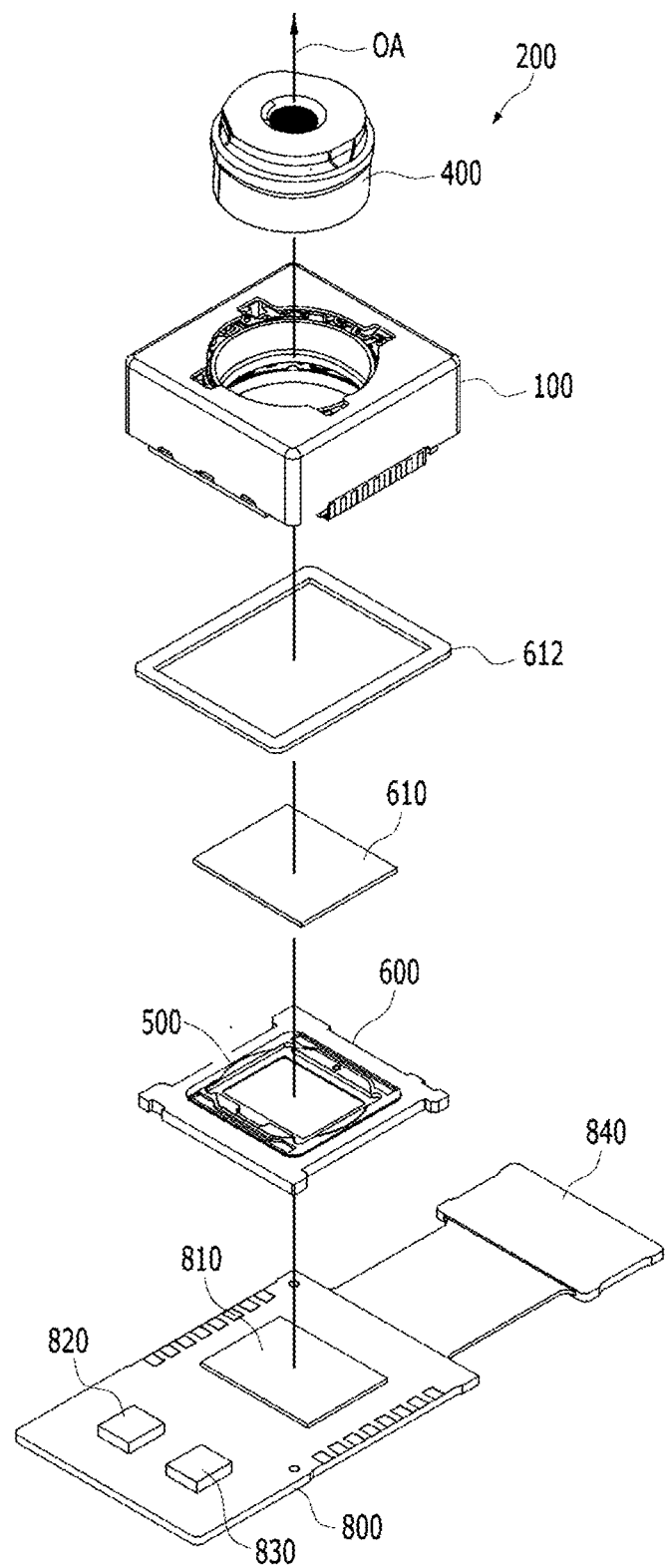
FIG. 20 is an exploded perspective view illustrating a camera module according to an embodiment.

FIG. 20 is an exploded perspective view illustrating a camera module 200 according to an embodiment.

Referring to FIG. 20, the camera module may include a lens barrel 400, the lens moving apparatus 100, an adhesive member 710, a filter 610, a first holder 600, a second holder 800, an image sensor 810, a motion sensor 820, a controller 830 and a connector 840.

The lens barrel 400 may be mounted in the bobbin 110 of the lens moving apparatus 100 or 1000.

The first holder 600 may be disposed under the base 210 of the lens moving apparatus 100. The filter 610 may be mounted on the first holder 600, and the first holder 600 may include a projection 500 on which the filter 610 is seated.

The adhesive member 612 may couple or attach the base 210 of the lens moving apparatus 100 to the first holder 600. In addition to the attachment function described above, the adhesive member 612 may serve to inhibit contaminants from entering the lens moving apparatus 100.

For example, the adhesive member 612 may be, for example, epoxy, thermohardening adhesive, or ultraviolet hardening adhesive.

The filter 610 may serve to inhibit light within a specific frequency band that passes through the lens barrel 400 from being introduced into the image sensor 810. The filter 610 may be, for example, an infrared-light-blocking filter, without being limited thereto. Here, the filter 610 may be oriented parallel to the X-Y plane.

The region of the first holder 600 in which the filter 610 is mounted may be provided with a bore in order to allow the light that passes through the filter 610 to be introduced into the image sensor 810.

The second holder 800 may be disposed under the first holder 600, and the image sensor 810 may be mounted on the second holder 600. The image sensor 810 may be the region, on which an image included in the light that passes through the filter 610 and is incident thereon is formed.

The second holder 800 may include, for example, various circuits, devices, and a controller in order to convert the image, formed on the image sensor 810, into electrical signals and to transmit the electrical signals to an external component.

The second holder 800 may be embodied as a circuit board on which the image sensor 810 may be mounted, on which a circuit pattern may be formed, and to which various devices may be coupled. The first holder 600 may be alternatively referred to as a "holder" or a "sensor base", and the second holder 800 may be alternatively referred to as a "board" or a "circuit board".

The image sensor 810 may receive an image included in the light introduced through the lens moving apparatus 100, and may convert the received image into an electrical signal.

The filter 610 and the image sensor 810 may be disposed so as to be spaced apart from each other in the state of facing each other in the first direction.

The motion sensor 820 may be mounted on the second holder 800, and may be conductively connected to the controller 830 through the circuit pattern formed on the second holder 800.

The motion sensor 820 may output information about a rotational angular speed caused by motion of the camera module 200. The motion sensor 820 may be embodied as a dual-axis or triple-axis gyro sensor or an angular speed sensor.

The controller 830 may be mounted on the second holder 800, and may be conductively connected to the second position sensor 240 of the lens moving apparatus 100 and the second coil 230. For example, the second holder 800 may be conductively connected to the circuit board 250 of the lens moving apparatus 100, and the controller 830 mounted on the second holder 800 may be conductively connected to the second position sensor 240 and the second coil 230 via the circuit board 250.

The controller 830 may transmit the clock signal SCL, the data signal SDA and the power signals VDD and GND for I2C communication with the first and second position sensors 170 and 240, and may receive the clock signal SCL and the data signal SDA from the first and second position sensors 170 and 240.

The controller 830 may perform a feedback autofocusing operation for the AF operation unit of the lens moving apparatus based on the output supplied from the first position sensor 170.

Furthermore, the controller 830 may perform handshake correction for the OIS operation unit of the lens moving apparatus 100 based on the signals output from the second position sensor 240.

The connector 840 may be conductively connected to the second holder 800, and may have therein a port that is intended to be conductively connected to an external device.

Figure 21:
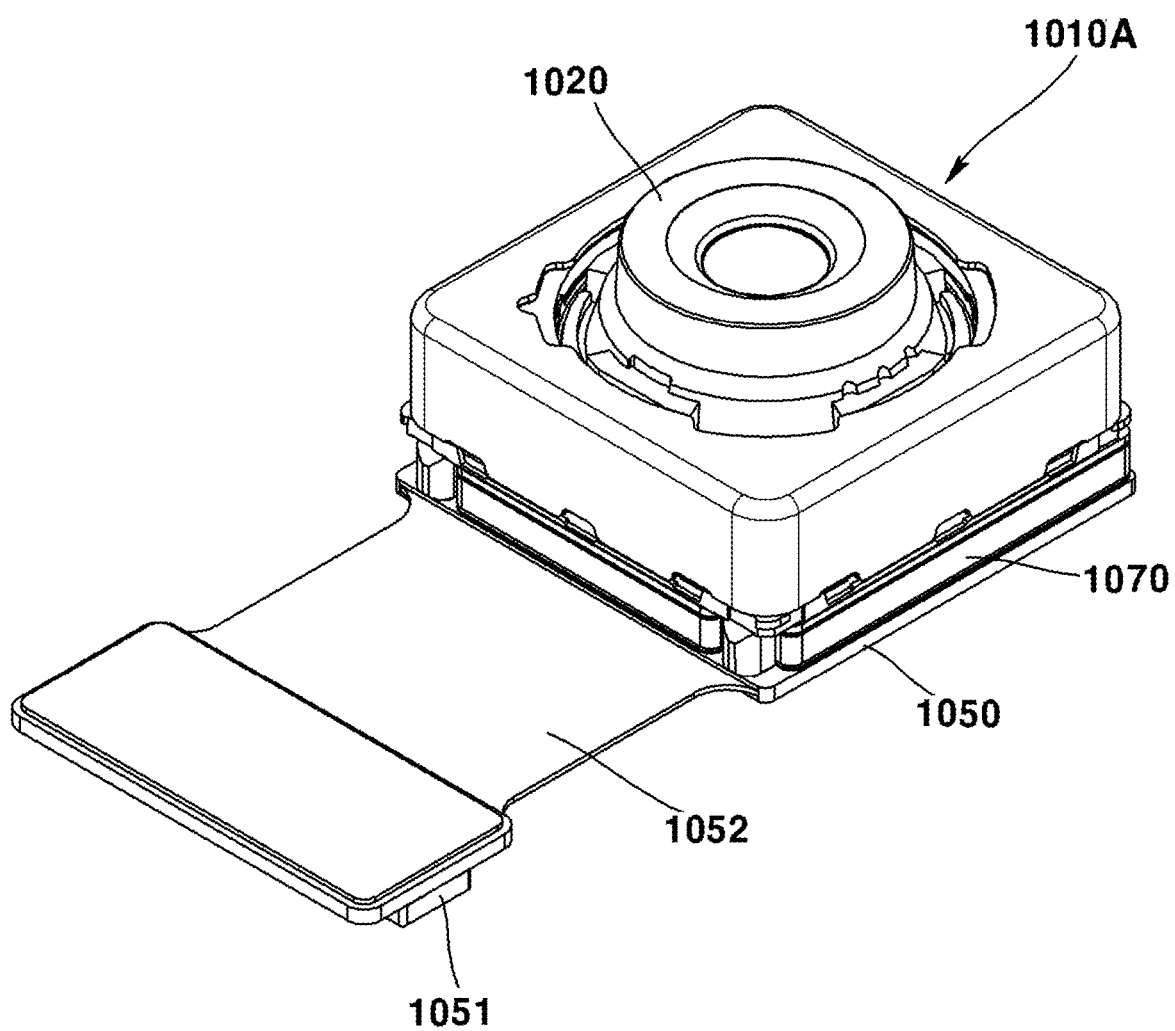
FIG. 21 is a perspective view of a camera device according to another embodiment.
Figure 22:
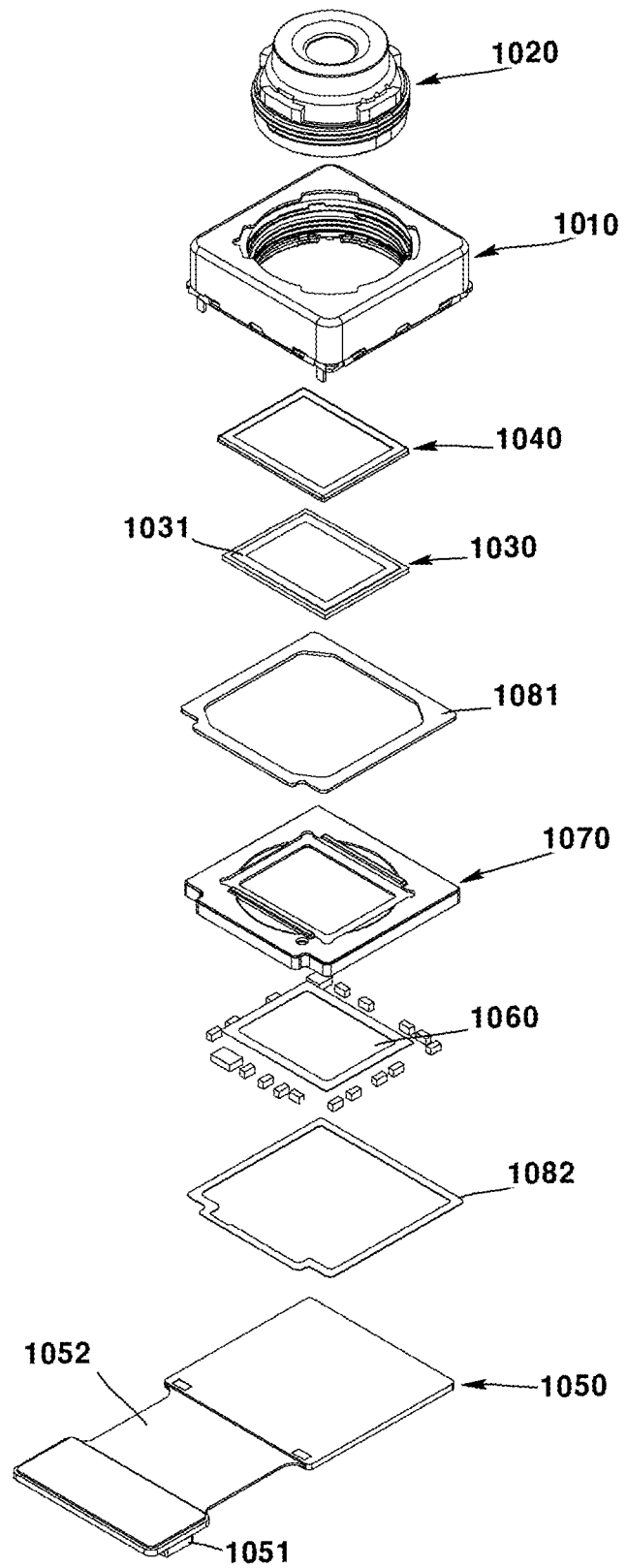
FIG. 22 is an exploded perspective view of the camera device shown in FIG. 21.
Figure 23:
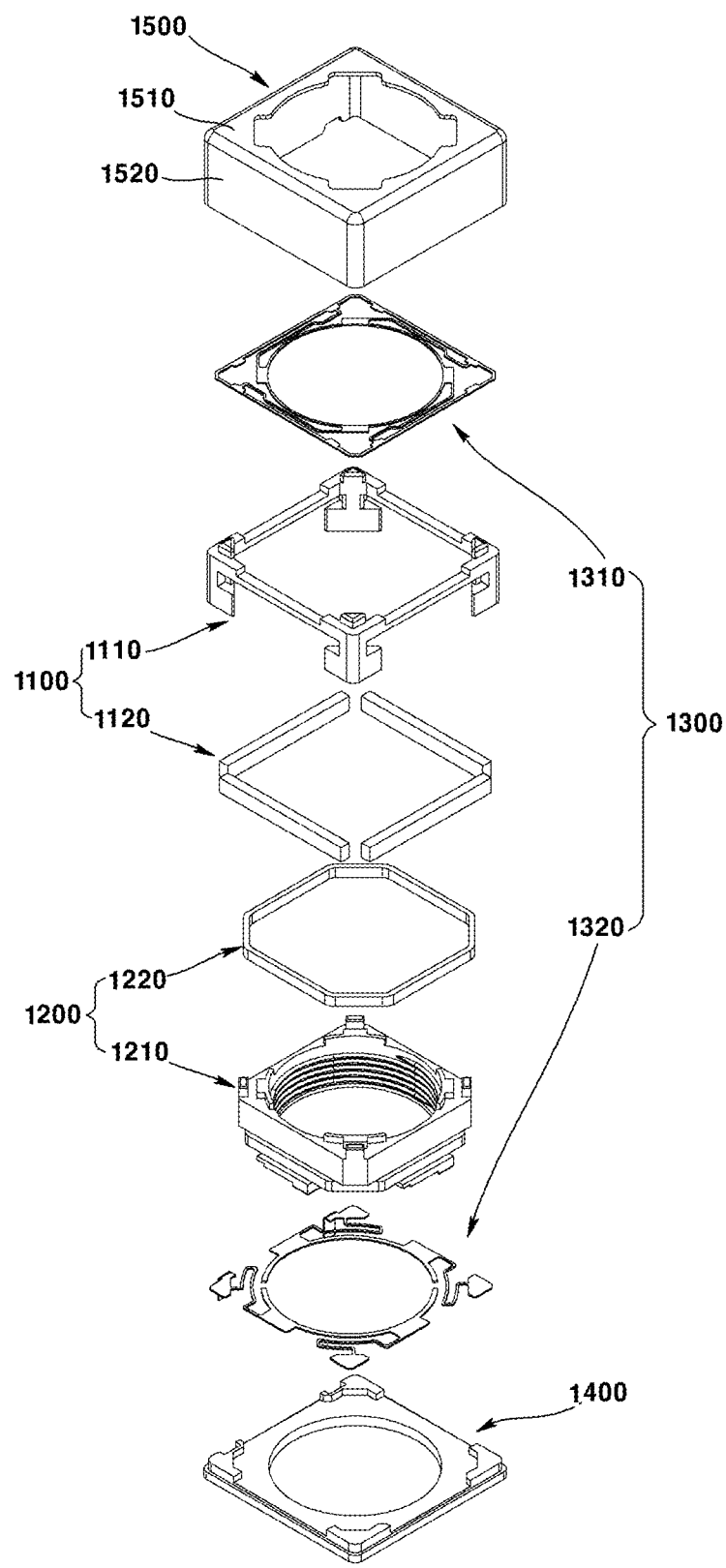
FIG. 23 is an exploded perspective view of a lens moving apparatus according to an embodiment.
Figure 24:
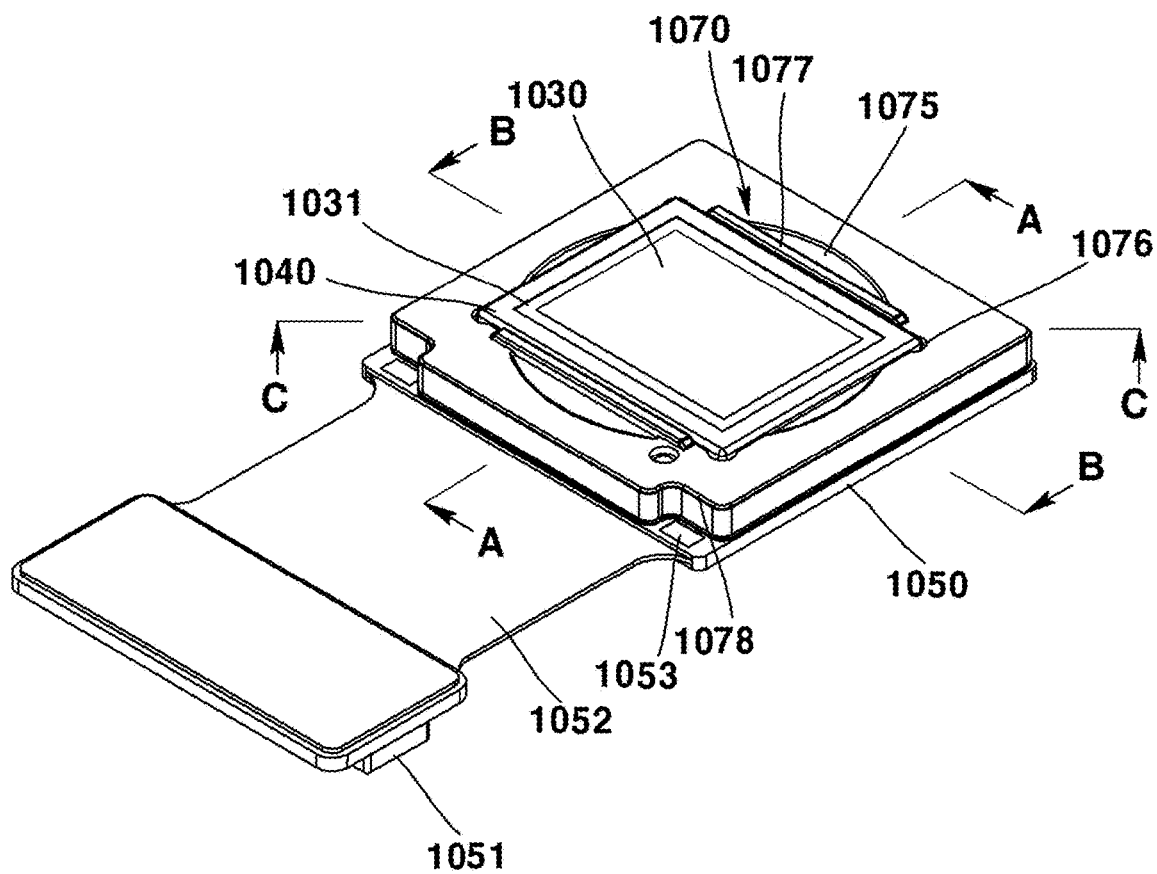
FIG. 24 is a perspective view of some components of the camera device according to the embodiment.
Figure 25:
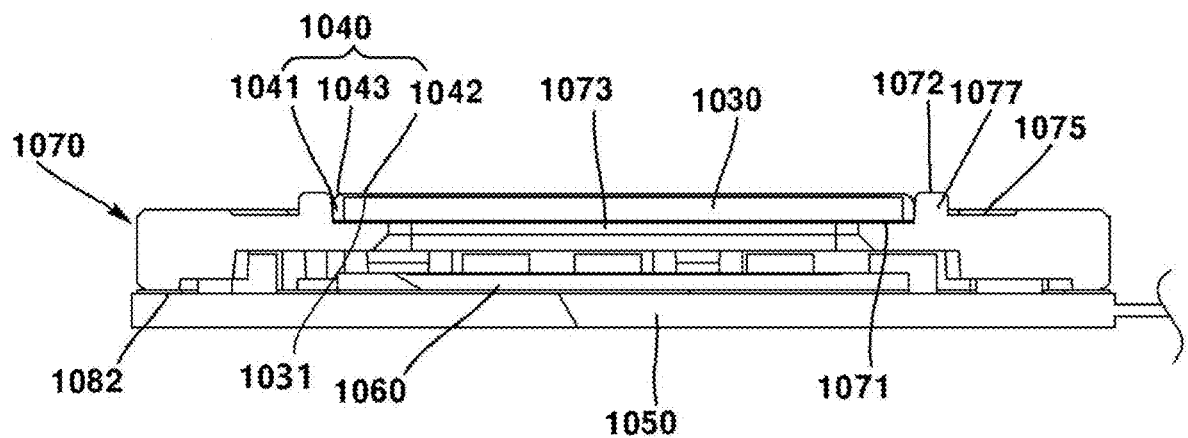
FIG. 25 is a cross-sectional view taken along line A-A in FIG. 24.
Figure 26:
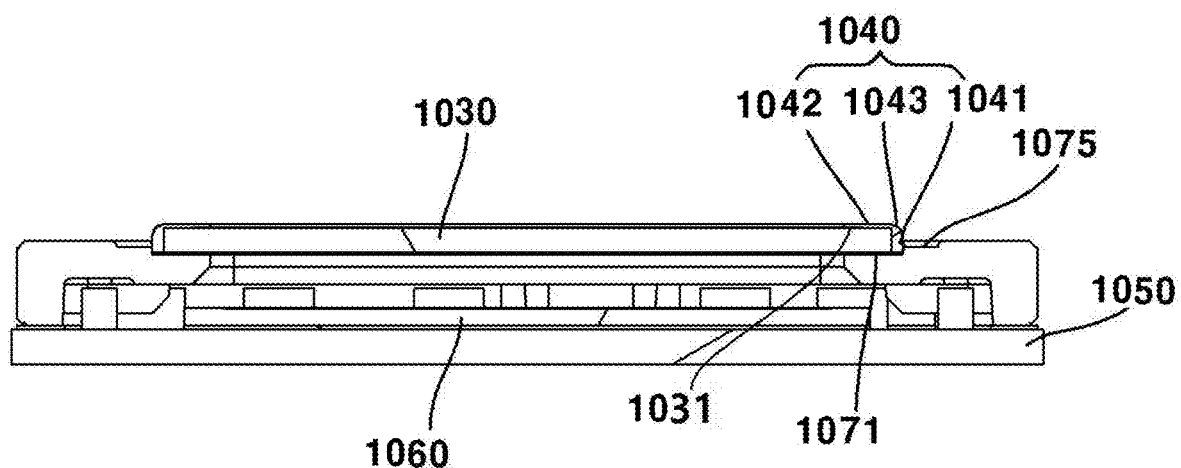
FIG. 26 is a cross-sectional view taken along line B-B in FIG. 24.
Figure 27:
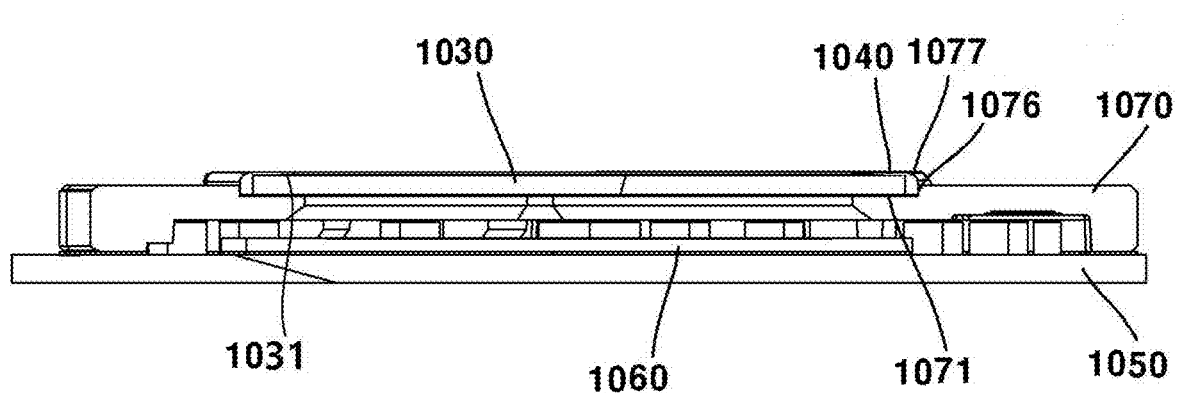
FIG. 27 is a cross-sectional view taken along line C-C in FIG. 24.
Figure 28:
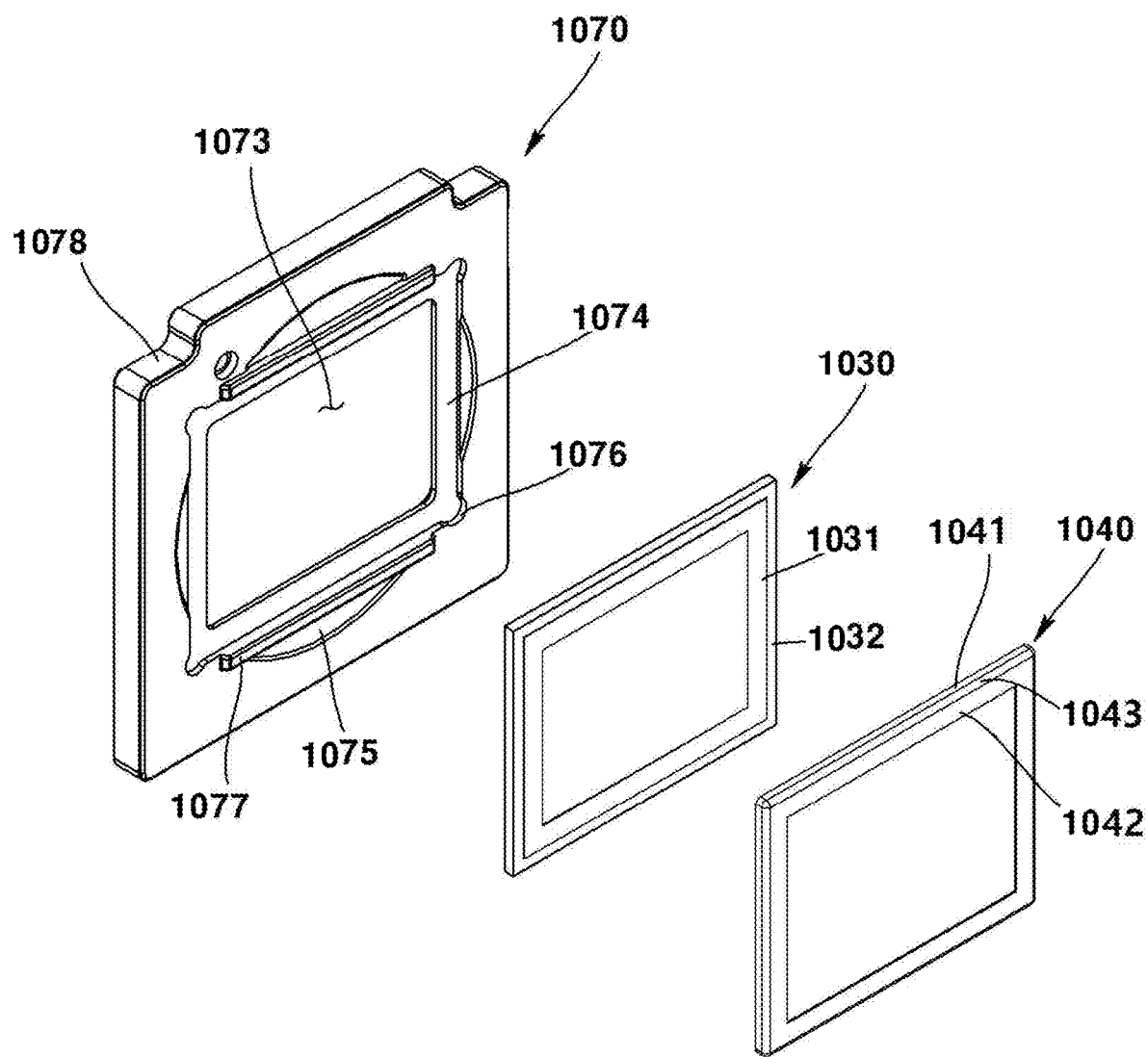
FIG. 28 is an exploded perspective view of some components of the camera device according to the embodiment.
Figure 29:
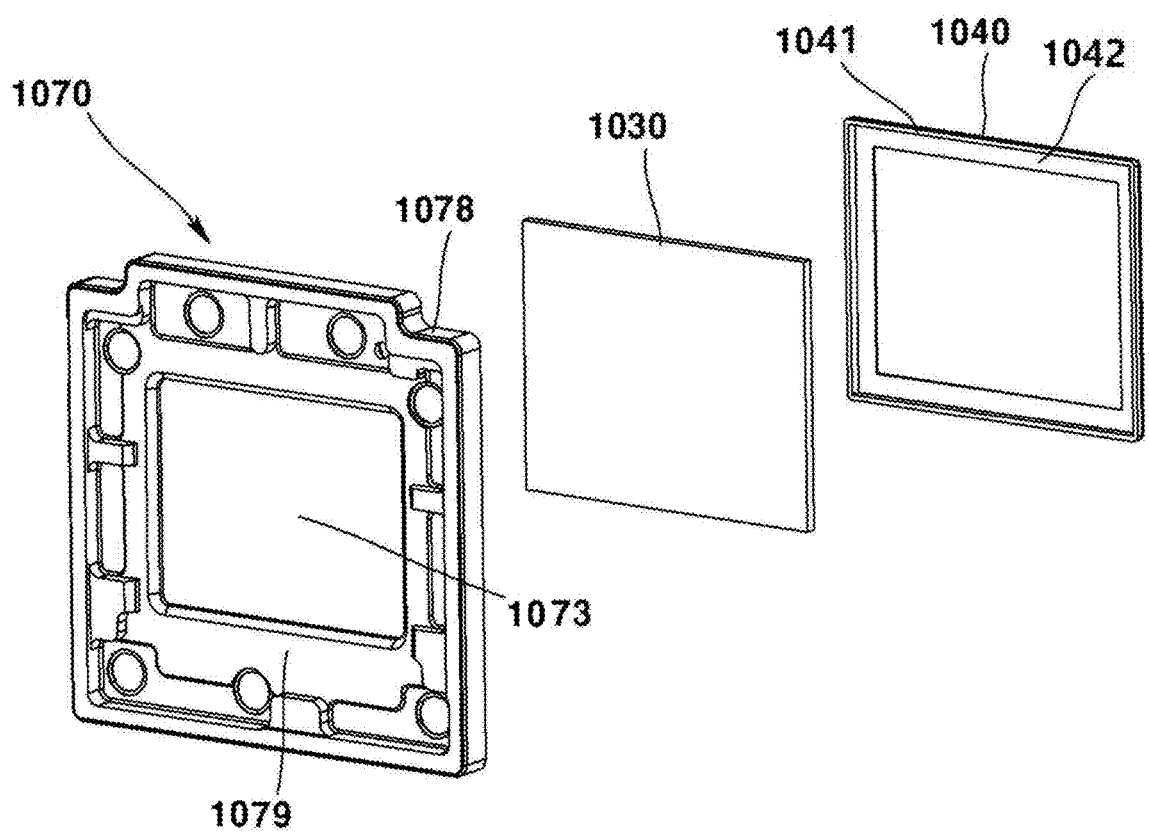
FIG. 29 is an exploded bottom perspective view of some components of the camera device according to the embodiment.
Figure 30:
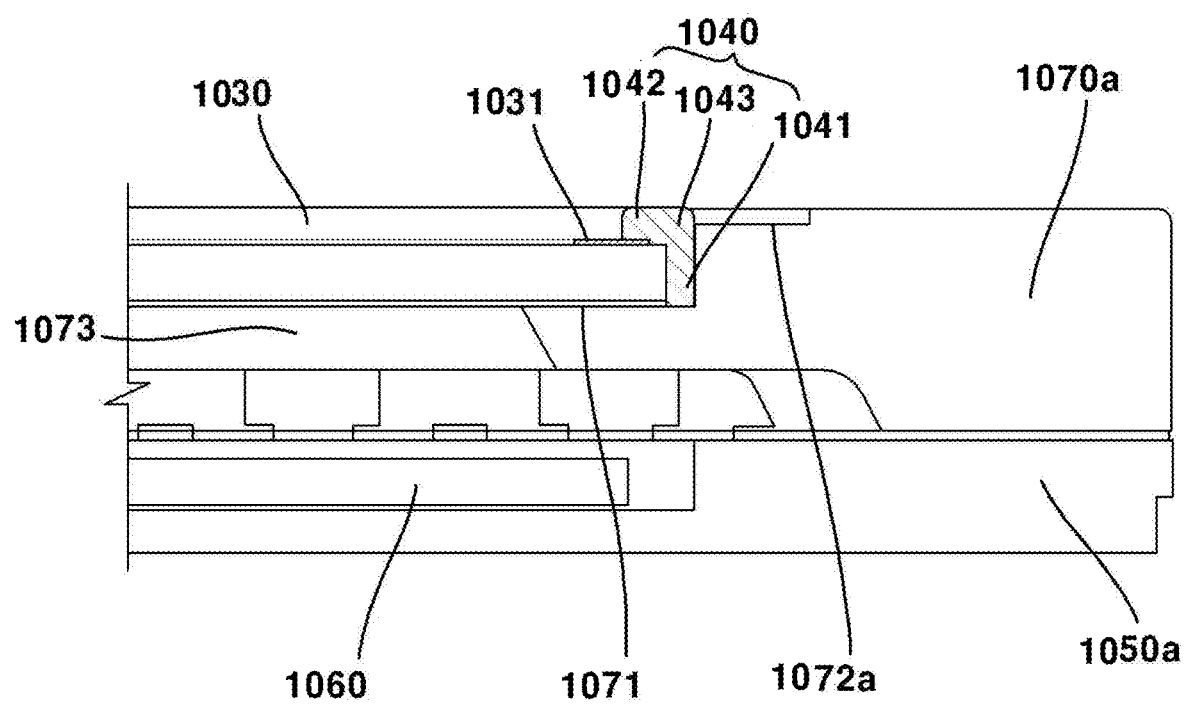
FIG. 30 is a cross-sectional view of some components of the camera device according to a modification.

FIG. 21 is a perspective view of a camera device 1010A according to another embodiment. FIG. 22 is an exploded perspective view of the camera device 1010A shown in FIG. 21. FIG. 23 is an exploded perspective view of a lens moving apparatus according to an embodiment. FIG. 24 is a perspective view of some components of the camera device 1010A according to the embodiment. FIG. 25 is a cross-sectional view taken along line A-A in FIG. 24. FIG. 26 is a cross-sectional view taken along line B-B in FIG. 24. FIG. 27 is a cross-sectional view taken along line C-C in FIG. 24. FIG. 28 is an exploded perspective view of some components of the camera device 1010A according to the embodiment. FIG. 29 is an exploded bottom perspective view of some components of the camera device 101A according to the embodiment. FIG. 30 is a cross-sectional view of some components of the camera device 1010A according to a modification.

The camera device 1010A may include a camera module.

The camera device 1010A may include a lens moving apparatus 1010. The lens moving apparatus may be a voice coil motor (VCM). The lens moving apparatus may be a lens moving motor. The lens moving apparatus may be a driving actuator. The lens moving apparatus may include an AF module. The lens moving apparatus may include an OIS module.

For example, the lens moving apparatus 1010 may be the lens moving apparatus 100 according to the embodiment described in connection with FIGS. 1 to 19, and the description of the lens moving apparatus 100 shown in FIGS. 1 to 19 may also be applied to the camera device 1010A shown in FIGS. 21 to 30. Furthermore, the description of the motion sensor 820 and the controller 830 shown in FIG. 20 may also be applied to the camera device 1010A shown in FIGS. 21 to 30, with or without modification.

The lens moving apparatus 1010 may include a stationary unit 1100. The stationary unit 1100 may be a unit to which a component or components, which do not move relative to an operation unit 1200 during an AF operation of the camera device 1010A, are coupled. The stationary unit 1100 may include a housing 1110 and magnets 1120. Here, a base 1400 and a cover 1500 may also be considered as the stationary unit 1100. The description of the stationary unit 1100 and the operation unit 1200 may also be applied to the lens moving apparatus 100 shown in FIG. 1.

The lens moving apparatus 1010 may include the housing 1110. The housing 1110 may be disposed outside a bobbin 1210. The housing 1110 may accommodate therein at least a portion of the bobbin 1210. The housing 1110 may be disposed in the cover 1500. The housing 1110 may be disposed between the cover 1500 and the bobbin 1210.

The housing 1110 may be made of a material different from that of the cover 1500. The housing 1110 may be made of an insulation material. The housing 1110 may be manufactured through injection molding.

The magnet 1120 may be disposed at the housing 1110. The housing 1110 may be coupled to the magnets 1120 using an adhesive. An upper elastic member 1310 may be coupled to the upper portion of the housing 1110. A lower elastic member 1320 may be coupled to the lower portion of the housing 1110. The housing 1110 may be coupled to the elastic member 1300 using heat fusion and/or an adhesive. The adhesive used to couple the housing 1110, the magnets 1120, the housing 1110 and the elastic member 1300 may be epoxy, which is hardened by at least one of ultraviolet (UV), heat and laser.

The lens moving apparatus 1010 may include the magnets 1120. The magnets 1120 may be disposed at the housing 1110. The magnets 1120 may be disposed between the bobbin 1210 and the housing 1110. The magnets 1120 may be disposed between the bobbin 1210 and the side plate 1520 of the cover 1500. The magnets 1120 may be disposed between a coil 1220 and the side plate 1520 of the cover 1500.

The magnets 1120 may face the coil 1220. The magnet 1120s may electromagnetically interact with the coil 1220. Each of the magnets 1120 may be disposed at the side portion between two adjacent corner portions of the housing 1110. Here, each of the magnets 1120 may be a flat plate magnet having the shape of a flat plate. In a modification, the magnets 1120 may be disposed at the corner portions of the housing 1110. Here, each of the magnets 1120 may be a corner magnet having a hexahedral form, in which the inner surface thereof is larger than the outer surface thereof.

The magnets 1120 may include a plurality of magnets. The magnets 1120 may include a total of four magnets. The magnets 1120 may include first to fourth magnets.

The lens moving apparatus 1010 may include the operation unit 1200. The operation unit 1200 may be a unit to which a component or components, which are moved relative to the stationary unit 1100, are coupled. The operation unit 1200 may include the bobbin 1210 and the coil 1220.

The lens moving apparatus 1010 may include the bobbin 1210. The bobbin 1210 may be disposed in the housing 1110. The bobbin 1210 may be disposed in the bore in the housing 1110. The bobbin 1110 may be movably coupled to the housing 1110. The bobbin 1210 may be moved relative to the housing 1110 in the optical-axis direction.

A lens may be coupled to the bobbin 1210. The lens may be coupled to the bobbin 1210 using threaded coupling and/or an adhesive. The coil 1220 may be coupled to the bobbin 1210. The upper elastic member 1310 may be coupled to the upper portion of the bobbin 1210. The lower elastic member 1320 may be coupled to the lower portion of the bobbin 1210. The bobbin 1210 may be coupled to the elastic member 1300 using heat fusion and/or an adhesive. The adhesive used to couple the lens to the bobbin 1210 and the bobbin 1210 to the elastic member 1300 may be epoxy, which is hardened by at least one of ultraviolet (UV), heat and laser.

The lens moving apparatus 1010 may include the coil 1220. The coil 1220 may be an "AF driving coil", which is used for AF operation. The coil 1220 may be disposed at the bobbin 1210. The coil 1220 may be disposed between the bobbin 1210 and the housing 1110. The coil 1220 may be disposed between the bobbin 1210 and the side plate 1520 of the cover 1500. The coil 1220 may be disposed on the outer lateral surface or the outer peripheral surface of the bobbin 1210.

The coil 1220 may be directly wound around the bobbin 1210. Alternatively, the coil 1220 may be coupled to the bobbin 1210 in the state of being wound alone. The coil 1220 may face the magnets 1120. The coil 1220 may be disposed so as to face the magnets 1120. The coil 1220 may electromagnetically interact with the magnets 1120. Here, when current flows through the coil 1220 and thus an electromagnetic field is formed around the coil 1220, the coil 1220 may be moved relative to the magnets 1120 by the electromagnetic interaction between the coil 1220 and the magnets 1120. The coil 1220 may be composed of a single coil. In a modification, the coil 1220 may include a plurality of coils, which are spaced apart from each other.

The coil 1220 may include a pair of lead wires for supplying power. Here, one end (a lead wire) of the coil 1220 may be connected to a first lower elastic unit, and the other end (the lead wire) of the coil 1220 may be connected to a second lower elastic unit. In other words, the coil 1220 may be conductively connected to the lower elastic member 1320.

The coil 1220 and the bobbin 1210 may be moved upwards along the optical axis when forward current is applied to the coil 1220, and may be moved downwards along the optical axis when reverse current is applied to the coil 1220. At the initial position, at which current is not applied to the coil 1220, the bobbin 1210 may be spaced apart from the upper plate 1510 of the cover 1500 with a first gap therebetween and from the base 1400 with a second gap therebetween.

The bobbin 1210 may be moved in the direction in which the first gap decreases when forward current is applied to the coil 1220, and the bobbin 1210 may be moved in the direction in which the second gap decreases when reverse current is applied to the coil 1220.

The lens moving apparatus 1010 may include the elastic member 1300. The elastic member 1300 may connect the housing 1110 to the bobbin 1210. The elastic member 1300 may be coupled both to the housing 1110 and to the bobbin 1210. The elastic member 1300 may movably support the bobbin 1210. The elastic member 1300 may elastically support the bobbin 1210. At least a portion of the elastic member 1300 may exhibit elasticity. The elastic member 1300 may support the movement of the bobbin 1210 during AF operation. Here, the elastic member 1300 may be an "AF support member".

The elastic member 1300 may include the upper elastic member 1310. The upper elastic member 1310 may be coupled both to the upper portion of the bobbin 1210 and to the upper portion of the housing 1110. The upper elastic member 1310 may be coupled to the upper surface of the bobbin 1210. The upper elastic member 1310 may be coupled to the upper surface of the housing 1110. The upper elastic member 1310 may be embodied as a leaf spring.

The upper elastic member 1310 may include an outer portion, which is coupled to the upper portion of the housing 1110. The upper elastic member 1310 may include an inner portion, which is coupled to the upper portion of the bobbin 1210. The upper elastic member 1310 may include a connector, connecting the outer portion to the inner portion. The connector may exhibit elasticity. Here, the connector may be referred to as an "elastic portion". The connector may be bent twice or more.

The elastic member 1300 may include the lower elastic member 1320. The lower elastic member 1320 may be coupled both to the lower portion of the bobbin 1210 and to the lower portion of the housing 1110. The lower elastic member 1320 may be coupled to the lower surface of the bobbin 1210. The lower elastic member 1320 may be coupled to the lower surface of the housing 1110. The lower elastic member 1320 may be embodied as a leaf spring.

The lower elastic member 1320 may include first and second lower elastic units. The first and second lower elastic units may be spaced apart from each other. The first and second lower elastic units may be conductively connected to the coil 1220. The first and second lower elastic units may be used as conductive lines for applying current to the coil 1220.

The lower elastic member 1320 may include an outer portion, which is coupled to the lower portion of the housing 1110. The lower elastic member 1320 may include an inner portion, which is coupled to the lower portion of the bobbin 1210. The lower elastic member 1320 may include a connector connecting the outer portion to the inner portion. The connector may exhibit elasticity. Here, the connector may be referred to as an "elastic portion". The connector may be bent twice or more. The lower elastic member 1320 may include a terminal member. The terminal member may extend from the outer portion. The terminal member may be integrally formed with the outer portion, and may be bent and then extend downwards. In a modification, the terminal member may be formed separately from the lower elastic member 1320. The terminal member may include two terminals. The terminal member may be coupled to the terminal of a printed circuit board 1050 through soldering.

The lens moving apparatus 1010 may include the base 1400. The base 1400 may be disposed under the housing 1110. The base 1400 may be disposed under the bobbin 1210. At least a portion of the base 1400 may be spaced apart from the bobbin 1210. The base 1400 may be coupled to the side plate 1520 of the cover 1500.

The lens moving apparatus 1010 may include the cover 1500. The cover 1500 may include a "cover can". The cover 1500 may be disposed so as to surround the housing 1110. The cover 1500 may be coupled to the base 1400. The cover 1500 may be accommodated in the housing 1110. The cover 1500 may define the appearance of the lens moving apparatus 1010. The cover 1500 may have a hexahedral form, which is open at the lower surface thereof. The cover 1500 may be nonmagnetic. The cover 1500 may be made of metal. The cover 1500 may be made of a metal plate. The cover 1500 may be connected to the ground portion of the printed circuit board. Consequently, the cover 1500 may be grounded. The cover 1500 may block electromagnetic interface (EMI). Here, the cover 150 may be referred to as an "EMI shield can".

The cover 1500 may include the upper plate 1510 and the side plate 1520. The cover 1500 may include the upper plate 1510, having the bore therein, and the side plate 1520, extending downwards from the outer periphery or the edge of the upper plate 1510. The lower end of the side plate 1520 of the cover 1500 may be disposed at a stepped portion of the base 1400. The inner surface of the side plate 1520 of the cover 1500 may be fixed to the base 1400 using an adhesive.

The side plate 1520 of the cover 1500 may include a plurality of side plates. The plurality of side plates may include first to fourth side plates. The side plates 1520 of the cover 1500 may include the first and second side plates, which are disposed opposite each other, and the third and fourth side plates, which are disposed opposite each other between the first and second side plates.

The camera device 1010A may include a lens module 1020. The lens module 1020 may include at least one lens. The lens module 1020 may include a plurality of lenses. The lens may be spaced apart from an image sensor 1060. The lens may be disposed at a position corresponding to the image sensor 1060. The lens may be disposed above the image sensor 1060. The lens module 1020 may include the lens and a barrel. The lens module 1020 may be coupled to the bobbin 1210 of the lens moving apparatus 1010. The lens module 1020 may be coupled to the bobbin 1210 using threaded coupling and/or an adhesive. The lens module 1020 may move together with the bobbin 1210.

The camera device 1010A may include a filter 1030. The filter 1030 may serve to inhibit a specific frequency band of light, which passes through the lens module 1020, from entering the image sensor 1060. The filter 1030 may include an infrared filter. The infrared filter may inhibit light of an infrared band from entering the image sensor 1060. The filter 1030 may be disposed so as to be parallel to the x-y plane. The filter 1030 may be disposed between the image sensor 1060 and the lens. The filter 1030 may be disposed at a sensor base 1070. The filter 1030 may be coupled to the sensor base 1070. In a modification, the filter 1030 may also be disposed at the base 1400.

The upper surface of the filter 1030 may include a first region 1032 between a light-blocking member 1031 and the outer periphery of the upper surface of the filter 1030. The first region 1032 may be a region corresponding to the gap between the light-blocking member 1031 and the outer edge of the filter 1030. An adhesive may be disposed in the first region 1032. The first region 1032 may be a portion of the upper surface of the filter 1030. In a modification, the first region 1032 may be a portion of the lower surface of the filter 1030. The first region 1032 may be a portion of the upper surface and a portion of the lower surface of the filter 1030. The first region 1032 may be a portion of one surface of the filter 1030.

The camera device 1010A may include the light-blocking member 1031. The light-blocking member 1031 may be considered a component of the filter 1030. The light-blocking member 1031 may have light-blocking ability. The light-blocking member 1031 may be made of black ink. The light-blocking member 1031 may include a black mask. The light-blocking member 1031 may be disposed on at least a portion of the upper surface of the filter 1030. In a modification, the light-blocking member 1031 may be disposed on at least a portion of the lower surface of the filter 1030. The light-blocking member 1031 may be disposed both on the upper surface and on the lower surface of the filter 1030. The light-blocking member 1031 may be disposed on one surface of the filter 1030.

The light-blocking member 1031 may be spaced apart from the outer periphery of the upper surface of the filter 1030. The black mask may be spaced apart from the outer periphery of the upper surface of the filter 1030. In other words, a gap may be defined between the light-blocking member 1031 and the outer periphery of the filter 1030. For example, the filter 1030 may be manufactured in such a way as to form the light-blocking member 1031 and then to cut the light-blocking member 1031 into individual filters 1030. Here, if the light-blocking member 1031 is formed up to the outer periphery of the filter 1030, the light-blocking member 1031 may break during the cutting procedure. Meanwhile, when the light-blocking member 1031 is intended to be formed up to the outer periphery of the filter 1030 in the case in which individual filters 1030 are prepared through cutting in advance and the light-blocking members 1031 are formed at the filters 1030, there is a problem in that it becomes impossible to inhibit a phenomenon in which the light-blocking member 1031, which is made of flowable ink, flows downwards along the side surface of the filter 1030 during the process of applying the light-blocking member. The light-blocking member 1031 may be spaced apart from both the longer sides and the shorter sides of the upper surface of the filter 1030 by the same distance. In a modification, the light-blocking member 1031 may be spaced apart from the longer sides of the upper surface of the filter 1030 by a distance longer than the distance from the shorter sides of the upper surface of the filter 1030. In contrast, the light-blocking member 1031 may be spaced apart from the shorter sides of the upper surface of the filter 1030 by a distance longer than the distance from the longer sides of the upper surface of the filter 1030.

The camera device 1010A may include an adhesive 1040. The camera device 1010A may include a light-blocking adhesive 1040. The adhesive 1040 may attach the filter 1030 to the sensor base 1070. The adhesive 1040 may have a light-blocking property. The adhesive 1040 may include black epoxy. The light-blocking adhesive 1040 may include at least one of black resin, black adhesive, and light-blocking adhesive. The adhesive 1040 may be disposed between the side surface of the filter 1030 and the sensor base 1070. The adhesive 1040 may be disposed in the first region 1032 on the upper surface of the filter 1030. At least a portion of the adhesive 1040 may be disposed in the first region 1032 of the filter 1030. Light-blocking epoxy may be disposed in the first region 1032 of the upper surface of the filter between the black mask and the outer periphery of the upper surface of the filter 1030. The adhesive 1040 may be connected to the light-blocking member 1031. The adhesive 1040 may project above the upper surface of the filter 1030. The adhesive 1040 may project upwards further than the upper surface of the filter 1030. The adhesive 1040 may be disposed on the upper surface and the side surface of the filter 1030.

In the embodiment, the adhesive 1040 may be disposed at the entire periphery of the filter 1030. The adhesive 1040 may be disposed along the entire periphery of the filter 1030. The adhesive 1040 may be continuously disposed along the outer periphery of the filter 1030. In a modification, the adhesive 1040 may be intermittently disposed along the outer periphery of the filter 1030. For example, the adhesive 1040 may be disposed only at the side portions of the filter 1030, but not at the corner portions of the filter 1030. That is, the adhesive may not be disposed at the four corners of the filter 1030 but may be disposed only at the four sides of the filter 1030. Here, the adhesive 1040 may be continuously disposed at the four side walls of the filter 1030, or may be divided into a plurality of adhesives, which are disposed so as to be spaced apart from each other.

In a further modification, the adhesive 1040 may be disposed only at one side of the filter 1030. Alternatively, the adhesive 1040 may be disposed both on one side of the filter 1030 and on another side of the filter 1030, which is positioned opposite the one side of the filter 1030. The adhesive 1040 may be disposed only at the corners of the filter 1030.

In the embodiment, the adhesive 1040 may cover at least a portion of the light-blocking member 1031 such that the adhesive 1040 overlaps the light-blocking member 1031 in a direction parallel to the optical axis. The adhesive 1040, the light-blocking member 1031, the filter 1030, and the sensor base 1070 may be sequentially disposed in a direction parallel to the optical axis.

The adhesive 1040 may include first to third portions 1041, 1042 and 1043. The first portion 1041 may be disposed on a side surface of the filter 1030. The second portion 1042 may be disposed in the first region on the upper surface of the filter 1030. The third portion 1043 may connect the first portion 1041 to the second portion 1042. Although the adhesive 1040 has been described as being divided into the first to third portions 1041, 1042 and 1043, the adhesive 1040 may be integrally formed.

The embodiment may aim to inhibit flare by blocking light incident through a side surface of the filter 1030. In a comparative example, light that has passed through the lens may collide with the inner surface of the sensor base 1070, which faces the side surface of the filter 1030, and may then pass through the side surface of the filter 1030. Subsequently, the light may be reflected by the bottom surface of the sensor base 1070, on which the lower surface of the filter 1030 is disposed, and by the light-blocking member 1031, and may enter the image sensor 1060. Hence, flaring may occur. In other words, in the comparative example, the light may be reflected by the light-blocking member 1031 of the filter 1030 and may then enter the image sensor 1060, thereby causing the occurrence of flaring. In the embodiment, black epoxy may be applied to the outer periphery of the filter 1030 so as to block the light that is incident through the side surface of the filter 1030. Here, the black epoxy may cover the entire gap between the black mask and the outer periphery of the filter 1030. The epoxy is an example of the adhesive 1040. The adhesive 1040 may cover the entire side surface of the filter 1030. In order to inhibit interference with the lens, the height of the adhesive 1040 may be controlled to be 40 µm or less.

In the embodiment, since the outer periphery of the filter 1030 is covered by the adhesive 1040, it is possible to reduce the transmission of contaminants to the filter 1030. In other words, the adhesive 1040 may block the introduction of contaminants into the filter 1030. The adhesive 1040 may be viscous. The adhesive 1040 may collect contaminants by virtue of the high viscosity thereof. In other words, the adhesive 1040 may serve as a dust trap. Accordingly, the embodiment is able to obtain an effect of reducing the incidence of spots on an image.

In the embodiment, the adhesive 1040 may be disposed only on the side surface and the upper surface of the filter 1030. In other words, the adhesive 1040 may not be disposed on the lower surface of the filter 1030. When an excessive amount of adhesive 1040 is applied to the bottom surface of the sensor base 1070 in order to dispose the adhesive 1040 between the lower surface of the filter 1030 and the sensor base 1070, the adhesive 1040 may penetrate into the filter 1030 due to the followability of the adhesive 1040. In a modification, the adhesive 1040 may also be disposed on the lower surface of the filter 1030.

The camera device 1010A may include the printed circuit board (PCB) 1050. The printed circuit board 1050 may be a board or a circuit board. The lens moving apparatus 1010 may be disposed at the printed circuit board 1050. In a modification, the sensor base may be disposed between the printed circuit board 1050 and the lens moving apparatus 1010. The printed circuit board 1050 may be conductively connected to the lens moving apparatus 1010. The terminal member of the lower elastic member 1320 of the lens moving apparatus 1010 may be soldered to the printed circuit board 1050. The image sensor 1060 may be disposed at the printed circuit board 1050. The printed circuit board 1050 may be provided with various circuits, devices, controllers and the like, which are configured to convert an image formed on the image sensor 1060 into an electric signal and transmit the converted electric signal to an external device.

The camera device 1010A may include a connector 1051. The connector 1051 may be conductively connected to the printed circuit board 1050. The connector 1051 may include a port, which is to be conductively connected to an external device. The connector 1051 may be connected to the printed circuit board 1050 via the connecting board 1052. The connecting board 1052 may include a flexible printed circuit board (FPCB).

The camera device 1010A may include the image sensor 1060. Light that has passed through the lens and the filter 1030 may be incident on the image sensor 1060, thereby forming an image on the image sensor. The image sensor 1060 may be disposed at the printed circuit board 1050. The image sensor 1060 may be mounted on the printed circuit board 1050. The image sensor 1060 may be conductively connected to the printed circuit board 1050.

For example, the image sensor 1060 may be coupled to the printed circuit board 1050 using Surface-Mounting Technology (SMT). Alternatively, the image sensor 1060 may be coupled to the printed circuit board 1050 using flip-chip technology.

The image sensor 1060 may be disposed such that the lens coincides with the optical axis. In other words, the optical axis of the image sensor 1060 may be aligned with the optical axis of the lens. The image sensor 1060 may convert light, incident on the effective image region of the image sensor 1060, into an electric signal. The image sensor 1060 may be any one of a charge-coupled device (CCD), a metal oxide semiconductor (MOS), a CPD and a CID.

The camera device 1010A may include the sensor base 1070. The sensor base 1070 may be disposed at the printed circuit board 1050. The sensor base 1070 may be disposed between the lens moving apparatus 1010 and the printed circuit board 1050. The sensor base 1070 may be provided with the filter 1030. The portion of the sensor base 1070, at which the filter 1030 is disposed, may have formed therethrough a bore 1073 so as to allow the light having passed through the filter 1030 to be incident on the image sensor 1060.

The upper surface of the sensor base 1070 may include a first surface 1071, on which the lower surface of the filter 1030 is disposed. The upper surface of the sensor base 1070 may include a second surface 1072, which is disposed outside the first surface 1071 and at a higher level than the first surface 1071. Here, the upper surface of the filter 1030 may be disposed at a lower level than the second surface 1072 of the sensor base 1070. The adhesive 1040 may be disposed at the same level as the second surface 1072 of the sensor base 1070, or may project further than the second surface 1072 of the sensor base 1070. In a modification, the upper surface of the filter 1030 may be disposed at the same level as the second surface 1072 of the sensor base 1070. The upper surface of the filter 1030 may be disposed at a higher level than the second surface 1072 of the sensor base 1070.

The sensor base 1070 may include a first groove 1074. The first groove 1074 may be a filter-seating groove. The filter 1030 may be disposed in the first groove 1074. The first groove 1074 may be configured to have a shape corresponding to the filter 1030. The first groove 1074 may be deeper than a second groove 1075. In a modification, the bottom surface of the first groove 1074 may be positioned at a higher level than the bottom surface of the second groove 1075.

The sensor base 1070 may include the second groove 1075. The second groove 1075 may be a side groove, which is formed beside the first groove 1074. The second groove 1075 may be configured so as to have a curvature at at least a portion thereof. The second groove 1075 may be disposed outside the first groove 1074. The second groove 1075 may be depressed to a depth less than that of the first groove 1074. Consequently, the upper surface of the sensor base 1070 and the bottom surface of the second groove 1075 may define a step therebetween, and the bottom surface of the second groove 1075 and the bottom surface of the first groove 1074 may define a step therebetween. In other words, the upper surface of the sensor base 1070 may include a two-stepped structure. The second groove 1075 may include a plurality of grooves. The second grooves 1075 may be formed at positions corresponding to the four side surfaces of the first groove 1074.

The sensor base 1070 may include a third groove 1076. The third groove 1076 may be a corner groove formed in a corner of the first groove 1074. The third groove 1076 may be configured so as to have a curvature at at least a portion thereof. The third groove 1076 may be formed in a corner of the first groove 1074. The third groove 1076 may be depressed to the same depth as the first groove 1074. The adhesive 1040 may be disposed in the third groove 1076. The adhesive 1040 may be injected through the third groove 1076. The third groove 1076 may include a plurality of grooves. The third grooves 1076 may be respectively formed in the four corners of the first groove 1074.

The sensor base 1070 may include a protrusion 1077. The protrusion 1077 may be formed between the first groove 1074 and the second groove 1075. The protrusion 1077 may project further than the upper surface of the sensor base 1070. The protrusion 1077 may be disposed at a position corresponding to the longer side of the image sensor 1060. The protrusion 1077 may include a plurality of protrusions. The protrusion 1077 may include two protrusions. Here, the image sensor 1060 may be disposed between the two protrusions. The upper surfaces of the protrusions 1077 may be positioned at a higher level than the upper surface of the image sensor 1060.

The sensor base 1070 may include a fourth groove 1078. The fourth groove 1078 may be an escape groove. The fourth groove 1078 may be formed in the outer lateral surface of the sensor base 1070. The fourth groove 1078 may be a groove through which the terminal member of the lower elastic member 1320 extends without interference. The fourth groove 1078 may include two grooves corresponding to two terminal members of the lower elastic member 1320.

The sensor base 1070 may include a fifth groove 1079. The fifth groove 1079 may be a lower groove formed in the lower surface of the sensor base 1070. The fifth groove 1079 may be formed in the lower surface of the sensor base 1070. A space may be defined between the sensor base 1070 and the printed circuit board 1050 by virtue of the fifth groove 1079. Components such as the image sensor 1060 and the capacitor may be disposed in the space defined between the sensor base 1070 and the printed circuit board 1050.

The camera device 1010A may include a first adhesive 1081. The first adhesive 1081 may fix the lens moving apparatus 1010 to the sensor base 1070. The first adhesive 1081 may include at least one of epoxy, thermohardening adhesive, and ultraviolet-hardening adhesive. The first adhesive 1081 may be used in alignment of the image sensor 1060 with the lens coupled to the lens moving apparatus 1010. Specifically, the first adhesive 1081 may be used for active alignment (AA).

The camera device 1010A may include a second adhesive 1082. The second adhesive 1082 may fix the sensor base 1070 to the printed circuit board 1050. The second adhesive may include at least one of epoxy, thermohardening adhesive, and ultraviolet-hardening adhesive.

The camera device 1010A may include motion sensor. The motion sensor may be mounted on the printed circuit board 1050. The motion sensor may be conductively connected to the controller through the circuit pattern formed on the printed circuit board 1050. The motion sensor may output information about a rotational angular speed of motion of the camera device 1010A. The motion sensor may include a dual-axis or triple-axis gyro sensor or an angular speed sensor.

The camera device 1010A may include the controller. The controller may be disposed on the printed circuit board 1050. The controller may be conductively connected to the coil 1220 of the lens moving apparatus 1010. The controller may individually control the direction, the intensity, the amplitude and the like of the current supplied to the coil 1220. The controller may control the lens moving apparatus 1010 to perform an autofocus function and/or a handshake correction function. Furthermore, the controller may perform autofocus feedback control and/or handshake correction feedback control for the lens moving apparatus 1010.

In a modification shown in FIG. 30, the shapes of the printed circuit board 1050a and the sensor base 1070a may be changed to as to be different from the embodiment. The printed circuit board 1050a may have a groove formed in the upper surface thereof, and the image sensor 1060 may be disposed in the groove in the printed circuit board 1050a. The sensor base 1070a may include the first surface 1071, at which the filter 1030 is disposed, and the second surface 1072, which is disposed outside the first surface 1071 and at a higher level than the first surface 1071. Here, the upper surface of the filter 1030 may be disposed at a level that is higher than the first surface 1071 of the sensor base 1070 but is lower than the second surface 1072 of the sensor base 1070. The adhesive 1040 may project upwards above the second surface 1072 of the sensor base 1070.

Heretofore, the case in which the lens moving apparatus 1010 is an AF module has been described with reference to FIGS. 21 to 23. However, the lens moving apparatus 1010 may be an OIS module in a modification. In a modification, the lens moving apparatus 1010 may include the housing 1110, the magnet 1120, the bobbin 1210, the coil 1220, the upper elastic member 1310, the lower elastic member 1320, the base 1400 and the cover 1500. The lens moving apparatus 1010 may further include the board disposed at the base 1400, the OIS coil formed at the board so as to face the magnet 1120, and a plurality of wires connecting the upper elastic member 1310 to the board.

The lens moving apparatus according to the embodiment may be included in an optical instrument, which is designed to form the image of an object in a space using reflection, refraction, absorption, interference, diffraction or the like, which are characteristics of light, to extend eyesight, to record an image obtained through a lens or to reproduce the image, to perform optical measurement, or to propagate or transmit an image. For example, although the optical instrument according to the embodiment may be a mobile phone, cellular phone, smart phone, portable smart instrument, digital camera, laptop computer, digital broadcasting terminal, PDA (Personal Digital Assistant), PMP (Portable Multimedia Player), navigation device, or the like, the disclosure is not limited thereto. Furthermore, any device capable of taking images or photographs is possible.

Figure 31:
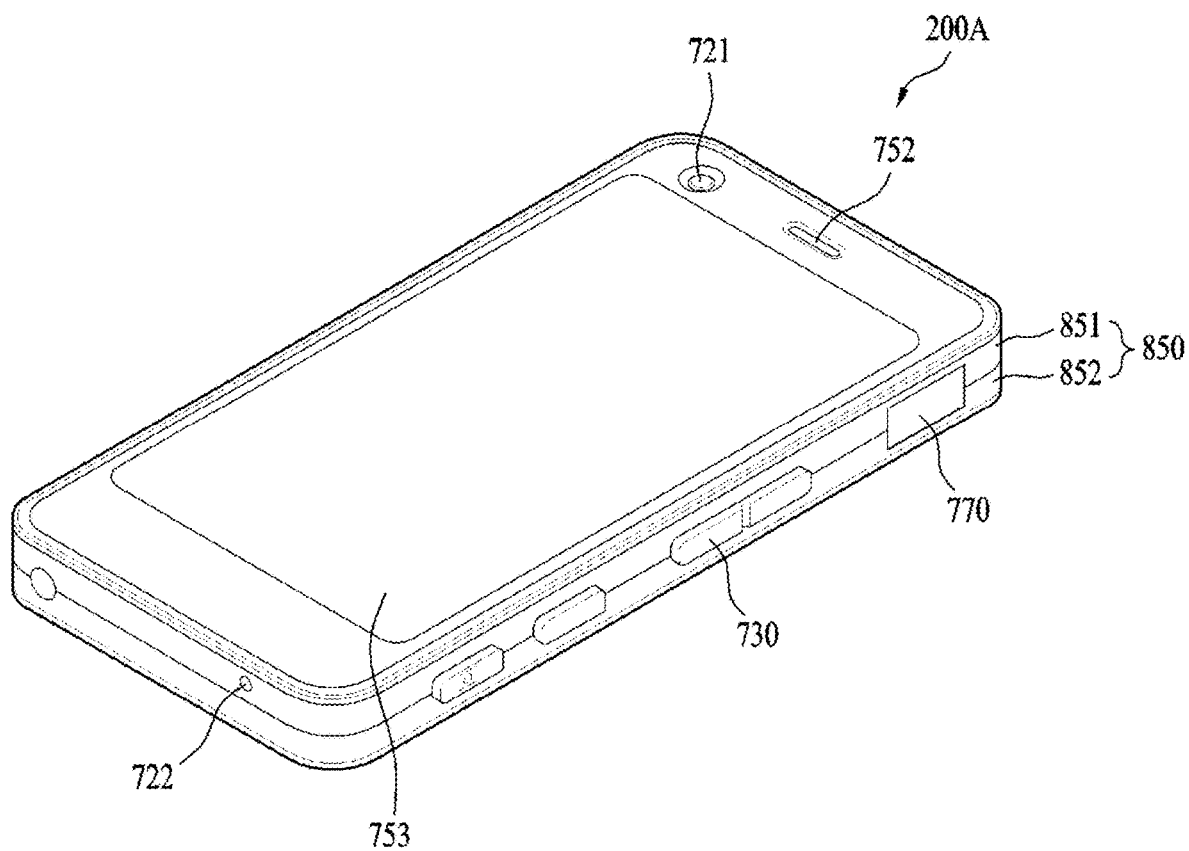
FIG. 31 is a perspective view of a portable terminal according to an embodiment.
Figure 32:
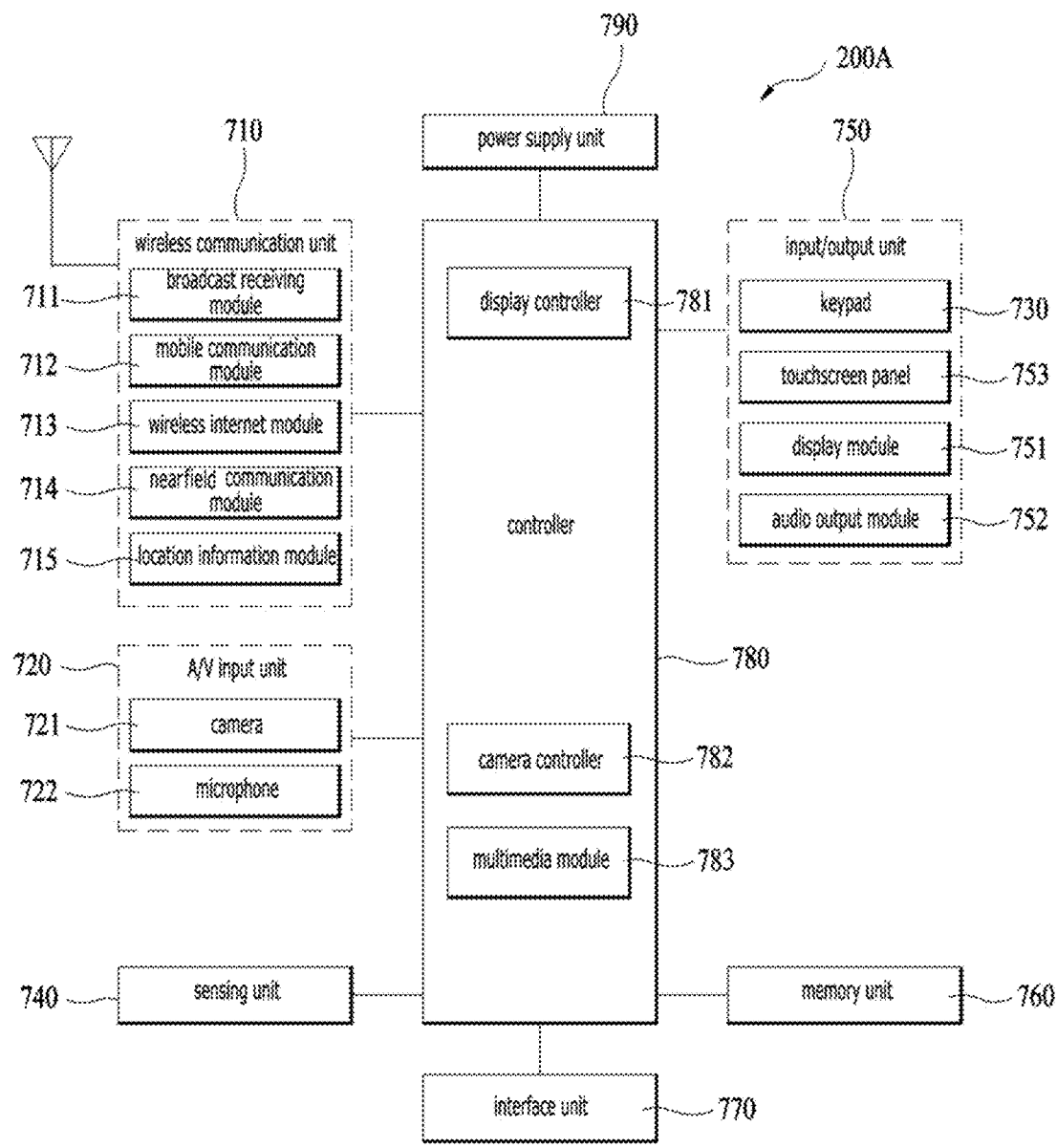
FIG. 32 is a view illustrating the configuration of the portable terminal illustrated in FIG. 31.

FIG. 31 is a perspective view illustrating a portable terminal 200A according to an embodiment. FIG. 32 is a view illustrating the configuration of the portable terminal illustrated in FIG. 31.

Referring to FIGS. 31 and 32, the portable terminal 200A (hereinafter referred to as a "terminal") may include a body 850, a wireless communication unit 710, an audio/video (A/V) input unit 720, a sensing unit 740, an input/output unit 750, a memory unit 760, an interface unit 770, a controller 780, and a power supply unit 790.

The body 850 illustrated in FIG. 31 has a bar shape, without being limited thereto, and may be any of various types, such as, for example, a slide type, a folder type, a swing type, or a swivel type, in which two or more sub-bodies are coupled so as to be movable relative to each other.

The body 850 may include a case (a casing, housing, cover or the like) defining the external appearance of the terminal. For example, the body 850 may be divided into a front case 851 and a rear case 852. Various electronic components of the terminal may be accommodated in the space defined between the front case 851 and the rear case 852.

The wireless communication unit 710 may include one or more modules, which enable wireless communication between the terminal 200A and a wireless communication system or between the terminal 200A and a network in which the terminal 200A is located. For example, the wireless communication unit 710 may include a broadcast-receiving module 711, a mobile communication module 712, a wireless Internet module 713, a nearfield communication module 714, and a location information module 715.

The A/V input unit 720 serves to input audio signals or video signals, and may include, for example, a camera 721 and a microphone 722.

The camera 721 may include the camera module 200 or 1010A according to the embodiment.

The sensing unit 740 may sense the current state of the terminal 200A, such as, for example, the opening or closing of the terminal 200A, the location of the terminal 200A, the presence of a user's touch, the orientation of the terminal 200A, or the acceleration/deceleration of the terminal 200A, and may generate a sensing signal to control the operation of the terminal 200A. When the terminal 200A is, for example, a slide-type cellular phone, the sensing unit 740 may sense whether the slide-type cellular phone is opened or closed. Furthermore, the sensing unit 740 may sense the supply of power from the power supply unit 790, coupling of the interface unit 770 to an external device, and the like.

The input/output unit 750 serves to generate, for example, visual, audible, or tactile input or output. The input/output unit 750 may generate input data to control the operation of the terminal 200A, and may display information processed in the terminal 200A.

The input/output unit 750 may include a keypad unit 730, a display module 751, a sound output module 752, and a touchscreen panel 753. The keypad unit 730 may generate input data in response to input on a keypad.

The display module 751 may include a plurality of pixels, the color of which varies depending on the electrical signals applied thereto. For example, the display module 751 may include at least one among a liquid crystal display, a thin-film transistor liquid crystal display, an organic light-emitting diode, a flexible display and a 3D display.

The sound output module 752 may output audio data received from the wireless communication unit 710 in, for example, a call-signal reception mode, a call mode, a recording mode, a voice recognition mode, or a broadcast reception mode, or may output audio data stored in the memory unit 760.

The touchscreen panel 753 may convert variation in capacitance, caused by a user's touch on a specific region of a touchscreen, into electrical input signals.

The memory unit 760 may temporarily store programs for the processing and control of the controller 780, and input/output data (for example, telephone numbers, messages, audio data, stationary images, moving images and the like). For example, the memory unit 760 may store images captured by the camera 721, for example, pictures or moving images.

The interface unit 770 serves as a path through which the lens moving apparatus is connected to an external device connected to the terminal 200A. The interface unit 770 may receive power or data from the external component, and may transmit the same to respective constituent elements inside the terminal 200A, or may transmit data inside the terminal 200A to the external component. For example, the interface unit 770 may include a wired/wireless headset port, an external charger port, a wired/wireless data port, a memory card port, a port for connection to a device equipped with an identification module, an audio input/output (I/O) port, a video input/output (I/O) port, an earphone port and the like.

The controller 780 may control the general operation of the terminal 200A. For example, the controller 780 may perform control and processing related to, for example, voice calls, data communication, and video calls.

For example, the controller 780 may include a display controller 781 for controlling the display module 753. For example, the controller 780 may include a camera controller 782 for controlling the camera 721.

The controller 780 may include a multimedia module 783 for multimedia playback. The multimedia module 783 may be embodied in the controller 780, or may be embodied separately from the controller 180.

The controller 780 may perform a pattern recognition process capable of recognizing writing input or drawing input carried out on a touch screen as a character and an image, respectively.

In place of the controller 830 of the camera module 200, the controller 780 of the optical device 200A may send a clock signal SCL, a data signal SDA and power signals VDD and GND for I2C communication with the first and second position sensors 170 and 240, and may receive the clock signal SCL and the data signal SDA from the first and second position sensors 170 and 240.

The power supply unit 790 may supply power required to operate the respective constituent elements upon receiving external power or internal power under the control of the controller 780.

Figure 33A:
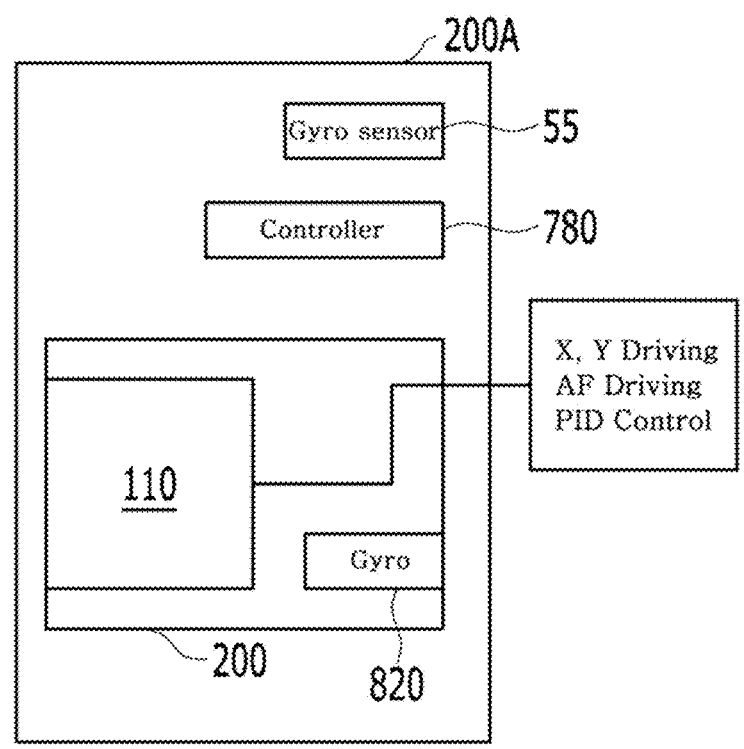
FIG. 33A is a block diagram of a portable terminal according to an embodiment.

FIG. 33A is a block diagram of a portable terminal 200A according to an embodiment.

Referring to FIG. 33A, the camera module 200 may include the motion sensor, for example, the gyro sensor 820, but may not include the controller.

The portable terminal 200A may include the controller 780, and may further include an additional gyro sensor 55, in addition to the gyro sensor 820 of the camera module 200.

Each of the first position sensor 170, the first sensor 240a, and the second sensor 240b may be embodied as a driver IC including a Hall sensor.

The driver of each of the first position sensor 170, the first sensor 240a and the second sensor 240b of the camera module 200 may perform data communication, for example, I2C communication, with the controller 780 of the portable terminal 200A.

The driver of each of the first position sensor 170, the first sensor 240a and the second sensor 240b of the camera module 200 may include an analog-to-digital converter, configured to convert the output of the Hall sensor (for example, 61A, 61B and 61C) into a digital signal.

The driver of each of the first position sensor 170, the first sensor 240a, and the second sensor 240b of the camera module 200 may include a PID controller for performing phase compensation and/or gain compensation for a digital signal of the output from the Hall sensor based on the result of data communication (referred to as "PID control").

For example, the driver of the first position sensor 170 may create a first drive signal based on the output of the PID controller of the first position sensor 170, and may provide the first drive signal to the first coil 120 (referred to as "AF-Driving").

For example, the driver of the first sensor 240a may create a second drive signal based on the output of the PID controller of the first sensor 240a, and may provide the second drive signal to the coil units 230-1 and 230-3 for the x-axis direction (referred to as "X-Driving").

The driver of the second sensor 240b may create a third drive signal based on the output of the PID controller of the second sensor 240b, and may provide the third drive signal to the coil units 230-2 and 230-4 for the y-axis direction (referred to as "Y-Driving").

Figure 33B:
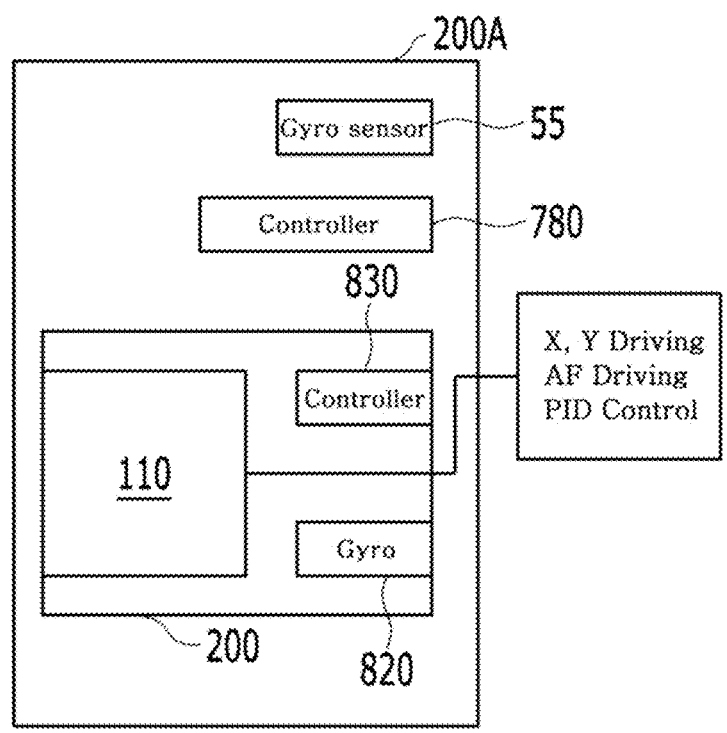
FIG. 33B is a block diagram of a portable terminal according to another embodiment.

FIG. 33B is a block diagram of a portable terminal 200A according to another embodiment.

Referring to FIG. 33B, the camera module 200 may include the motion sensor, for example the gyro sensor 820. The portable terminal 200A may include an additional gyro sensor 55, in addition to the gyro sensor 820 of the camera module 200.

The portable terminal 200A may include the controller 780, and may further include an additional controller 830, in addition to the controller 780 of the portable terminal 200A.

The driver of each of the first position sensor 170, the first sensor 240a and the second sensor 240b of the camera module 200 may perform data communication, for example, I2C communication, with the controller 820 of the camera module 200 and/or the controller 780 of the portable terminal 200A.

The "PID control", "AF-Driving", X-Driving" and "Y-Driving" mentioned in FIG. 33A may be applied to FIG. 33B, with or without modification.

In an embodiment in which the lens moving apparatus 1010 is an OIS module, the description of FIGS. 33A and 33B may be applied to the camera device 1010A shown in FIG. 21, with or without modification.

The features, configurations, effects and the like described above in the embodiments are included in at least one embodiment, but the invention is not limited only to the embodiments. In addition, the features, configurations, effects and the like exemplified in the respective embodiments may be combined with other embodiments or modified by those skilled in the art. Accordingly, content related to these combinations and modifications should be construed as falling within the scope of the disclosure.

INDUSTRIAL APPLICABILITY

The embodiments are applicable to a lens moving apparatus, a camera module, and an optical device, which are capable of increasing the length of the support member without increasing the height thereof and thus of improving reliability and reducing power consumption.

The invention claimed is:

1. A lens moving apparatus comprising:
a housing;
a bobbin disposed in the housing;
a magnet disposed on the housing;
a first coil disposed on the bobbin and configured to move the bobbin by an interaction with the magnet;
a sensing magnet disposed on the bobbin;
a first position sensor disposed on the housing so as to correspond to the sensing magnet;
a second coil disposed under the magnet;
a circuit board comprising a first terminal and a second terminal; and
a second position sensor including first and second sensors conductively connected to the circuit board,
wherein each of the first position sensor and the first and second sensors is a driver IC including a Hall sensor and a driver,
wherein the first terminal of the circuit board is provided with a clock signal and the second terminal of the circuit board is provided with a data signal,
wherein the driver of each of the first position sensor, the first sensor, and the second sensor transmits and receives the clock signal through the first terminal of the circuit board, and transmits and receives the data signal through the second terminal of the circuit board.

2. The lens moving apparatus according to claim 1, wherein the data signal includes a first data signal for the first position sensor, a second data signal for the first sensor, and a third data signal for the second sensor, and wherein the first data signal, the second data signal, and the third data signal are transmitted and received through the second terminal in a time-division manner.

3. The lens moving apparatus according to claim 1, wherein the circuit board comprises third and fourth terminals, and wherein the driver of each of the first position sensor, the first sensor, and the second sensor is provided with a power signal through the third and fourth terminals.

4. The lens moving apparatus according to claim 3, wherein the power signal includes a first voltage, which is supplied to the third terminal, and a second voltage, which is supplied to the fourth terminal and is higher than the first voltage.

5. The lens moving apparatus according to claim 1, wherein the driver of each of the first position sensor, the first sensor, and the second sensor uses data communication using a protocol, and wherein, in the data communication, the drivers of the first position sensor, the first sensor, and the second sensor are identified by different addresses, and the data signal is transmitted and received to and from one of the first position sensor, the first sensor, and the second sensor based on the different addresses.

6. The lens moving apparatus according to claim 1, wherein the magnet includes a first magnet and a second magnet, and the second coil includes a first coil unit corresponding to the first magnet and a second coil unit corresponding to the second magnet.

7. The lens moving apparatus according to claim 6, wherein the driver of the first sensor provides the first coil unit with a first drive signal, and the driver of the second sensor provides the second coil unit with a second drive signal.

8. The lens moving apparatus according to claim 7, wherein the driver of the first sensor provides the first coil unit with the first drive signal through the circuit board, and the driver of the second sensor provides the second coil unit with the second drive signal through the circuit board.

9. The lens moving apparatus according to claim 1, wherein the driver of the first position sensor provides the first coil with a third drive signal.

10. The lens moving apparatus according to claim 9, comprising first and second elastic members coupled both to the bobbin and to the housing,
wherein the first coil is coupled to the first and second elastic members, and the drive signal is supplied to the first coil through the first and second elastic members.

11. The lens moving apparatus according to claim 1, comprising a base disposed under the circuit board, and
wherein the first and second sensors are disposed between the circuit board and the base.

12. The lens moving apparatus according to claim 6, wherein the first sensor is overlapped with the first magnet in an optical-axis direction and the second sensor is overlapped with the second magnet in the optical-axis direction.

13. The lens moving apparatus according to claim 1, wherein the housing is configured to move in a direction perpendicular to an optical-axis direction by an interaction between the second coil and the magnet.

14. The lens moving apparatus according to claim 1, wherein the magnet comprises four magnet units and the second coil comprises four coil units corresponding to the four magnet units, and
wherein the first sensor is overlapped with one of the four magnet units in an optical-axis direction and the second sensor is overlapped with another one of the four magnet units in the optical-axis direction.

15. A lens moving apparatus comprising:
a housing;
a bobbin disposed in the housing;
a magnet disposed on the housing;
a first coil disposed on the bobbin and configured to move the bobbin by an interaction with the magnet;
a second coil configured to move the housing in a direction perpendicular to an optical-axis direction by an interaction with the magnet;
a circuit board comprising a first terminal and a second terminal; and
first and second sensors conductively connected to the circuit board,
wherein each of the first and second sensors is a driver IC including a Hall sensor and a driver,
wherein the first terminal of the circuit board is provided with a clock signal and the second terminal of the circuit board is provided with a data signal,
wherein the driver of each of the first sensor and the second sensor transmits and receives the clock signal through the first terminal, and transmits and receives the data signal through the second terminal in a time-division manner.

16. The lens moving apparatus according to claim 15, wherein the circuit board includes third and fourth terminals, and wherein the driver of each of the first and second sensors is provided with a power signal through the third and fourth terminals.

17. The lens moving apparatus according to claim 15, wherein the magnet comprises a first magnet and a second magnet, and the second coil comprises a first coil unit corresponding to the first magnet and a second coil unit corresponding to the second magnet, and wherein the driver of the first sensor provides the first coil unit with a first drive signal, and the driver of the second sensor provides the second coil unit with a second drive signal.

18. The lens moving apparatus according to claim 15, wherein the data signal includes a first data signal for the first sensor and a second data signal for the second sensor, and wherein the first data signal and the second data signal are transmitted and received through the second terminal in a time-division manner.

19. A camera module comprising:

the lens moving apparatus according to claim 1; and a controller, wherein the controller performs an AF operation of controlling movement of the lens moving apparatus in a direction of an optical axis using the first data signal, and performs an OIS operation of controlling movement of the lens moving apparatus in a direction perpendicular to the optical axis using the second and third data.

* * * * *